(12) United States Patent
Yang et al.

(10) Patent No.: US 11,641,732 B2
(45) Date of Patent: May 2, 2023

(54) SELF-ALIGNED ETCH BACK FOR VERTICAL THREE DIMENSIONAL (3D) MEMORY

(71) Applicant: Micron Technology, Inc., Boise, ID (US)

(72) Inventors: Litao Yang, Boise, ID (US); Si-Woo Lee, Boise, ID (US); Haitao Liu, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 17/237,664

(22) Filed: Apr. 22, 2021

(65) Prior Publication Data
US 2022/0344338 A1     Oct. 27, 2022

(51) Int. Cl.
*H01L 27/108* (2006.01)
*H01L 27/11507* (2017.01)
*H01L 27/11514* (2017.01)

(52) U.S. Cl.
CPC .... *H01L 27/10805* (2013.01); *H01L 27/1085* (2013.01); *H01L 27/10873* (2013.01); *H01L 27/11507* (2013.01); *H01L 27/11514* (2013.01)

(58) Field of Classification Search
None
See application file for complete search history.

(56) References Cited

U.S. PATENT DOCUMENTS

| | | |
|---|---|---|
| 10,607,995 B2 | 3/2020 | Roberts et al. |
| 2018/0323200 A1 | 11/2018 | Tang et al. |
| 2019/0103406 A1 | 4/2019 | Tang et al. |
| 2019/0164985 A1* | 5/2019 | Lee .................. H01L 28/60 |
| 2021/0013226 A1 | 1/2021 | Tang et al. |

* cited by examiner

*Primary Examiner* — Eva Y Montalvo
*Assistant Examiner* — Kevin Quinto
(74) *Attorney, Agent, or Firm* — Brooks, Cameron & Huebsch, PLLC

(57) ABSTRACT

Systems, methods, and apparatuses are provided for self-aligned etch back for vertical three dimensional (3D) memory. One example method includes depositing layers of a first dielectric material, a semiconductor material, and a second dielectric material to form a vertical stack, forming first vertical openings to form elongated vertical, pillar columns with first vertical sidewalls in the vertical stack, and forming second vertical openings through the vertical stack to expose second vertical sidewalls. Further, the example method includes removing portions of the semiconductor material to form first horizontal openings and depositing a fill in the first horizontal openings. The method can further include forming third vertical openings to expose third vertical sidewalls in the vertical stack and selectively removing the fill material to form a plurality of second horizontal openings in which to form horizontally oriented storage nodes.

20 Claims, 42 Drawing Sheets

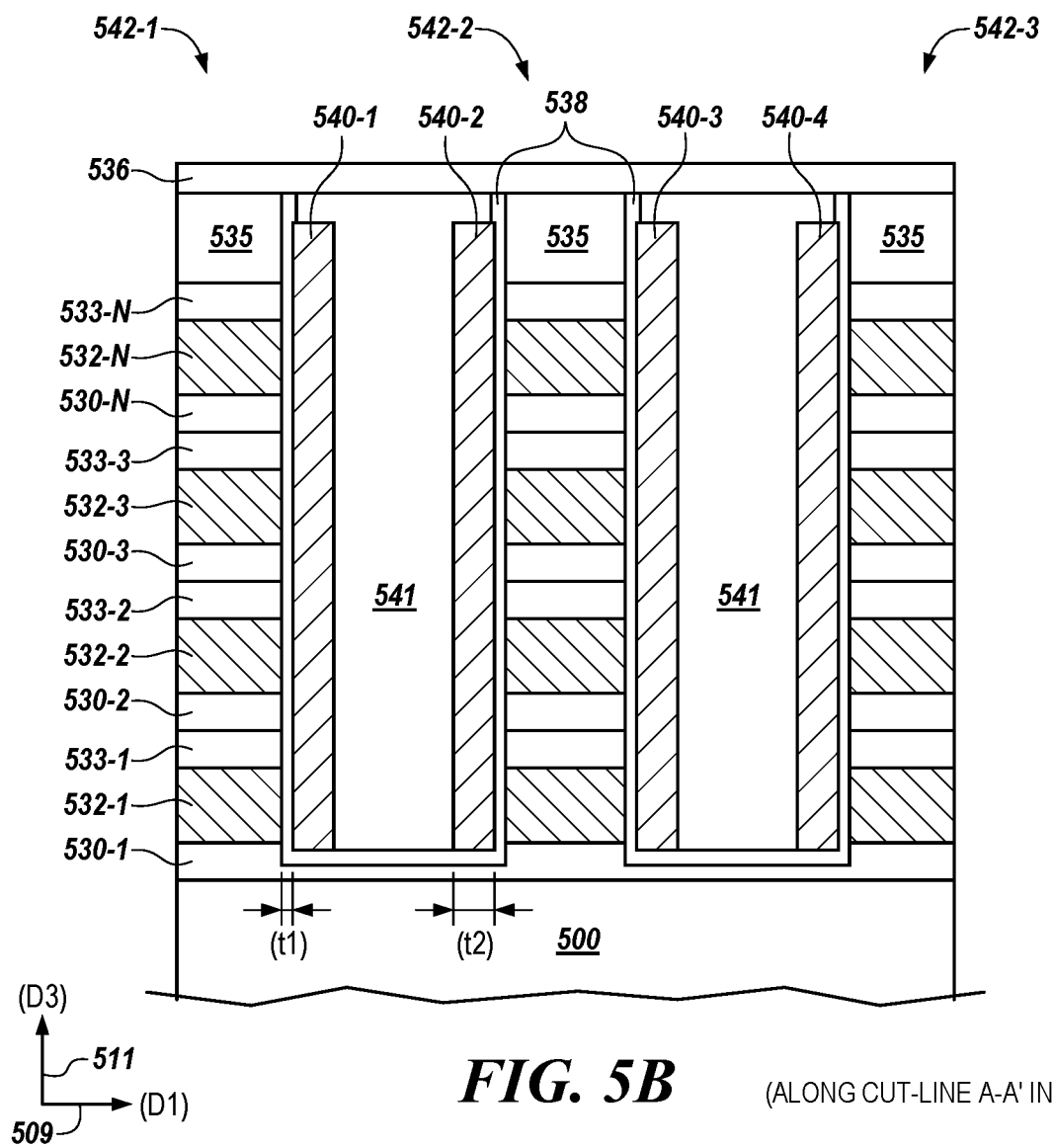
FIG. 5B (ALONG CUT-LINE A-A' IN FIG 5A)

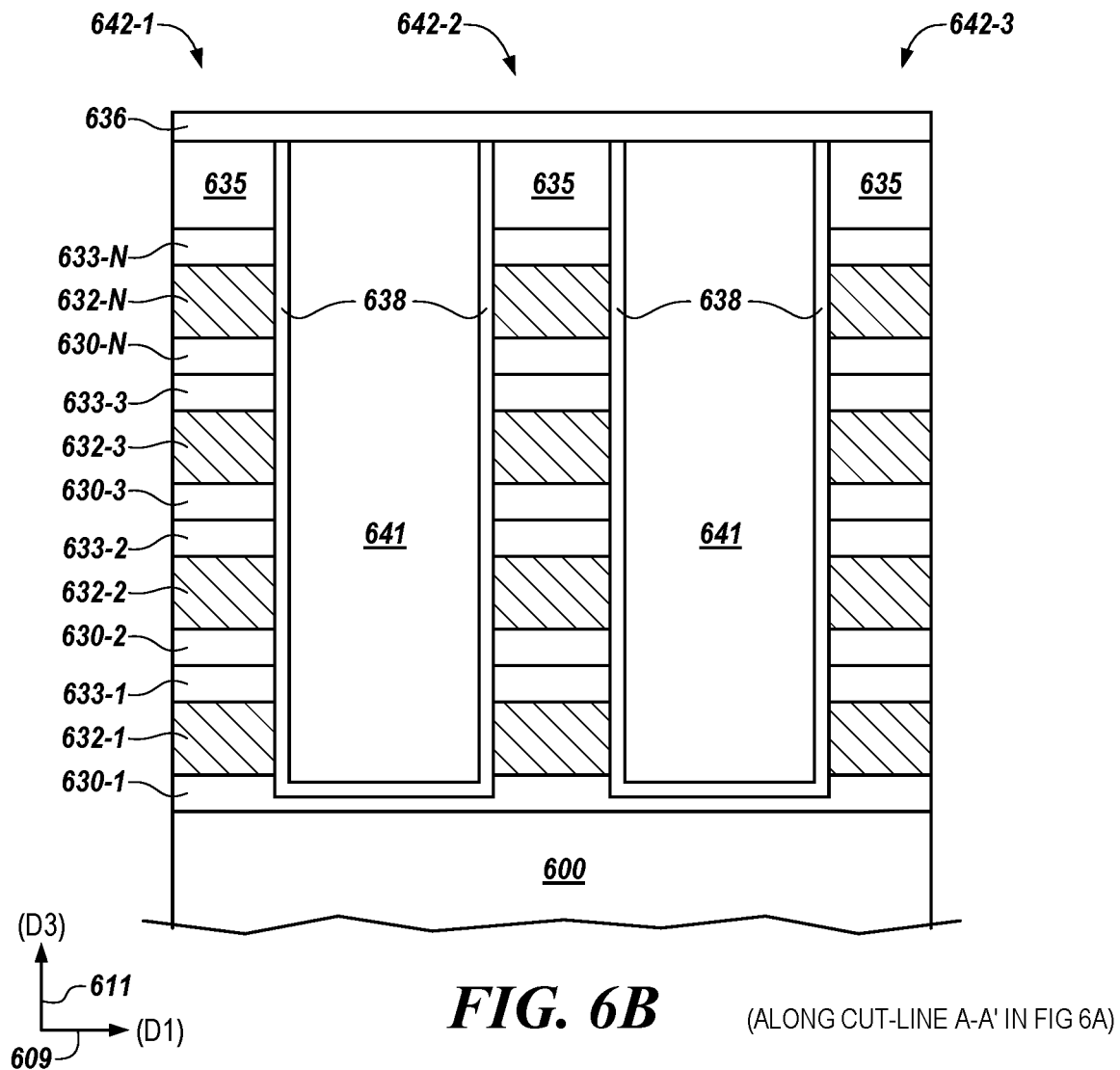
FIG. 6B (ALONG CUT-LINE A-A' IN FIG 6A)

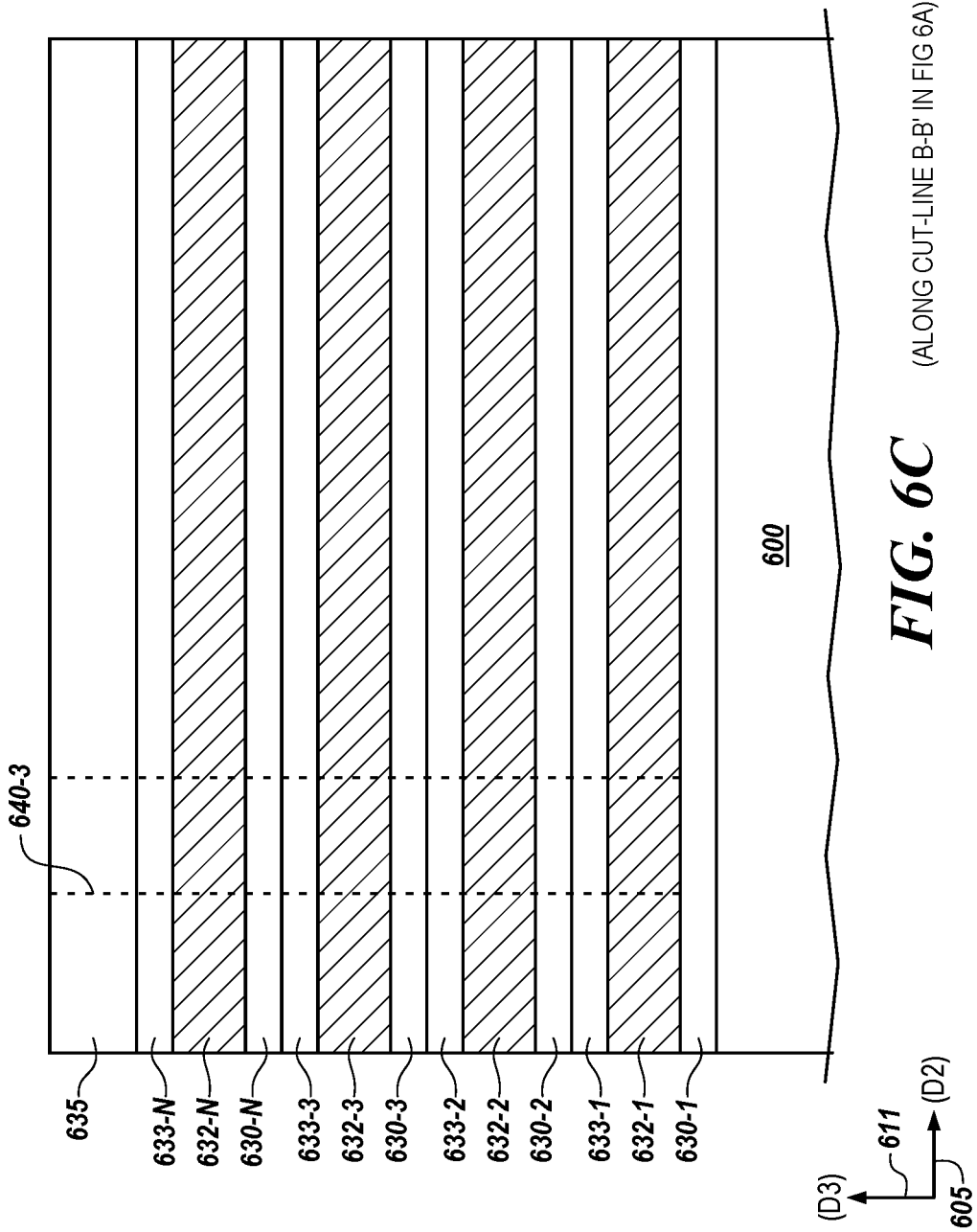

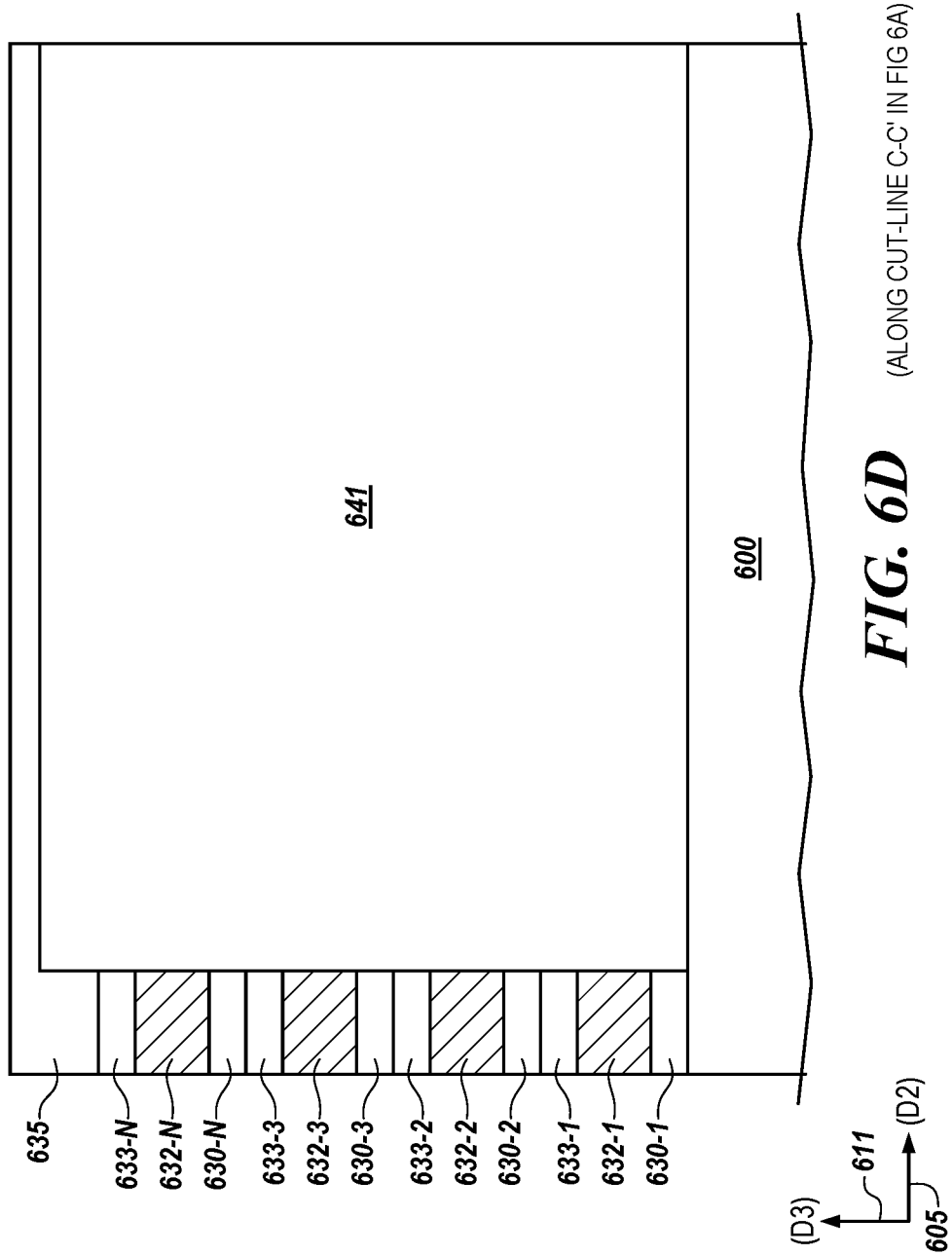

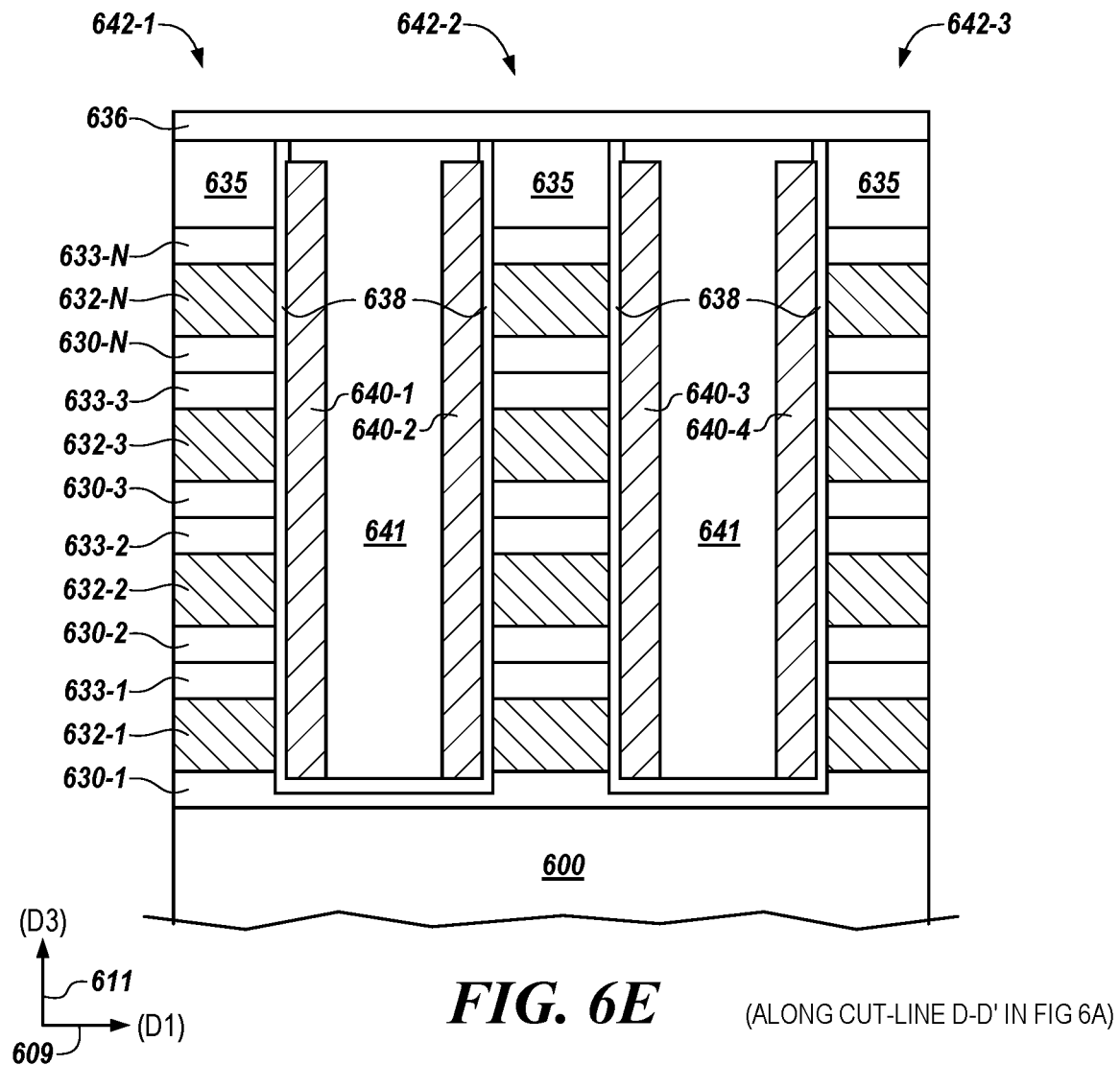
FIG. 6E (ALONG CUT-LINE D-D' IN FIG 6A)

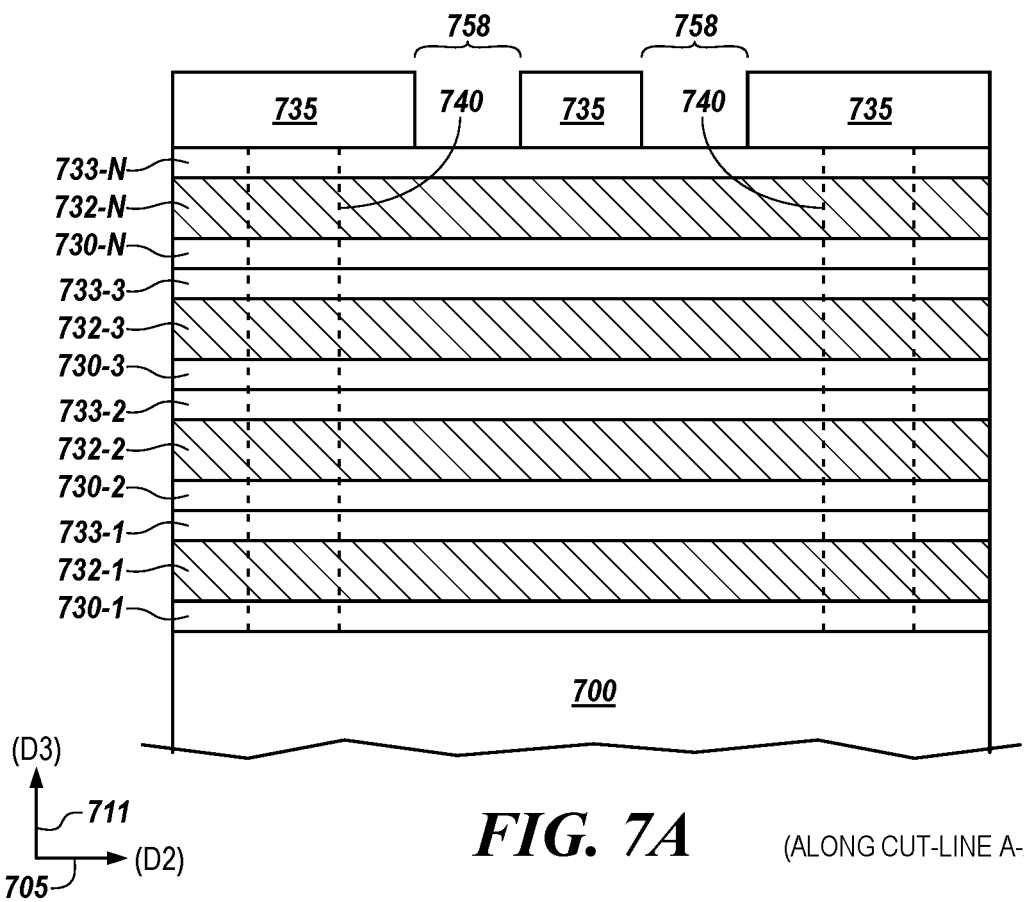
*FIG. 7A* (ALONG CUT-LINE A-A' IN FIG 7B)
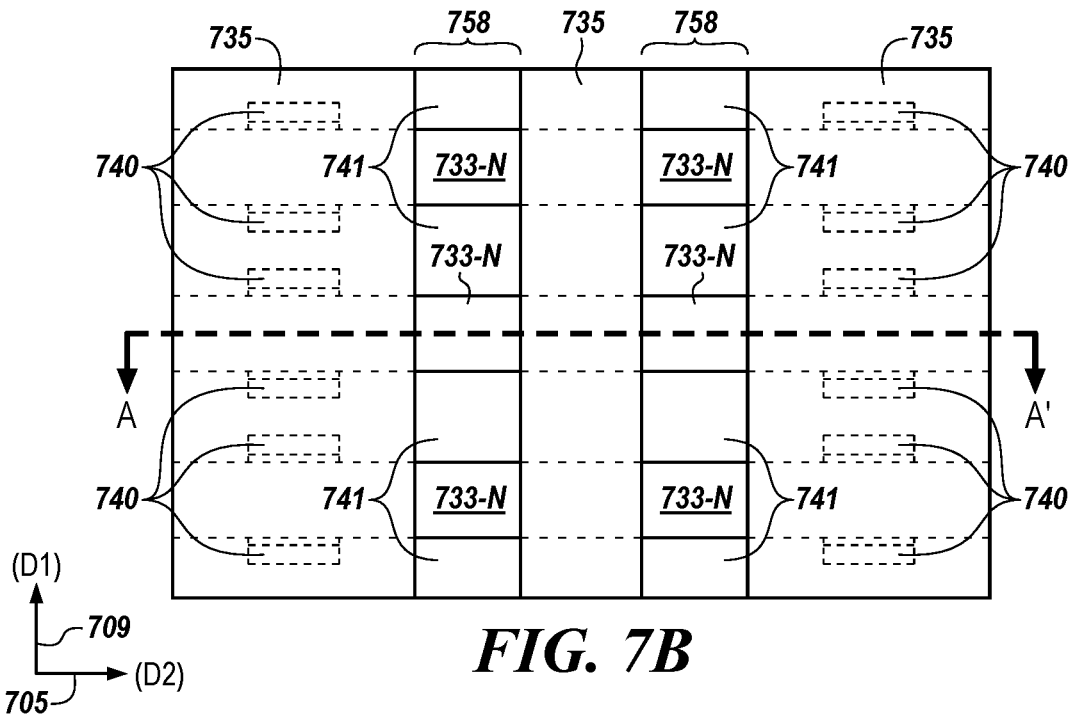
*FIG. 7B*

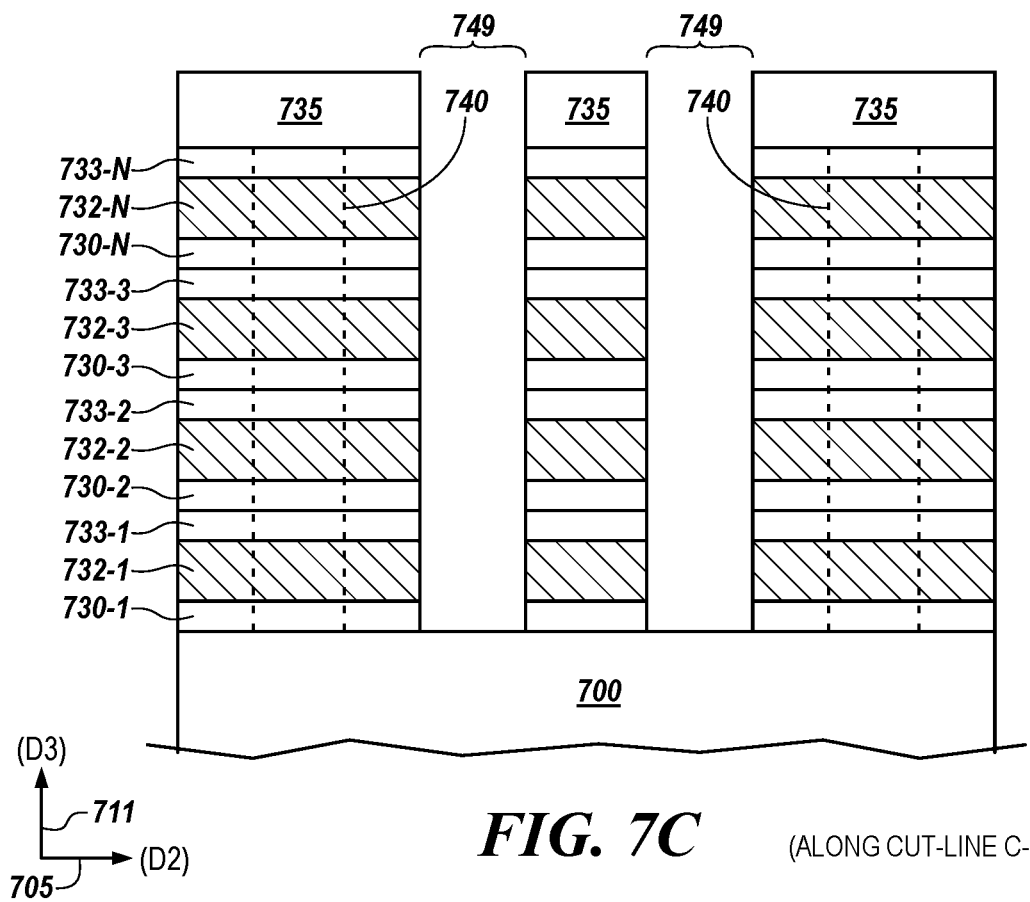
FIG. 7C (ALONG CUT-LINE C-C' IN FIG 7D)
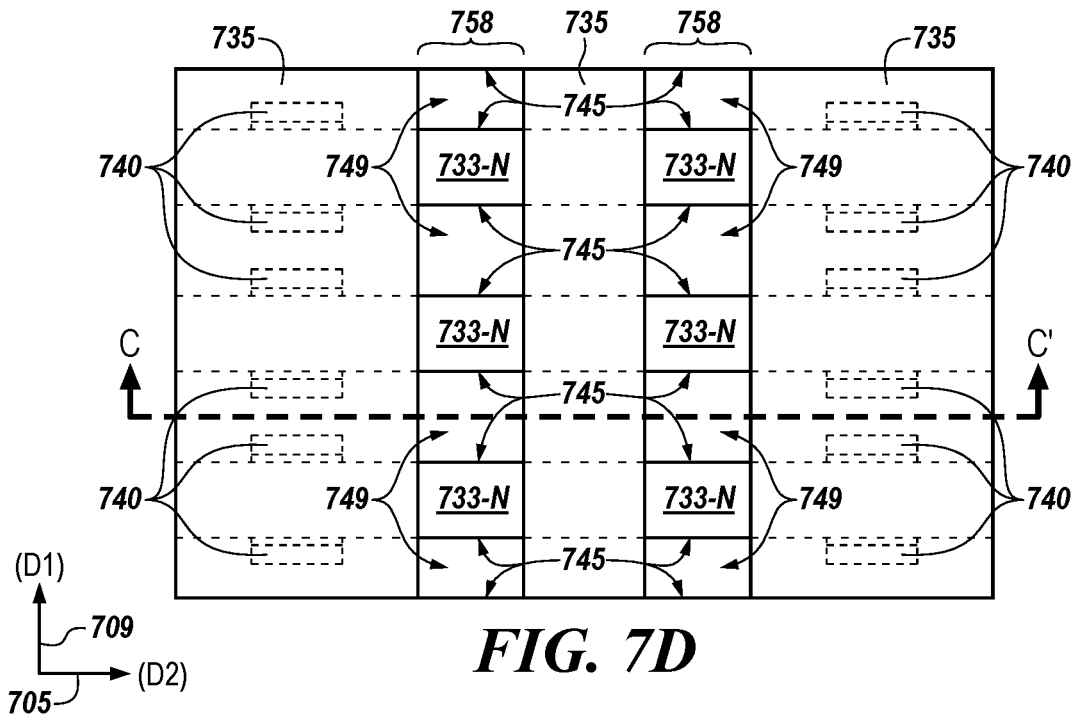
FIG. 7D

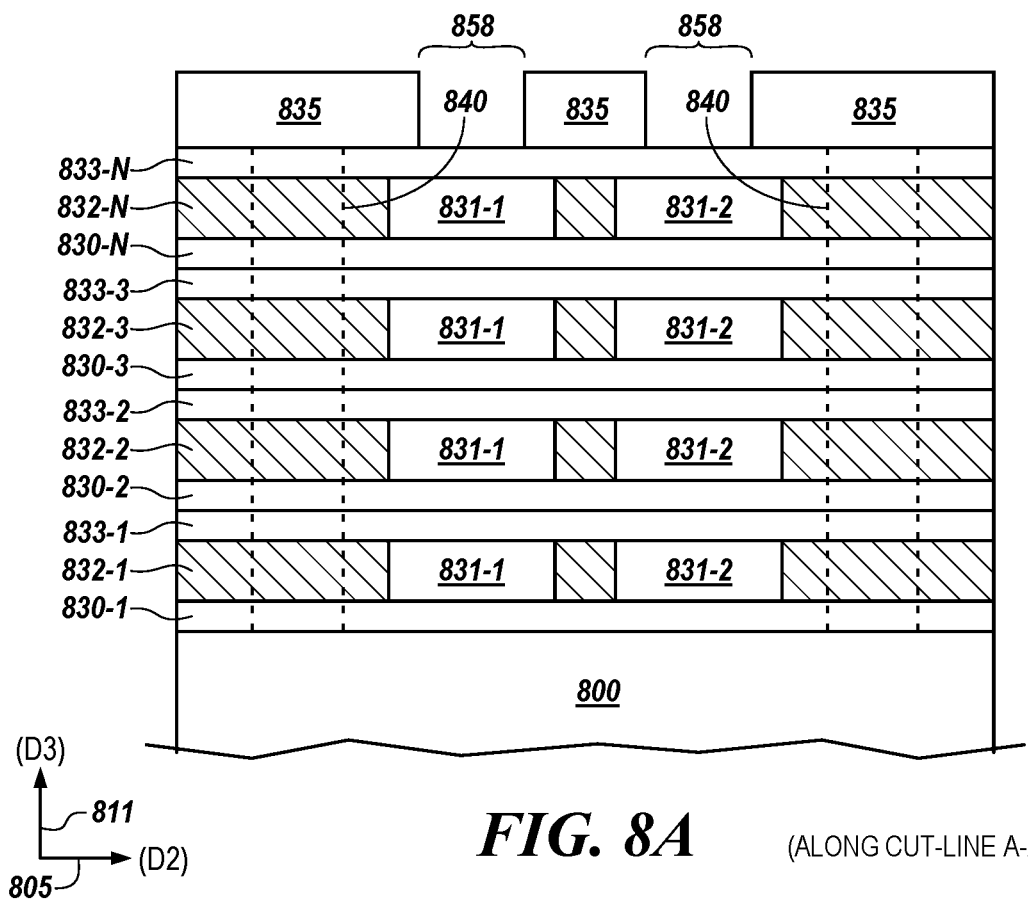
FIG. 8A (ALONG CUT-LINE A-A' IN FIG 8B)
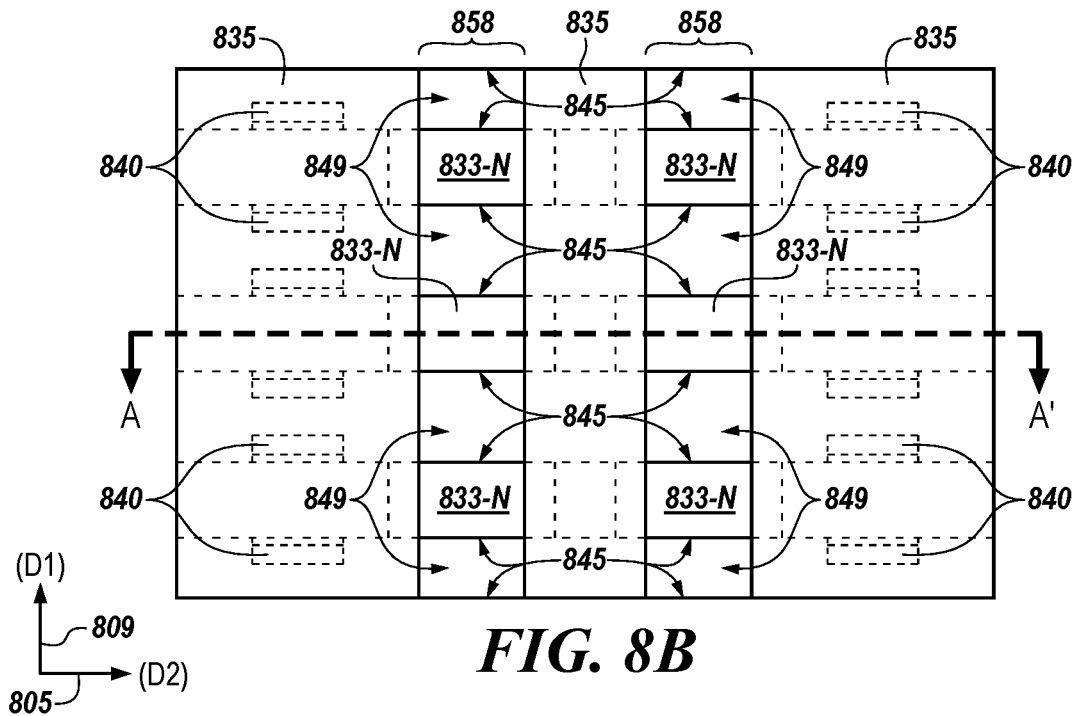
FIG. 8B

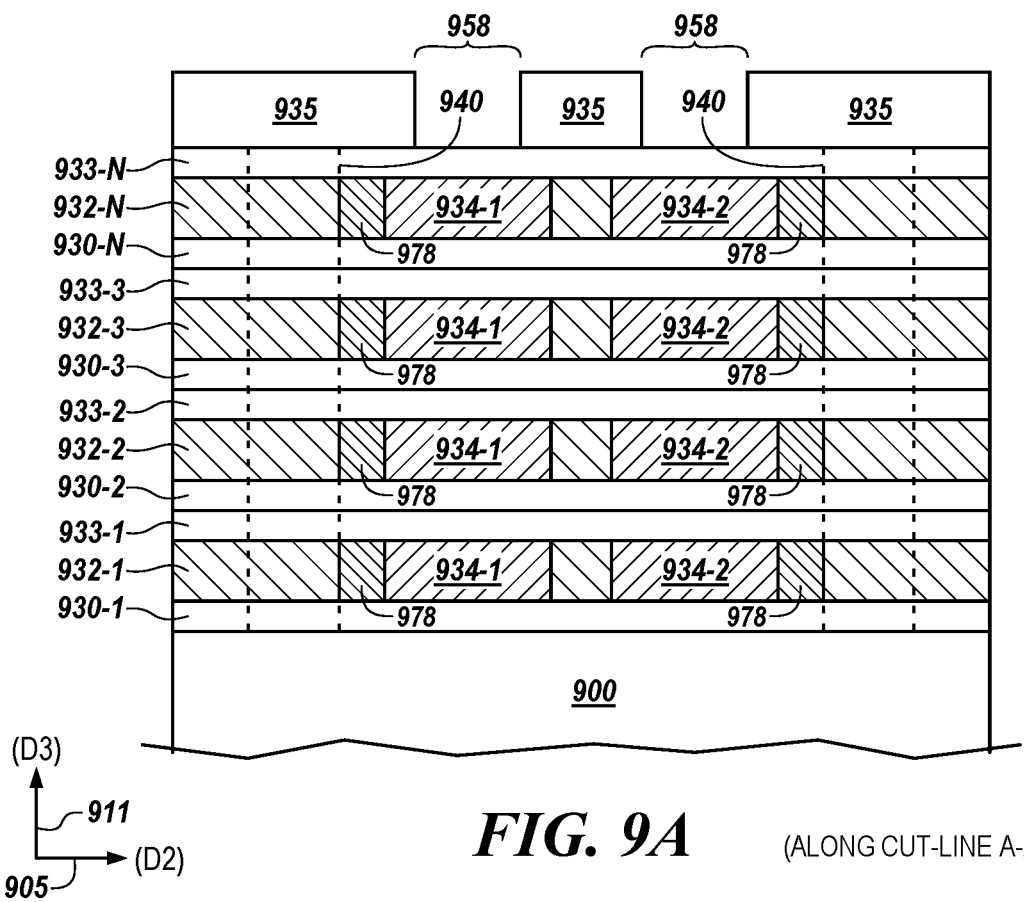
FIG. 9A (ALONG CUT-LINE A-A' IN FIG 9B)
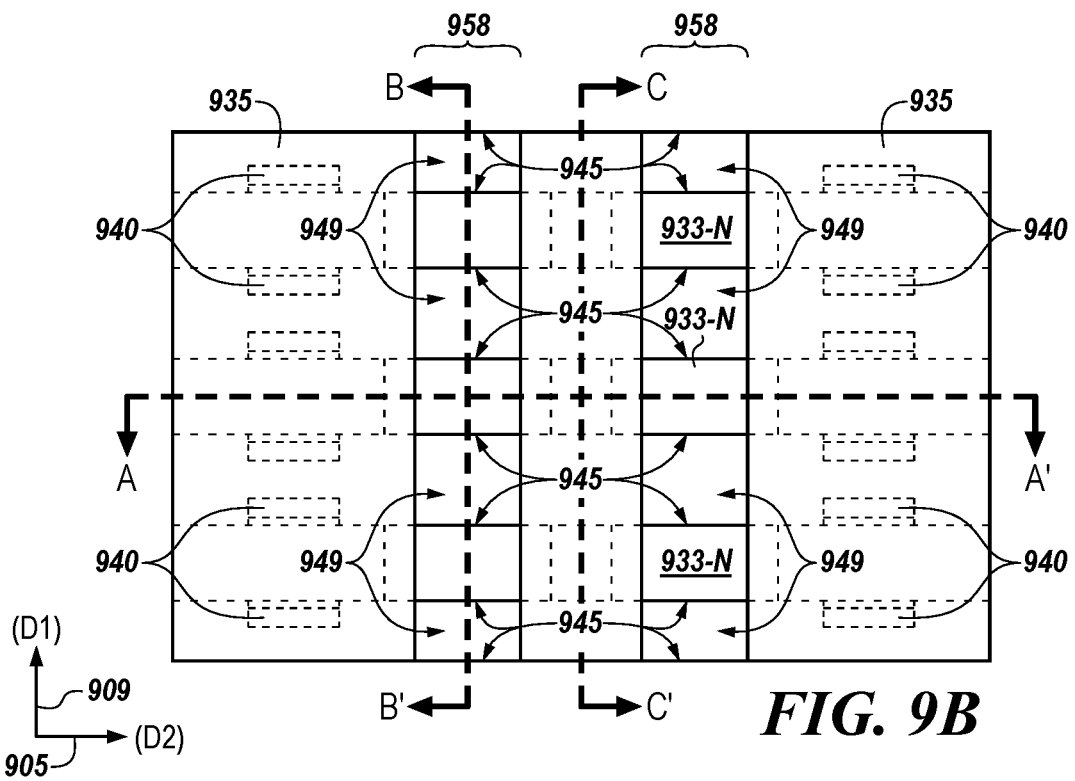
FIG. 9B

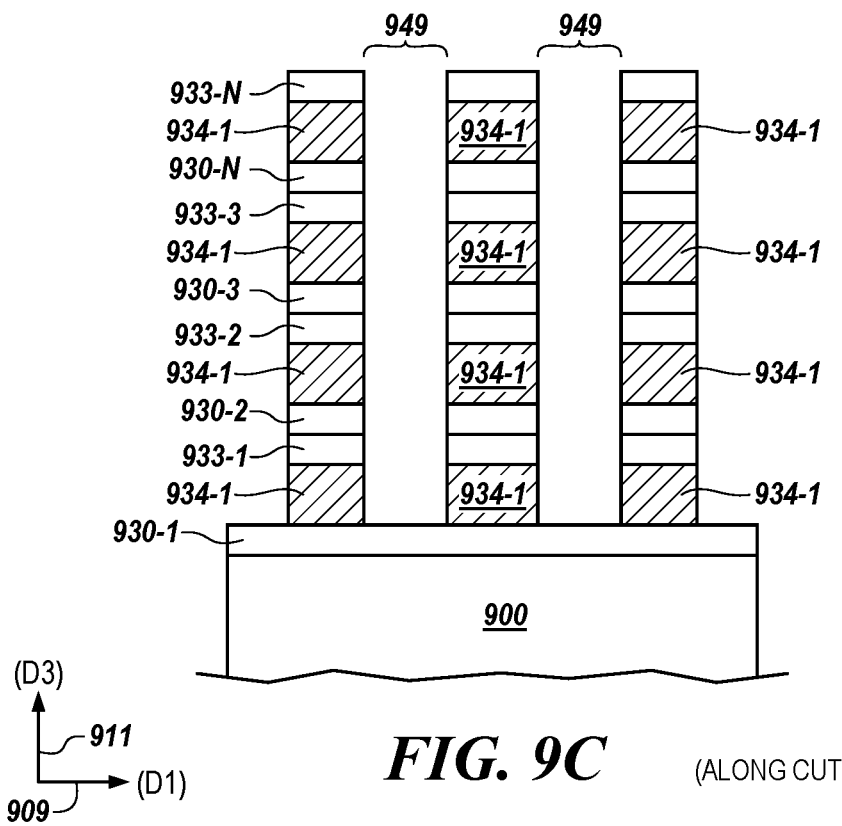
FIG. 9C (ALONG CUT-LINE B-B' IN FIG 9B)
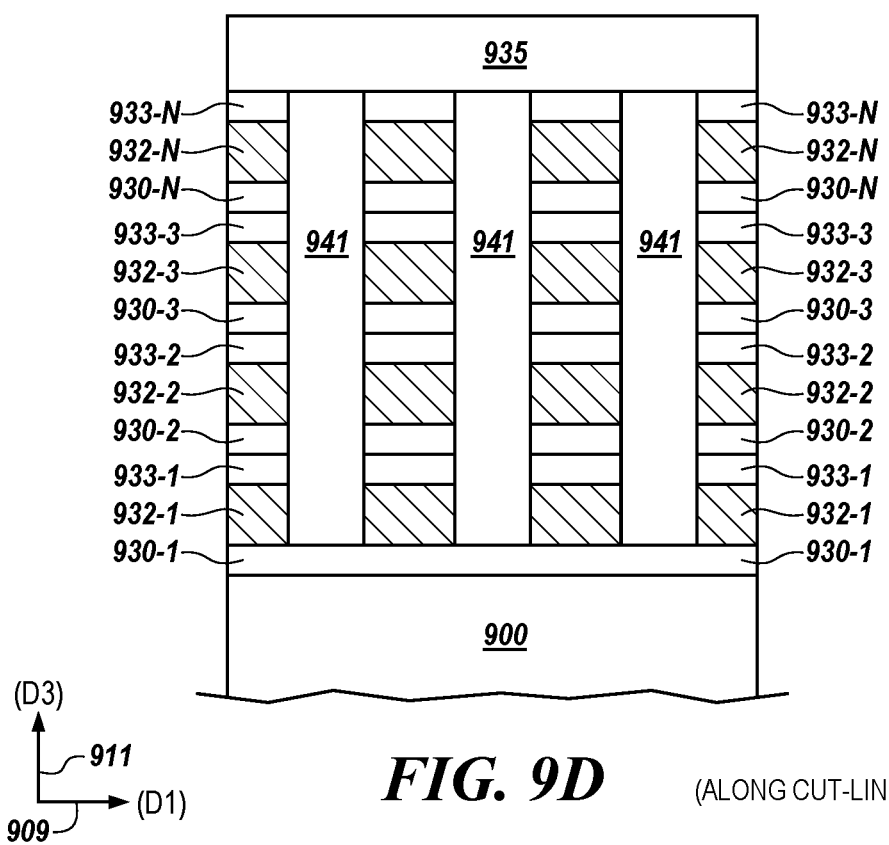
FIG. 9D (ALONG CUT-LINE C-C' IN FIG 9B)

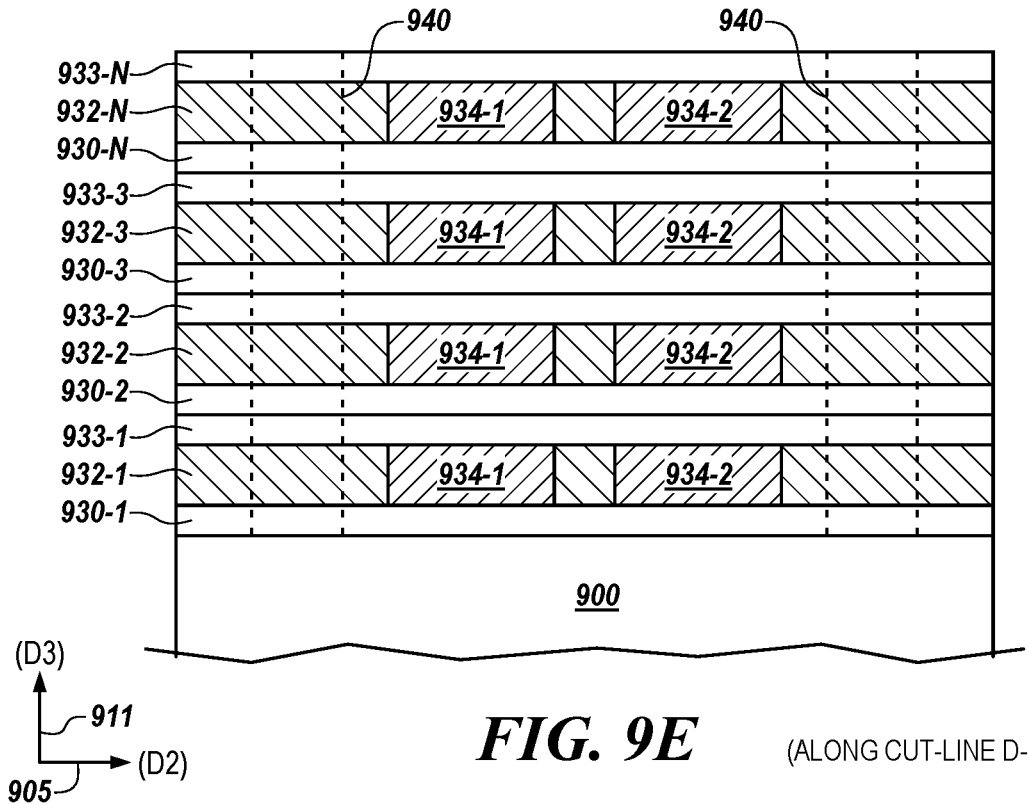
FIG. 9E (ALONG CUT-LINE D-D' IN FIG 9F)
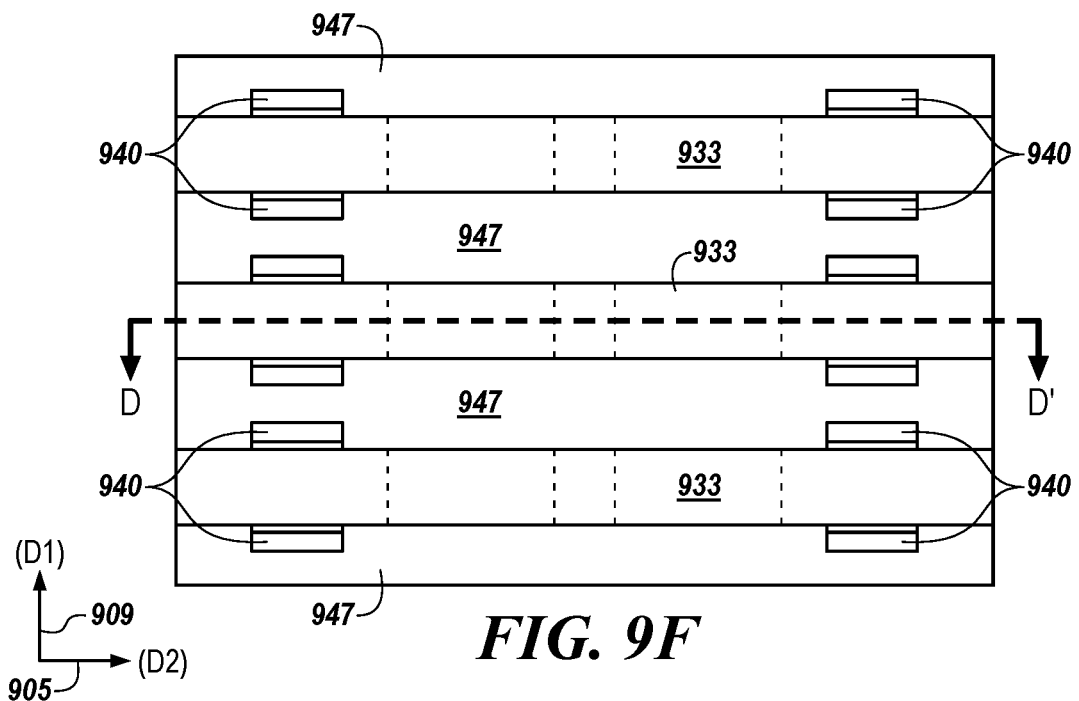
FIG. 9F

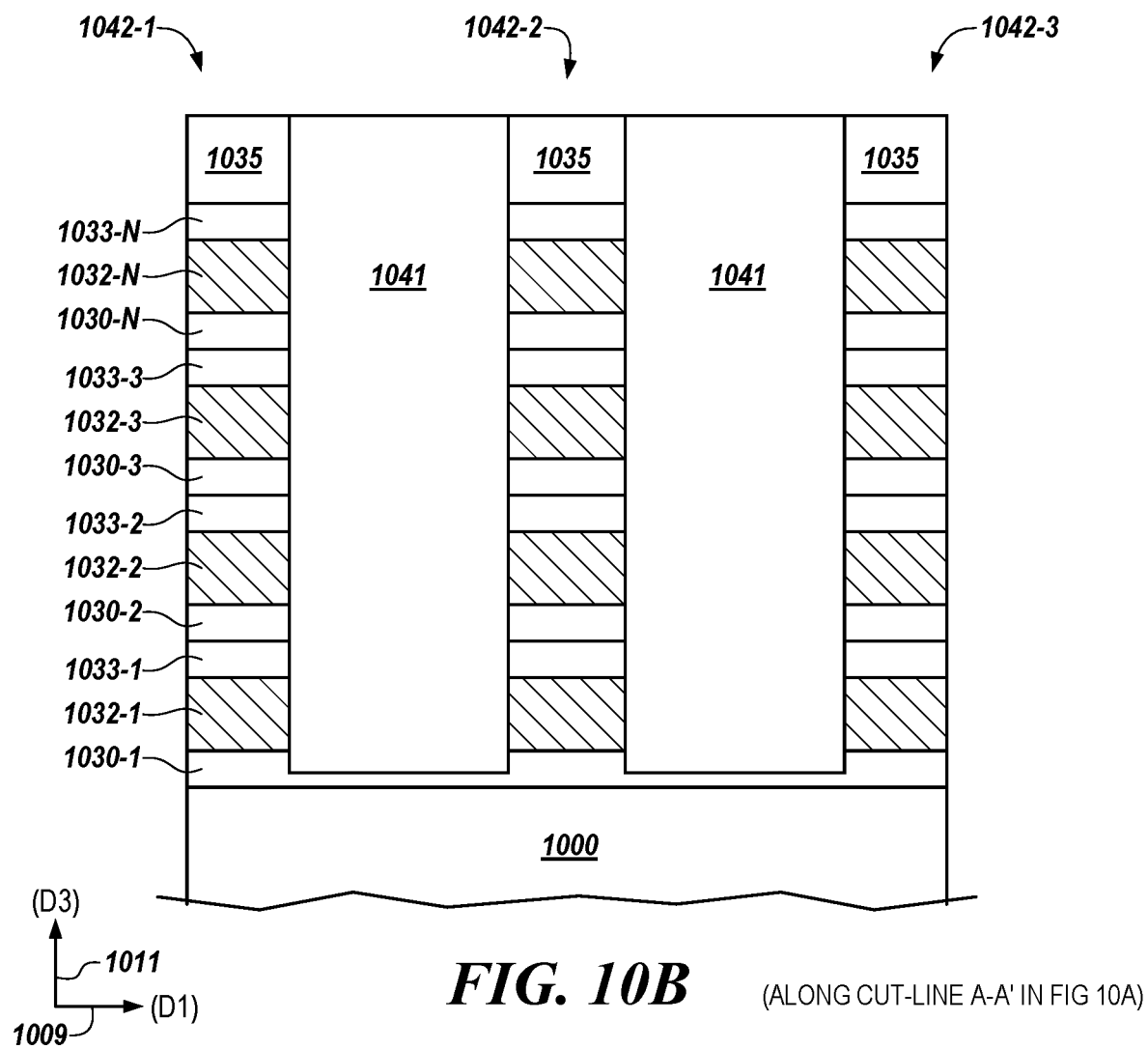
FIG. 10B (ALONG CUT-LINE A-A' IN FIG 10A)

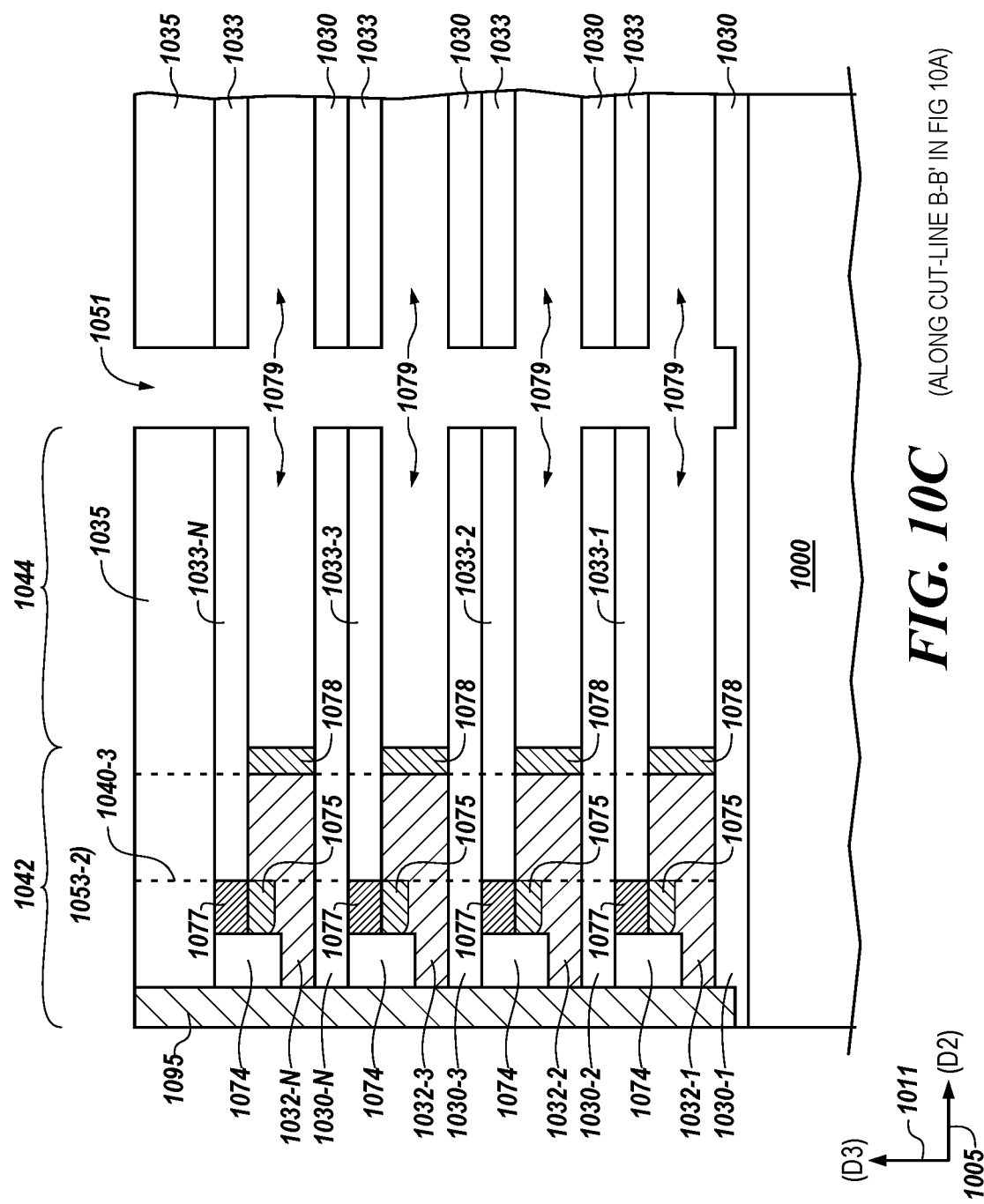
*FIG. 10C* (ALONG CUT-LINE B-B' IN FIG 10A)

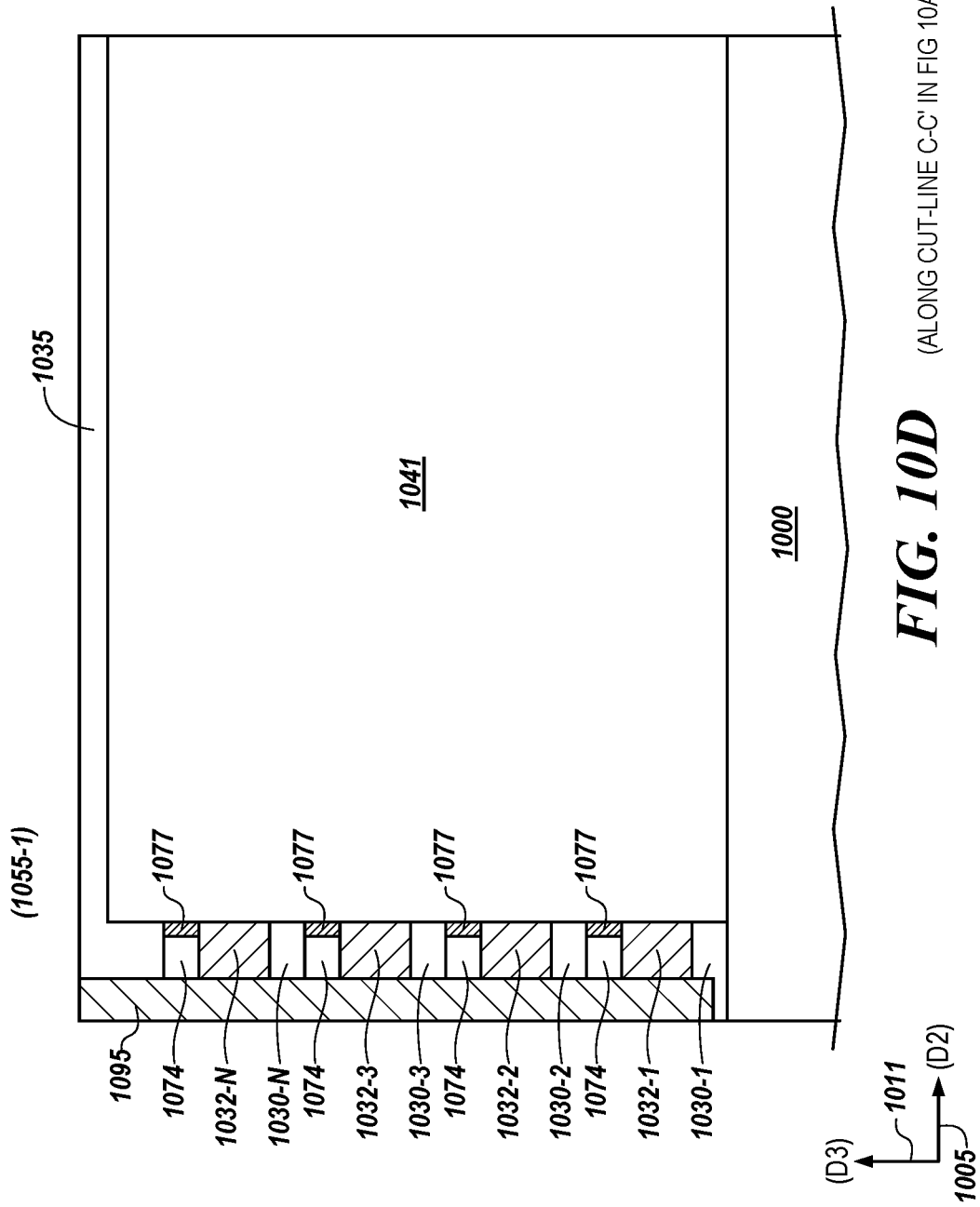

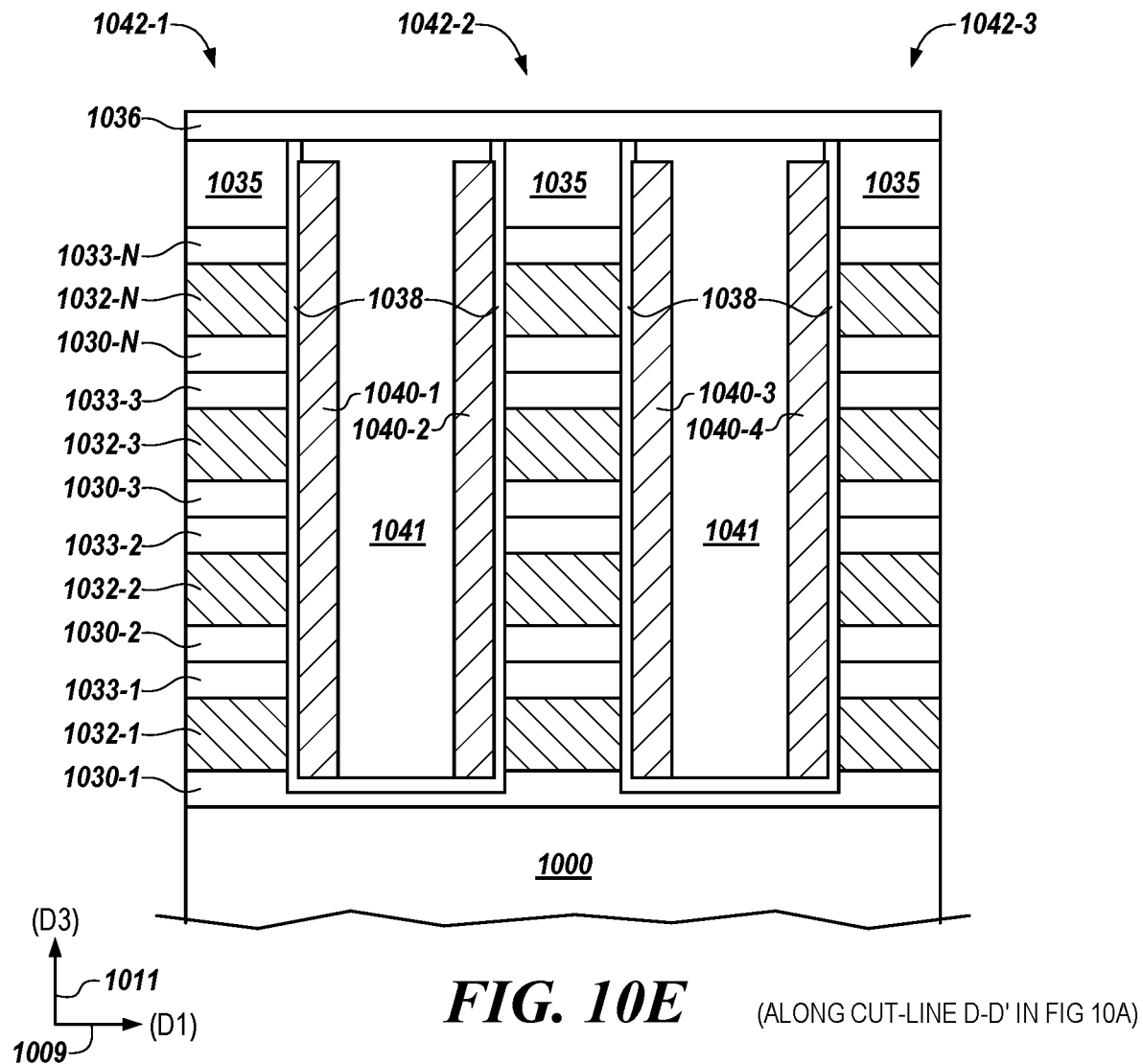
FIG. 10E (ALONG CUT-LINE D-D' IN FIG 10A)

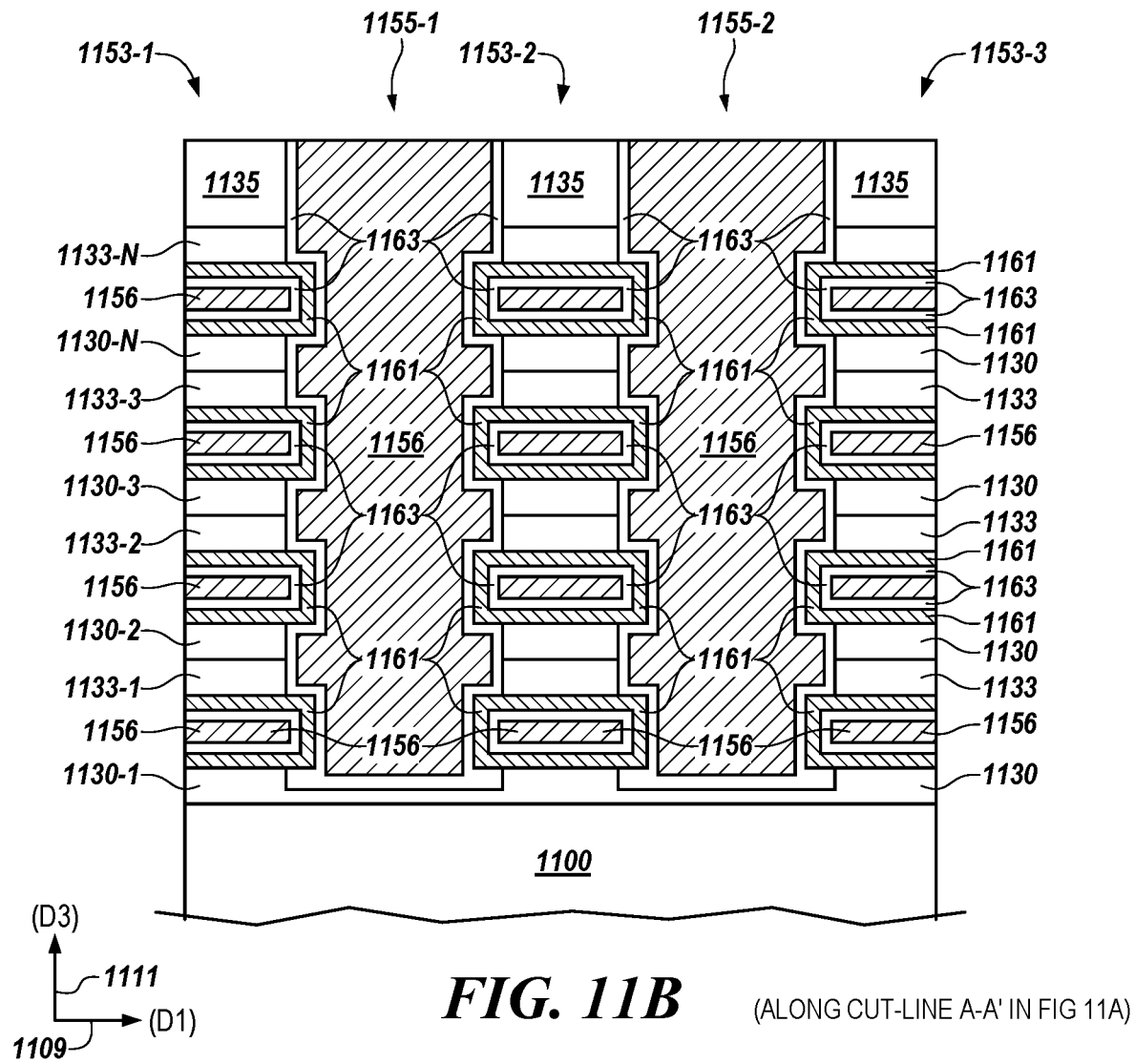
FIG. 11B (ALONG CUT-LINE A-A' IN FIG 11A)

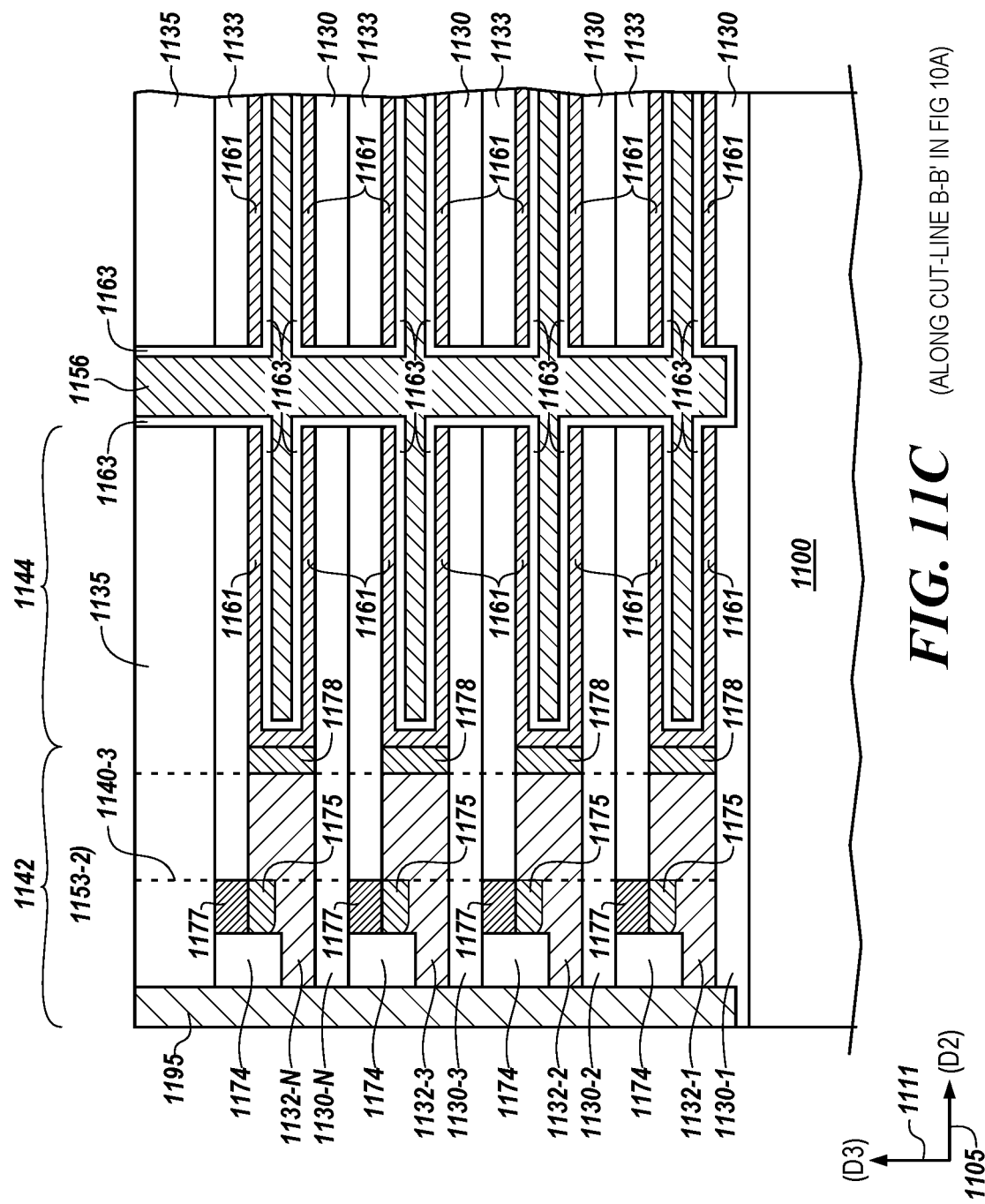
FIG. 11C (ALONG CUT-LINE B-B' IN FIG 10A)

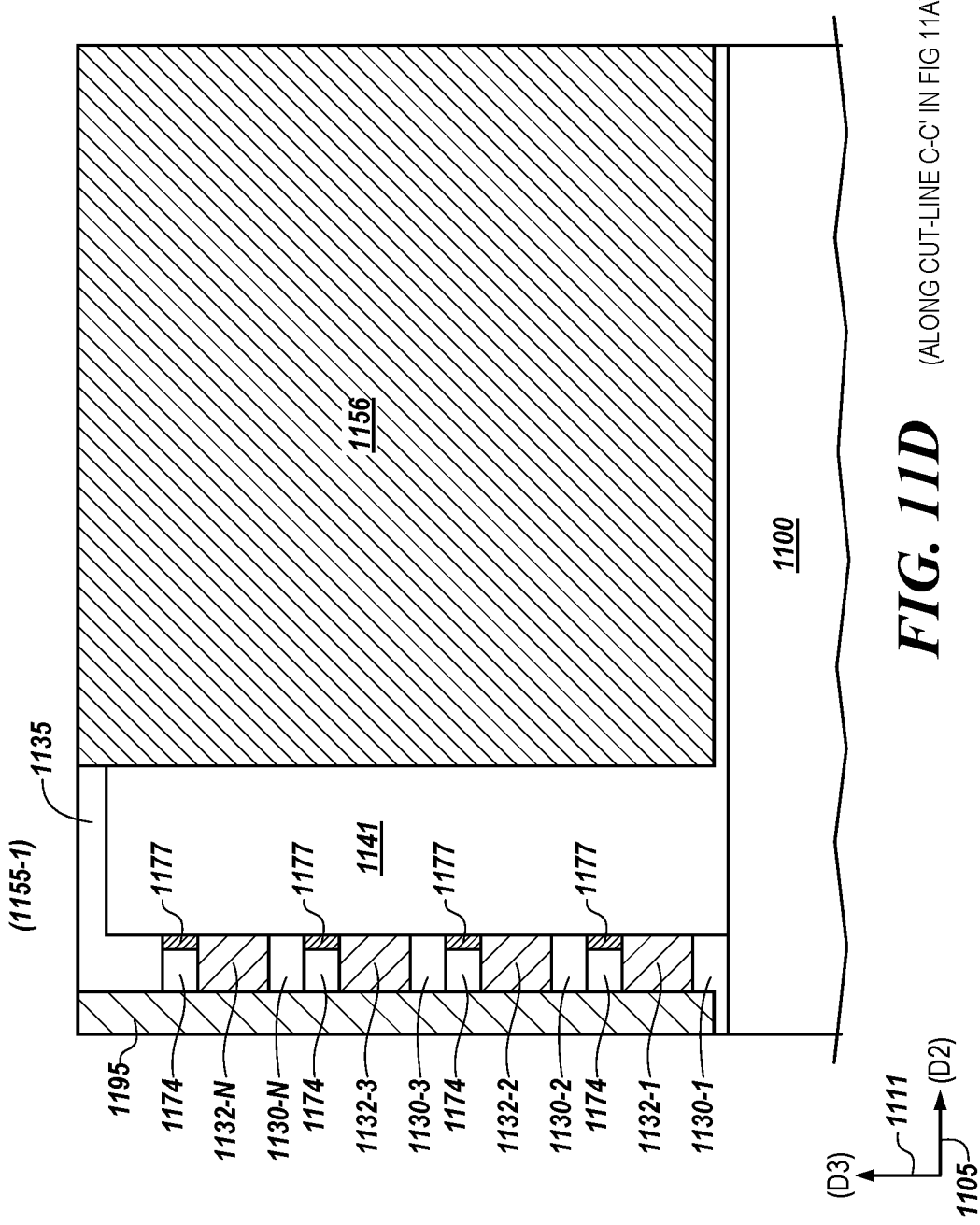

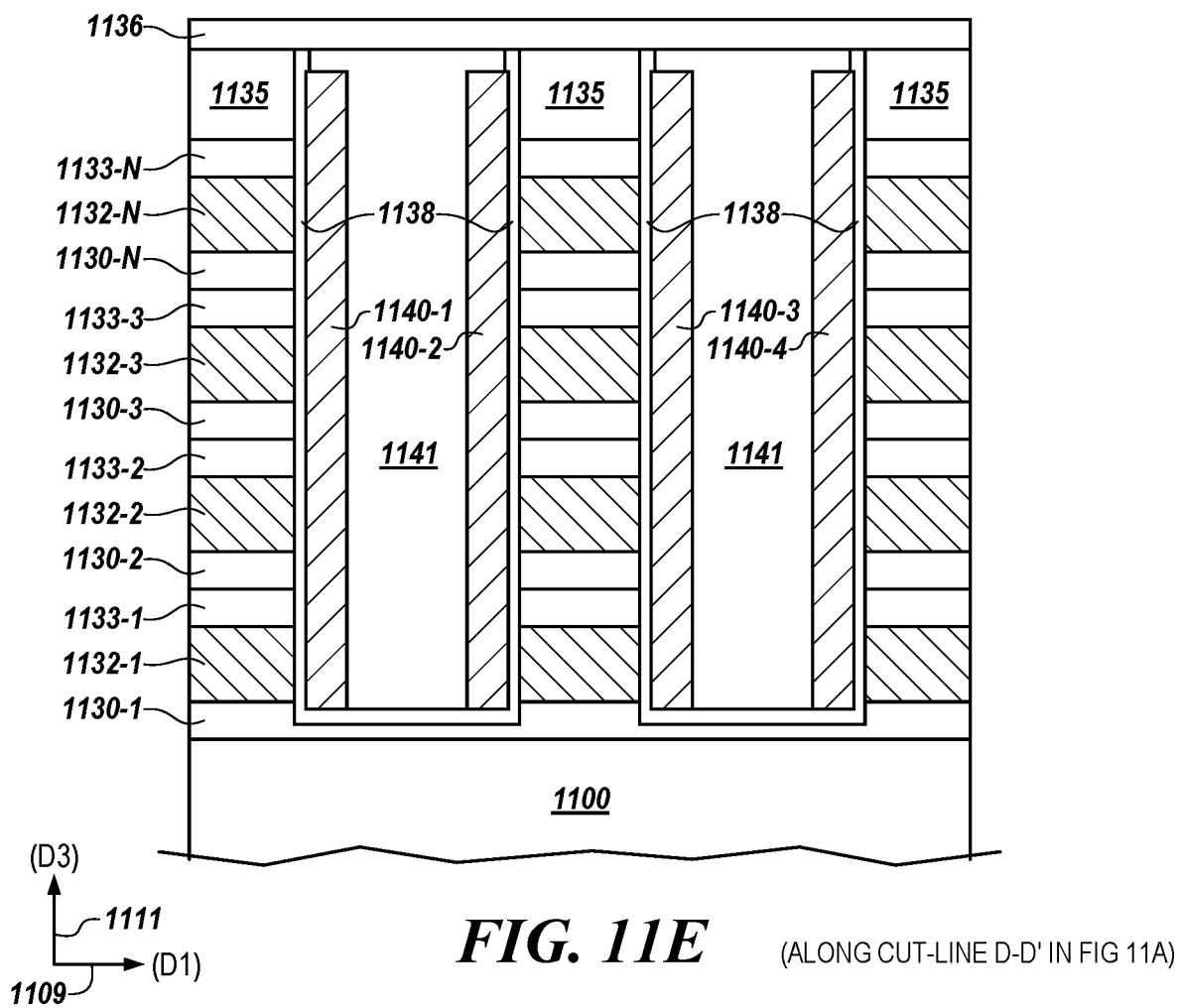
FIG. 11E (ALONG CUT-LINE D-D' IN FIG 11A)

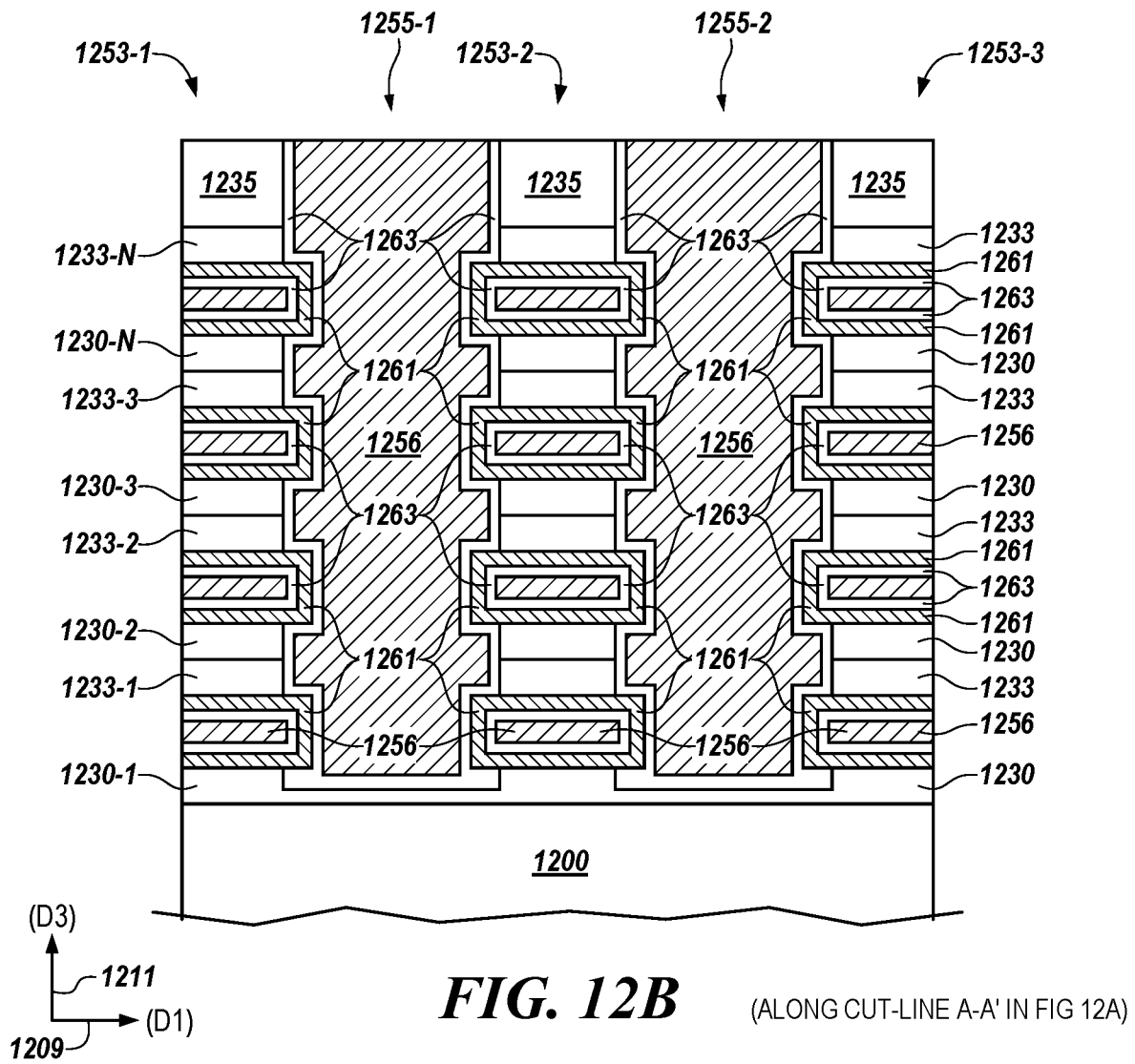
FIG. 12B (ALONG CUT-LINE A-A' IN FIG 12A)

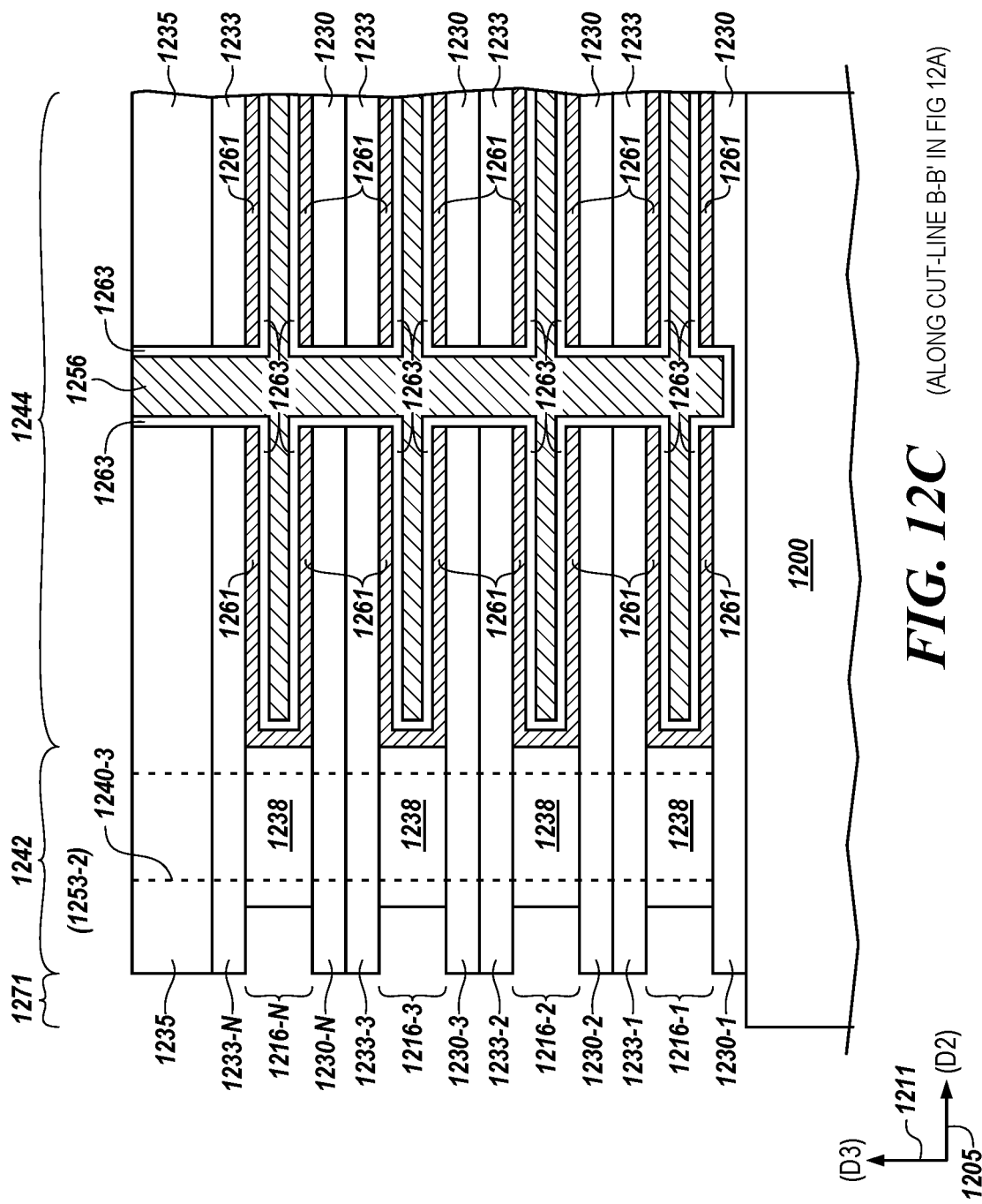
FIG. 12C (ALONG CUT-LINE B-B' IN FIG 12A)

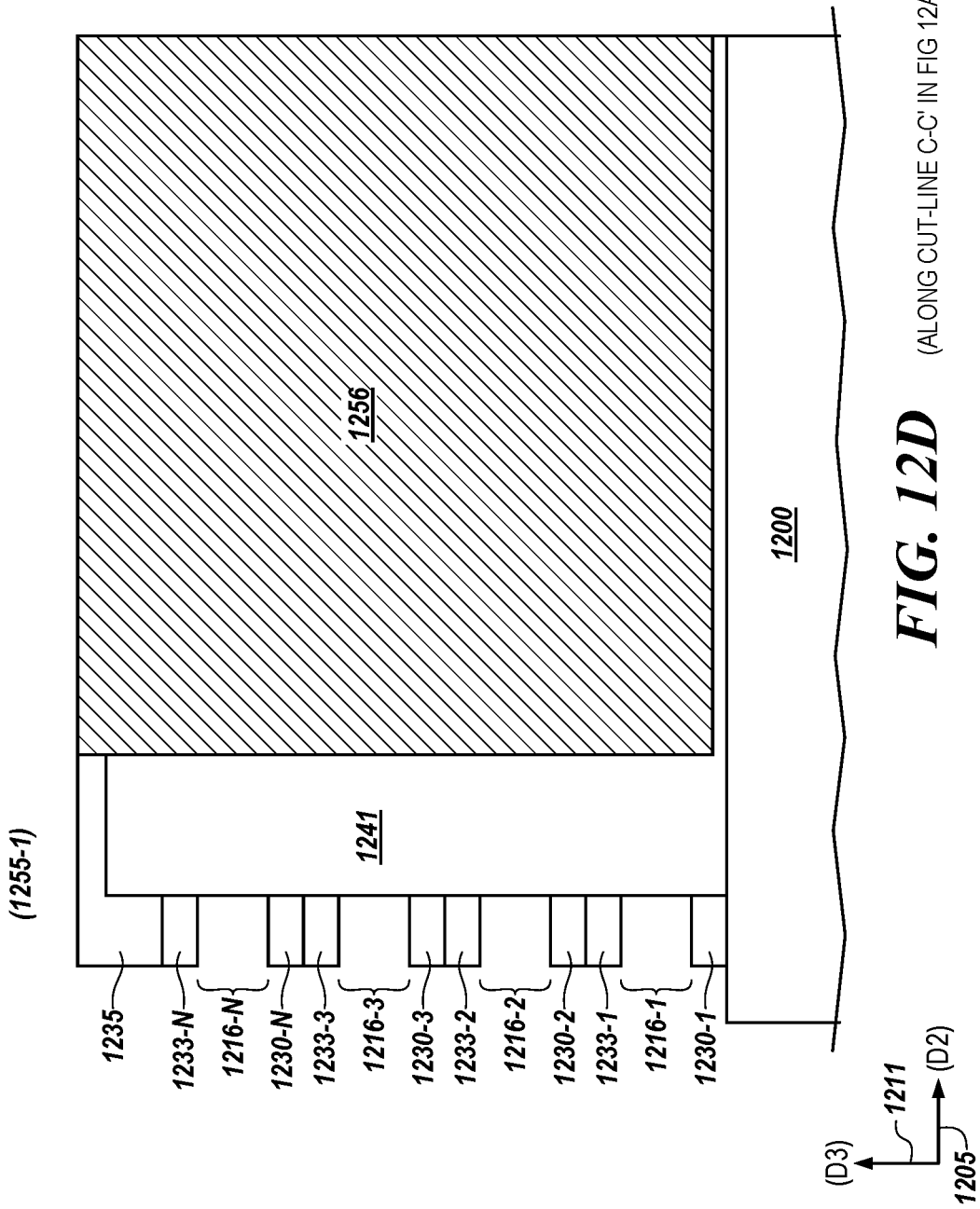

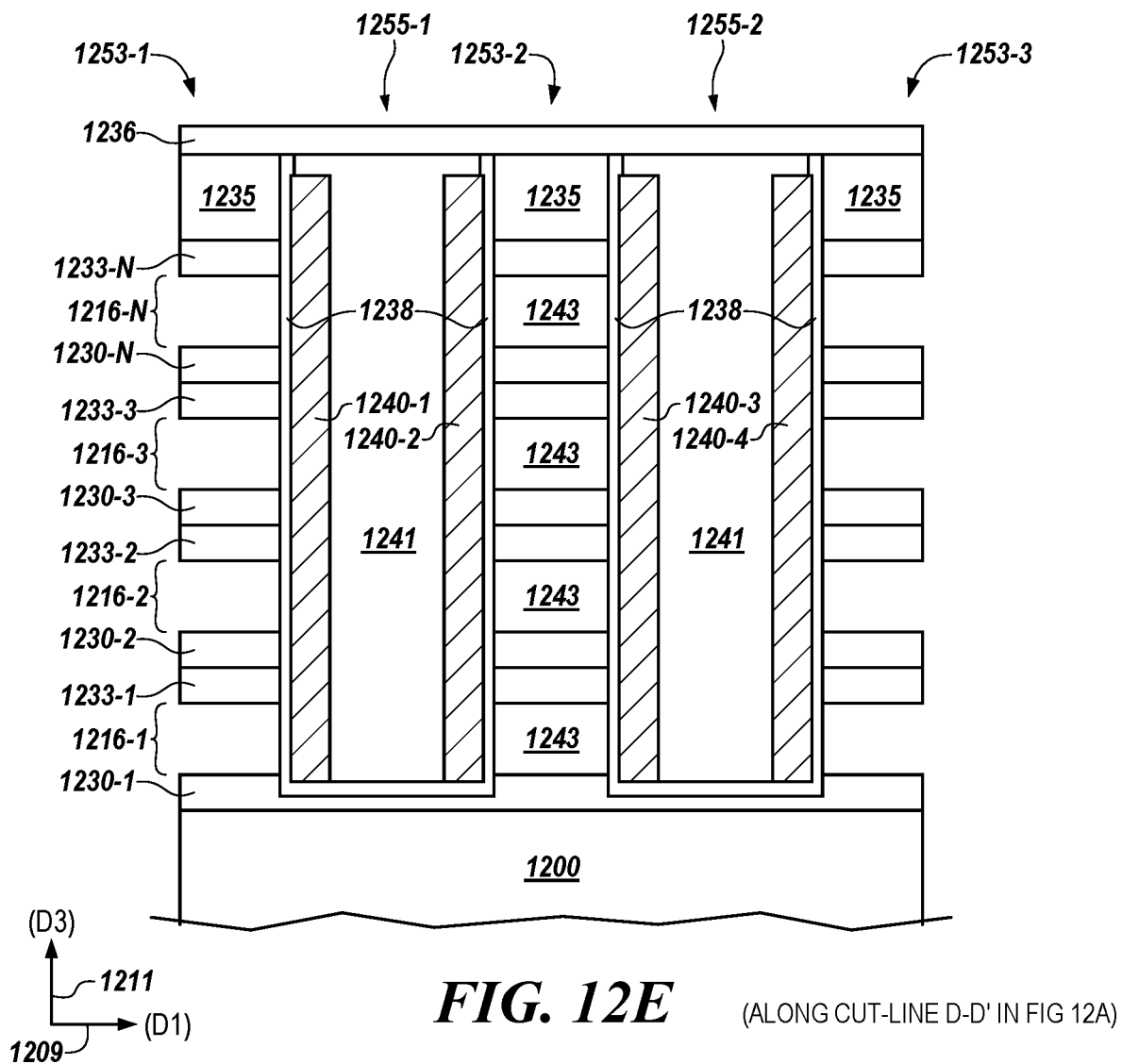
FIG. 12E (ALONG CUT-LINE D-D' IN FIG 12A)

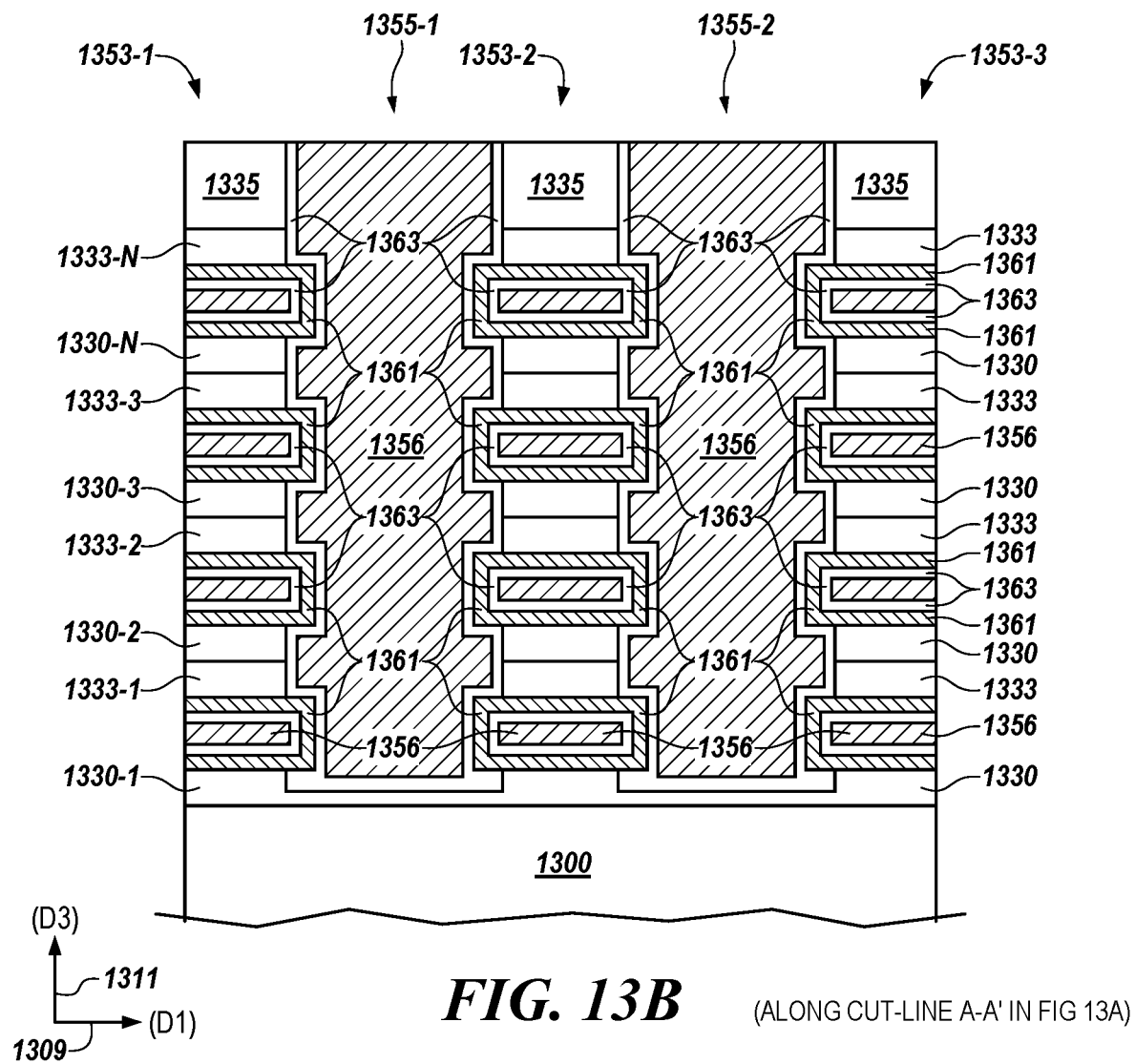
FIG. 13B (ALONG CUT-LINE A-A' IN FIG 13A)

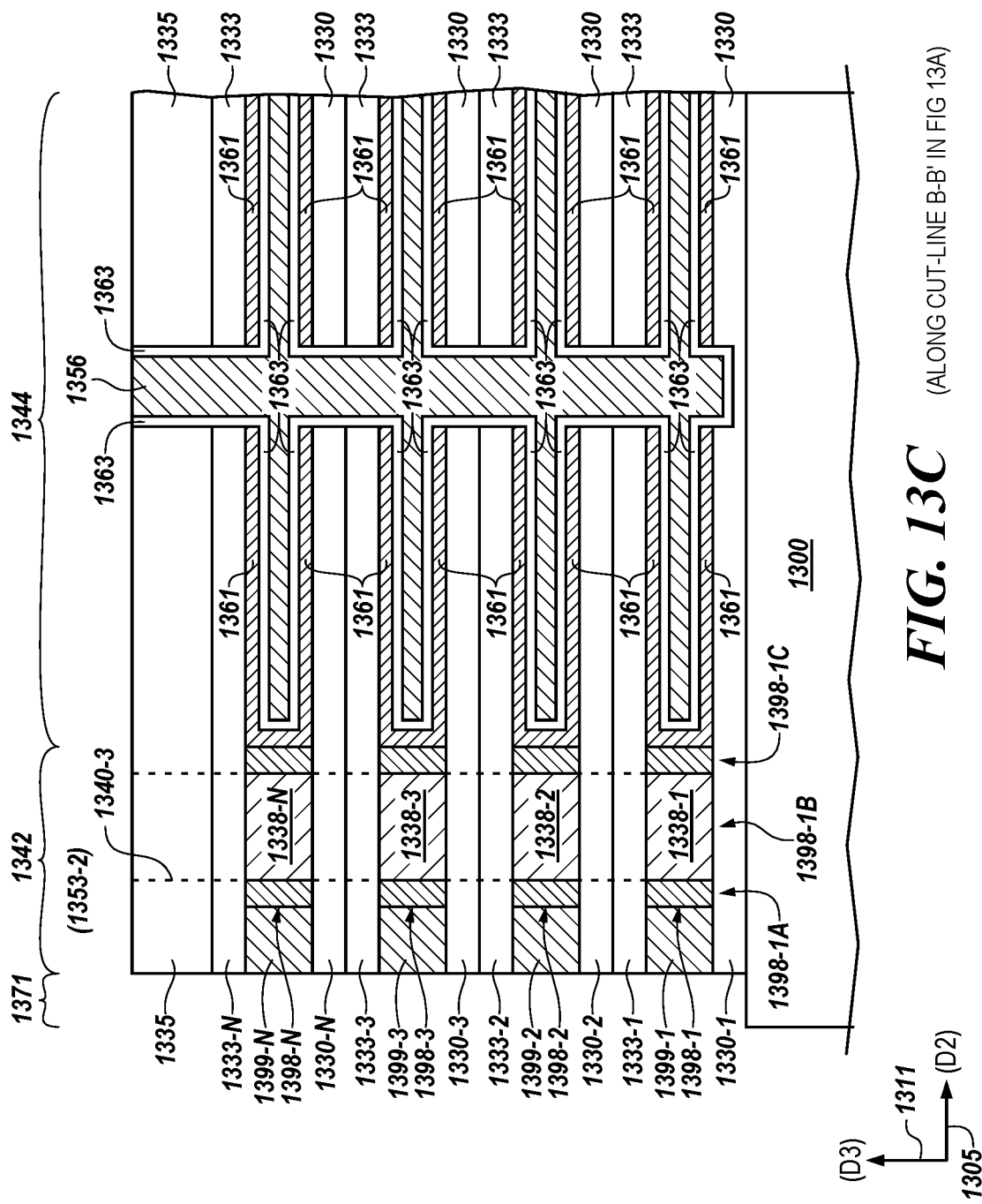
FIG. 13C (ALONG CUT-LINE B-B' IN FIG 13A)

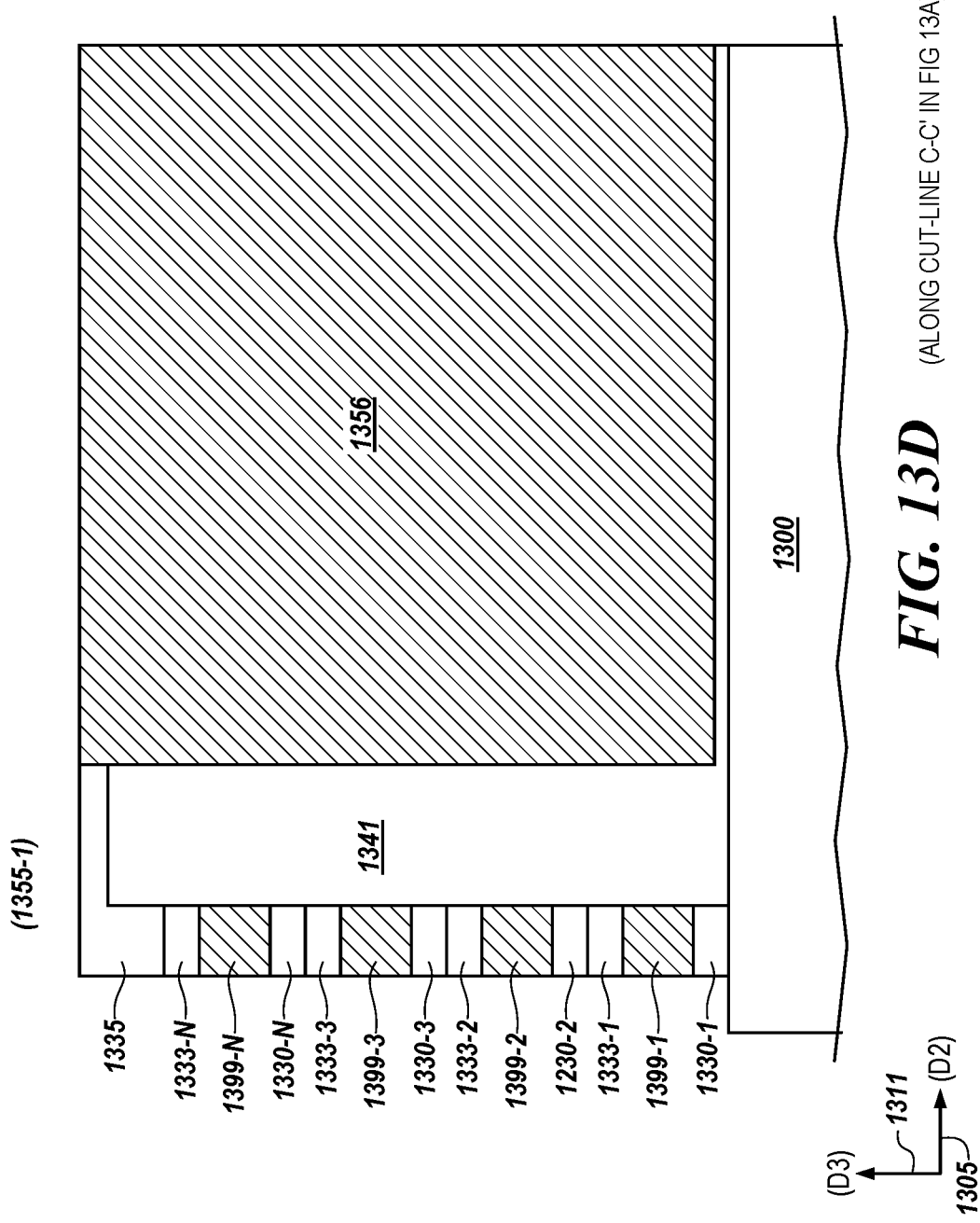
FIG. 13D (ALONG CUT-LINE C-C' IN FIG 13A)

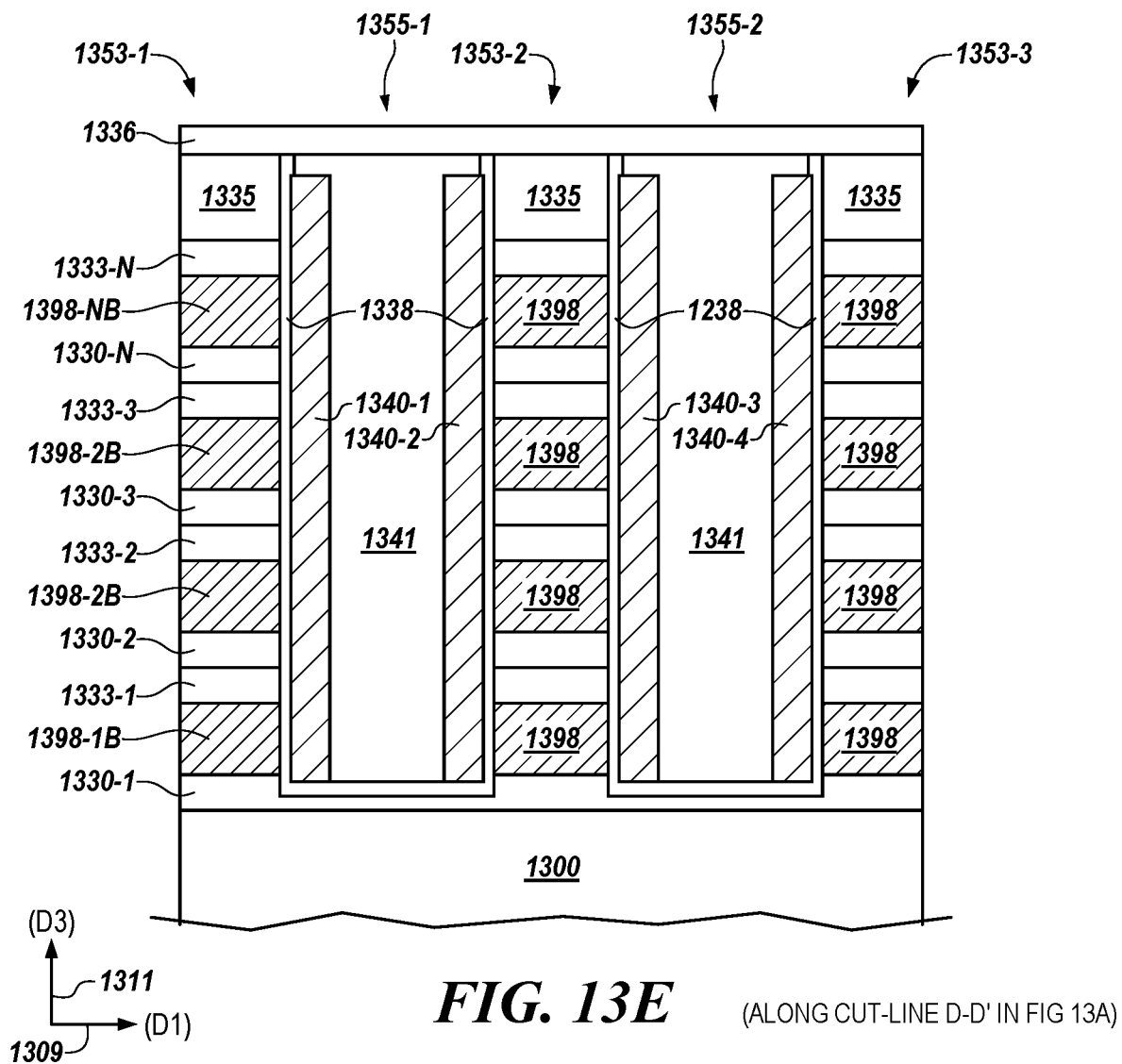
FIG. 13E (ALONG CUT-LINE D-D' IN FIG 13A)

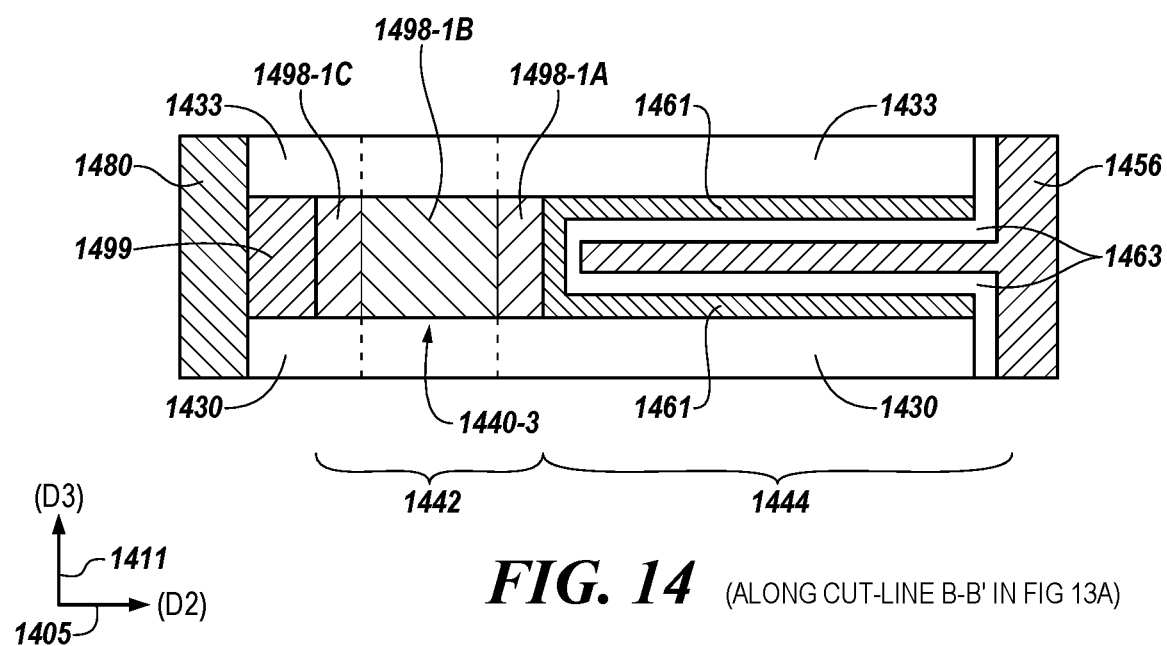
FIG. 14 (ALONG CUT-LINE B-B' IN FIG 13A)

SELF-ALIGNED ETCH BACK FOR VERTICAL THREE DIMENSIONAL (3D) MEMORY

TECHNICAL FIELD

The present disclosure relates generally to memory devices, and more particularly, to a self-aligned etch back for vertical three dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory, e.g., phase-change random access memory, resistive memory, e.g., resistive random-access memory, cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated, e.g., to select the cell, by an access line coupled to the access transistor. The capacitor can store a charge corresponding to a data value of a respective cell, e.g., a logic "1" or "0".

BRIEF DESCRIPTION OF THE DRAWINGS

FIGS. 5A-5B illustrate an example method, at another stage of a semiconductor fabrication process, for forming arrays of vertically stacked memory cells, having horizontal access devices, in accordance with a number of embodiments of the present disclosure.

FIGS. 6A-6E illustrate an example method, at another stage of a semiconductor fabrication process, for forming arrays of vertically stacked memory cells having horizontal access devices, in accordance with a number of embodiments of the present disclosure.

FIGS. 7A-7D illustrate an example method, at another stage of a semiconductor fabrication process, for forming arrays of vertically stacked memory cells having horizontal access devices, in accordance with a number of embodiments of the present disclosure.

FIGS. 8A-8B illustrate an example method, at another stage of a semiconductor fabrication process, for forming arrays of vertically stacked memory cells having horizontal access devices, in accordance with a number of embodiments of the present disclosure.

FIGS. 9A-9F illustrate an example method, at another stage of a semiconductor fabrication process, for forming arrays of vertically stacked memory cells having horizontal access devices, in accordance with a number of embodiments of the present disclosure.

FIGS. 10A-10E illustrate an example method, at another stage of a semiconductor fabrication process, for forming arrays of vertically stacked memory cells having horizontal access devices, in accordance with a number of embodiments of the present disclosure.

FIGS. 11A-11E illustrate an example method, at another stage of a semiconductor fabrication process, for forming arrays of vertically stacked memory cells having horizontal access devices, in accordance with a number of embodiments of the present disclosure.

FIGS. 12A-12E illustrate an example method, at another stage of a semiconductor fabrication process, for forming arrays of vertically stacked memory cells having horizontal access devices, in accordance with a number of embodiments of the present disclosure.

FIGS. 13A-13E illustrate an example method, at another stage of a semiconductor fabrication process, for forming arrays of vertically stacked memory cells having horizontal access devices, in accordance with a number of embodiments of the present disclosure.

FIG. 14 illustrates an example of a horizontally oriented access device coupled to a horizontally oriented storage node, in accordance with a number of embodiments of the present disclosure.

DETAILED DESCRIPTION

Figure 1A:
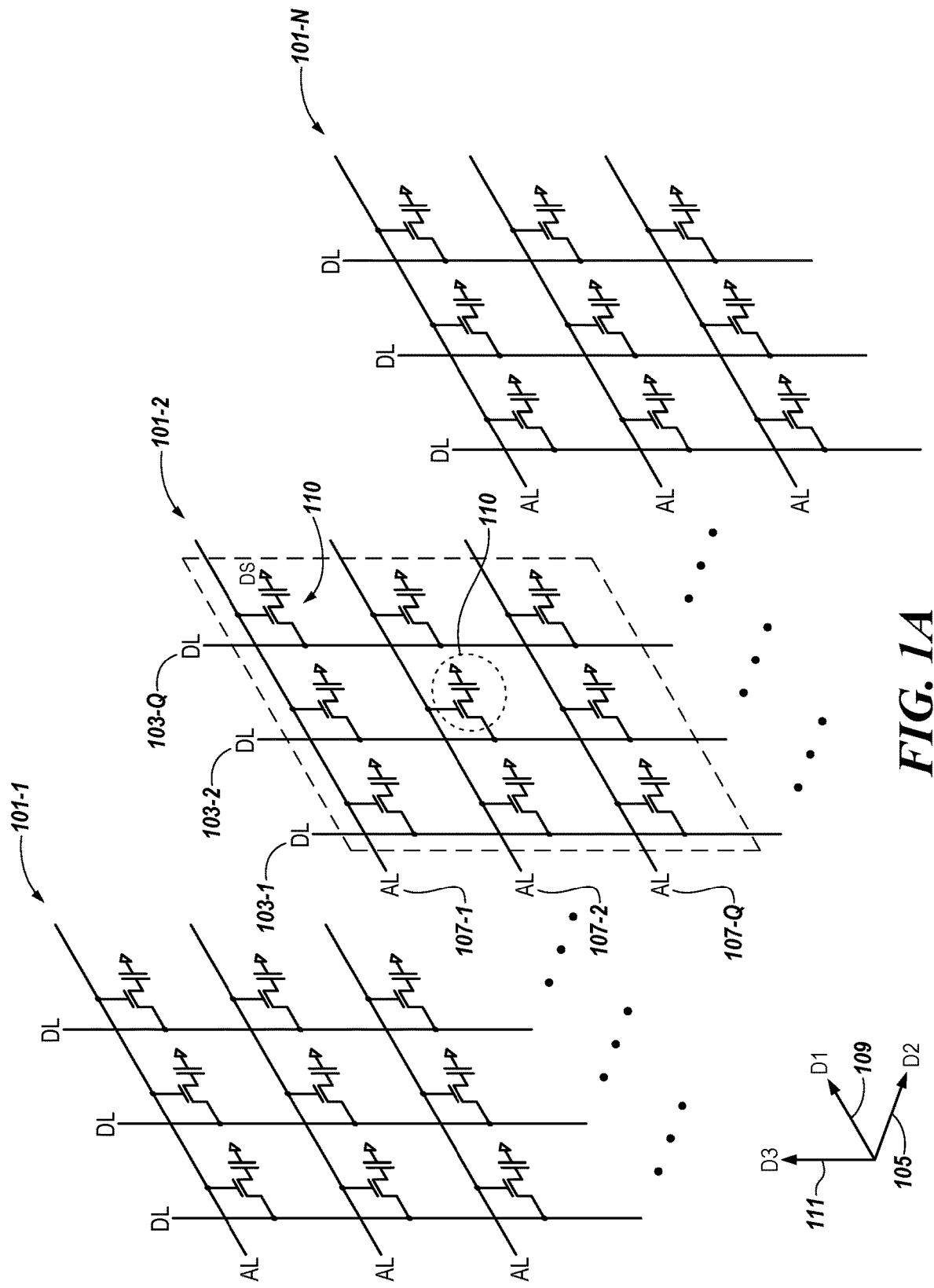
FIG. 1A is a schematic illustration of a vertical three dimensional (3D) memory in accordance a number of embodiments of the present disclosure.

Embodiments of the present disclosure describe a self-aligned etch back for vertical three dimensional (3D) memory. A fill material is deposited in first horizontal openings formed in layers of semiconductor material of an array of vertically stacked memory cells. The fill material is removed using a selective etch to form second horizontal openings in the layers of semiconductor material of the vertically stacked memory cells. The selective etch is selective to the semiconductor material of the layer in which the fill material was deposited. Storage node material is deposited in the second horizontal openings to form horizontal storage nodes.

Forming the second horizontal openings by selectively removing the fill material via a selective etch instead of forming the second horizontal openings by removing portions of the semiconductor material using a timed etch increases the control of the etch. As dimensions decrease and aspect ratios increase for vertical three dimensional (3D) memory, an intended etch back distance from a vertical opening with high aspect ratios is more difficult to control using a timed etch and, as a result, the different layers of the semiconductor material may unintentionally have an etch back length of different distances. As used herein, the term "etch back distance" refers to a horizontal distance within a layer of material to which a portion of that material has been removed. Having different etch back distances may result in non-uniform component formation, e.g., storage nodes and/or access devices. For example, capacitors, formed as storage nodes, having non-uniformity in size and surface area can cause variations in a magnitude of charge storage capability. Unintended variations in charge storage magnitude can lead to inaccurate memory cell reads and/or device performance failures. Similar issues may arise with other component non-uniformity. As used herein, the term "gate-induced drain leakage" refers to tunneling-based leakage currents caused where the gate overlaps the drain. Using a selective etch to selectively remove the fill material can reduce, e.g., eliminate any differences in etch back distances and thereby mitigate any GIDL.

The figures herein follow a numbering convention in which the first digit or digits correspond to the figure number of the drawing and the remaining digits identify an element or component in the drawing. Similar elements or components between different figures may be identified by the use of similar digits. For example, reference numeral 101 may reference element "01" in FIG. 1, and a similar element may be referenced as 201 in FIG. 2. Multiple analogous elements within one figure may be referenced with a reference numeral followed by a hyphen and another numeral or a letter. For example, 103-1 may reference element 103-1 in FIGS. 1 and 103-2 may reference element 103-2, which may be analogous to element 103-1. Such analogous elements may be generally referenced without the hyphen and extra numeral or letter. For example, elements 103-1 and 103-2 or other analogous elements may be generally referenced as 103.

FIG. 1A is a block diagram of an apparatus in accordance with a number of embodiments of the present disclosure. FIG. 1A illustrates a circuit diagram showing a cell array of a three dimensional (3D) semiconductor memory device according to embodiments of the present disclosure. FIG. 1A illustrates that a cell array may have a plurality of sub cell arrays 101-1, 101-2, ..., 101-N. The sub cell arrays 101-1, 101-2, ..., 101-N may be arranged along a second direction (D2) 105. Each of the sub cell arrays, e.g., sub cell array 101-2, may include a plurality of access lines 107-1, 107-2, ..., 107-Q (which also may be referred to a word lines). Also, each of the sub cell arrays, e.g., sub cell array 101-2, may include a plurality of digit lines 103-1, 103-2, ..., 103-Q (which also may be referred to as bit lines, data lines, or sense lines). In FIG. 1A, the access lines 107-1, 107-2, ..., 107-Q are illustrated extending in a first direction (D1) 109 and the digit lines 103-1, 103-2, ..., 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the digit lines 103-1, 103-2, ..., 103-Q are extending in a vertical direction, e.g., third direction (D3) 111.

A memory cell, e.g., 110, may include an access device, e.g., access transistor, and a storage node located at an intersection of each access line 107-1, 107-2, ..., 107-Q and each digit line 103-1, 103-2, ..., 103-Q. Memory cells may be written to, or read from, using the access lines 107-1, 107-2, ..., 107-Q and digit lines 103-1, 103-2, ..., 103-Q. The access lines 107-1, 107-2, ..., 107-Q may conductively interconnect memory cells along horizontal rows of each sub cell array 101-, 101-2, ..., 101-N, and the digit lines 103-1, 103-2, ..., 103-Q may conductively interconnect memory cells along vertical columns of each sub cell array 101-, 101-2, ..., 101-N. One memory cell, e.g., 110, may be located between one access line, e.g., 107-2, and one digit line, e.g., 103-2. Each memory cell may be uniquely addressed through a combination of an access line 107-1, 107-2, ..., 107-Q and a digit line 103-1, 103-2, ..., 103-Q.

The access lines 107-1, 107-2, ..., 107-Q may be or include conducting patterns, e.g., metal lines, disposed on and spaced apart from a substrate. The access lines 107-1, 107-2, ..., 107-Q may extend in a first direction (D1) 109. The access lines 107-1, 107-2, ..., 107-Q in one sub cell array, e.g., 101-2, may be spaced apart from each other in a vertical direction, e.g., in a third direction (D3) 111.

The digit lines 103-1, 103-2, ..., 103-Q may be or include conductive patterns, e.g., metal lines, extending in a vertical direction with respect to the substrate, e.g., in a third direction (D3) 111. The digit lines in one sub cell array, e.g., 101-2, may be spaced apart from each other in the first direction (D1) 109.

A gate of a memory cell, e.g., memory cell 110, may be connected to an access line, e.g., 107-2, and a first conductive node, e.g., first source/drain region, of an access device, e.g., transistor, of the memory cell 110 may be connected to a digit line, e.g., 103-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 103-2, and the other may be connected to a storage node.

Figure 1B:
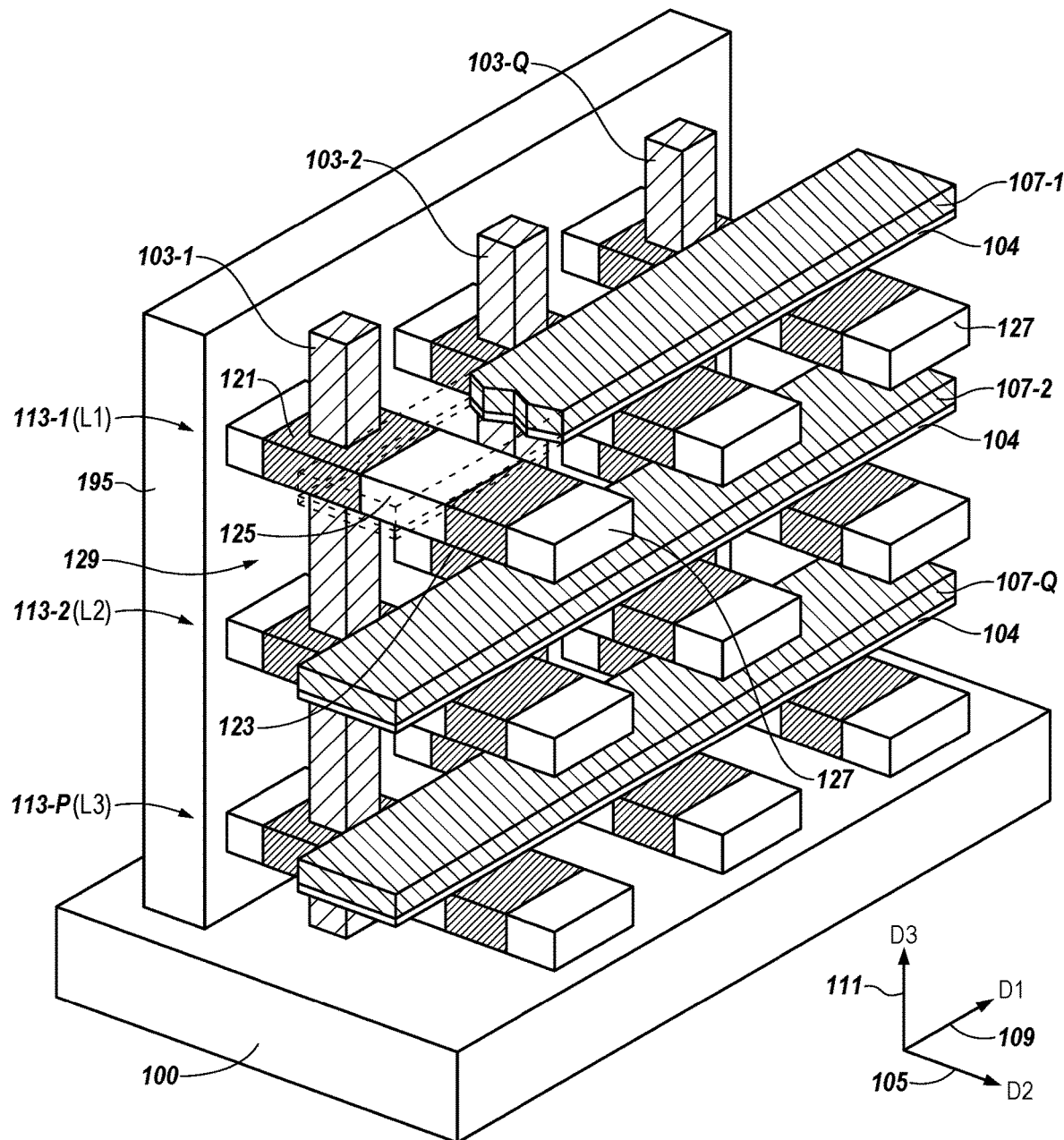
FIG. 1B is a perspective view illustrating a portion of a horizontal access device in a vertical three dimensional (3D) memory in accordance with a number of embodiments of the present disclosure.

FIG. 1B illustrates a perspective view showing a three dimensional (3D) semiconductor memory device, e.g., a portion of a sub cell array 101-2 shown in FIG. 1A as a vertically oriented stack of memory cells in an array, according to some embodiments of the present disclosure.

As shown in FIG. 1B, a substrate 100 may have formed thereon one of the plurality of sub cell arrays, e.g., 101-2, described in connection with FIG. 1A. For example, the substrate 100 may be or include a silicon substrate, a germanium substrate, or a silicon-germanium substrate, etc. Embodiments, however, are not limited to these examples.

As shown in the example embodiment of FIG. 1B, the substrate 100 may have fabricated thereon a vertically oriented stack of memory cells, e.g., memory cell 110 in FIG. 1A, extending in a vertical direction, e.g., third direction (D3) 111. According to some embodiments the vertically oriented stack of memory cells may be fabricated such that each memory cell, e.g., memory cell 110 in FIG. 1A, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1A. Each of the repeating, vertical levels, L1, L2, and L3 may include a plurality of discrete components, e.g., regions, to the horizontally oriented access devices 129, e.g., transistors, and storage nodes, e.g., capacitors, including access line 107-1, 107-2, . . . , 107-Q connections and digit line 103-1, 103-2, . . . , 103-Q connections. The plurality of discrete components to the horizontally oriented access devices 129, e.g., transistors, may be formed in a plurality of iterations of vertically, repeating layers within each level and may extend horizontally in the second direction (D2) 105, analogous to second direction (D2) 105 shown in FIG. 1A.

The plurality of discrete components to the horizontally oriented access devices 129, e.g., transistors, may include a first source/drain region 121 and a second source/drain region 123 separated by a channel region 125, extending laterally in the second direction (D2) 105, and formed in a body of the access devices. In some embodiments, the channel region 125 may include silicon, germanium, silicon-germanium, and/or indium gallium zinc oxide (IGZO). In some embodiments, the first and the second source/drain regions, 121 and 123, can include an n-type dopant region formed in a p-type doped body to the access device to form an n-type conductivity transistor. In some embodiments, the first and the second source/drain regions, 121 and 123, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 127, e.g., capacitor, may be connected to one respective end of the access device. As shown in FIG. 1B, the storage node 127, e.g., capacitor, may be connected to the second source/drain region 123 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1A, may similarly extend in the second direction (D2) 105, analogous to second direction (D2) 105 shown in FIG. 1A.

As shown in FIG. 1B a plurality of horizontally oriented access lines 107-1, 107-2, . . . , 107-Q extend in the first direction (D1) 109, analogous to the first direction (D1) 109 in FIG. 1A. The plurality of horizontally oriented access lines 107-1, 107-2, . . . , 107-Q may be analogous to the access lines 107-1, 107-2, . . . , 107-Q shown in FIG. 1A. The plurality of horizontally oriented access lines 107-1, 107-2, . . . , 107-Q may be arranged, e.g., "stacked", along the third direction (D3) 111. The plurality of horizontally oriented access lines 107-1, 107-2, . . . , 107-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 113-1, (L2) 113-2, and (L3) 113-P, the horizontally oriented memory cells, e.g., memory cell 110 in FIG. 1A, may be spaced apart from one another horizontally in the first direction (D1) 109. However, the plurality of discrete components to the horizontally oriented access devices 129, e.g., first source/drain region 121 and second source/drain region 123 separated by a channel region 125, extending laterally in the second direction (D2) 105, and the plurality of horizontally oriented access lines 107-1, 107-2, . . . , 107-Q extending laterally in the first direction (D1) 109, may be formed within different vertical layers within each level. For example, the plurality of horizontally oriented access lines 107-1, 107-2, . . . , 107-Q, extending in the first direction (D1) 109, may be formed on a top surface opposing and electrically coupled to the channel regions 125, separated therefrom by a gate dielectric 104, and orthogonal to horizontally oriented access devices 129, e.g., transistors, extending in laterally in the second direction (D2) 105. In some embodiments, the plurality of horizontally oriented access lines 107-1, 107-2, . . . , 107-Q, extending in the first direction (D1) 109 are formed in a higher vertical layer, farther from the substrate 100, within a level, e.g., within level (L1), than a layer in which the discrete components, e.g., first source/drain region 121 and second source/drain region 123 separated by a channel region 125, of the horizontally oriented access device are formed.

As shown in the example embodiment of FIG. 1B, the digit lines, 103-1, 103-2, . . . , 103-Q, extend in a vertical direction with respect to the substrate 100, e.g., in a third direction (D3) 111. Further, as shown in FIG. 1B, the digit lines, 103-1, 103-2, . . . , 103-Q, in one sub cell array, e.g., sub cell array 101-2 in FIG. 1A, may be spaced apart from each other in the first direction (D1) 109. The digit lines, 103-1, 103-2, . . . , 103-Q, may be provided, extending vertically relative to the substrate 100 in the third direction (D3) 111 in vertical alignment with source/drain regions to serve as first source/drain regions 121 or, as shown, be vertically adjacent first source/drain regions 121 for each of the horizontally oriented access devices 129, e.g., transistors, extending laterally in the second direction (D2) 105, but adjacent to each other on a level, e.g., first level (L1), in the first direction (D1) 109. Each of the digit lines, 103-1, 103-2, . . . , 103-Q, may vertically extend, in the third direction (D3), on sidewalls, adjacent first source/drain regions 121, of respective ones of the plurality of horizontally oriented access devices 129, e.g., transistors, that are vertically stacked. In some embodiments, the plurality of vertically oriented digit lines 103-1, 103-2, . . . , 103-Q, extending in the third direction (D3) 111, may be connected to side surfaces of the first source/drain regions 121 directly and/or through additional contacts including metal silicides.

For example, a first one of the vertically extending digit lines, e.g., 103-1, may be adjacent a sidewall of a first source/drain region 121 to a first one of the horizontally oriented access devices 129, e.g., transistors, in the first level (L1) 113-1, a sidewall of a first source/drain region 121 of a first one of the horizontally oriented access devices 129, e.g., transistors, in the second level (L2) 113-2, and a sidewall of a first source/drain region 121 a first one of the horizontally oriented access devices 129, e.g., transistors, in the third level (L3) 113-P, etc. Similarly, a second one of the vertically extending digit lines, e.g., 103-2, may be adjacent a sidewall to a first source/drain region 121 of a second one of the horizontally oriented access devices 129, e.g., transistors, in the first level (L1) 113-1, spaced apart from the first one of horizontally oriented access devices 129, e.g., transistors, in the first level (L1) 113-1 in the first direction (D1) 109. And the second one of the vertically extending digit lines, e.g., 103-2, may be adjacent a sidewall of a first source/drain region 121 of a second one of the horizontally oriented access devices 129, e.g., transistors, in the second level (L2) 113-2, and a sidewall of a first source/drain region 121 of a second one of the horizontally oriented access devices 129, e.g., transistors, in the third level (L3) 113-P, etc. Embodiments are not limited to a particular number of levels.

The vertically extending digit lines, 103-1, 103-2, . . . , 103-Q, may include a conductive material, such as, for example, one of a doped semiconductor material, a conductive metal nitride, metal, and/or a metal-semiconductor compound. The digit lines, 103-1, 103-2, . . . , 103-Q, may correspond to digit lines (DL) described in connection with FIG. 1A.

As shown in the example embodiment of FIG. 1B, a conductive body contact 195 may be formed extending in the first direction (D1) 109 along an end surface of the horizontally oriented access devices 129, e.g., transistors, in each level (L1) 113-1, (L2) 113-2, and (L3) 113-P above the substrate 100. The body contact may be connected to a body, e.g., body region, of the horizontally oriented access devices 129, e.g., transistors, in each memory cell, e.g., memory cell 110 in FIG. 1A. The body contact may include a conductive material such as, for example, one of a doped semiconductor material, a conductive metal nitride, metal, and/or a metal-semiconductor compound.

Although not shown in FIG. 1B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 2A:
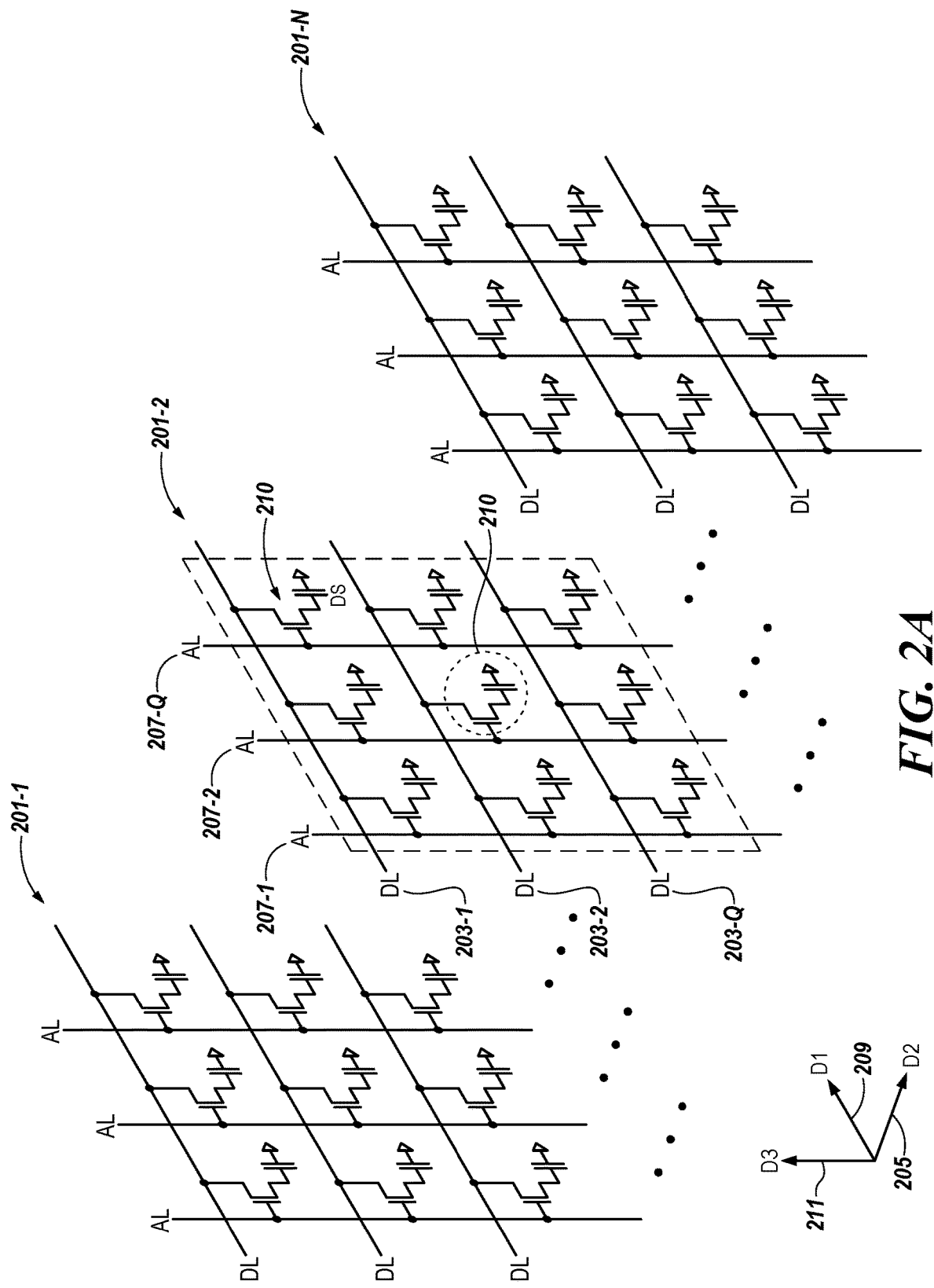
FIG. 2A is a schematic illustration of a horizontal access device in a vertical three dimensional (3D) memory in accordance with a number of embodiments of the present disclosure.

FIG. 2A is a block diagram of an apparatus in accordance with a number of embodiments of the present disclosure. FIG. 2A illustrates a circuit diagram showing a cell array of a three dimensional (3D) semiconductor memory device according to embodiments of the present disclosure. FIG. 2A illustrates that a cell array may have a plurality of sub cell arrays 201-1, 201-2, . . . , 201-N. The sub cell arrays 201-1, 201-2, . . . , 201-N may be arranged along a second direction (D2) 205. Each of the sub cell arrays, e.g., sub cell array 201-2, may include a plurality of access lines 207-1, 207-2, . . . , 207-Q (which also may be referred to as word lines). Also, each of the sub cell arrays, e.g., sub cell array 201-2) may include a plurality of digit lines 203-1, 203-2, . . . , 203-Q (which also may be referred to as bit lines, data lines, or sense lines). In FIG. 2A, the digit lines 203-1, 203-2, . . . , 203-Q are illustrated extending in a first direction (D1) 209 and the access lines 207-1, 207-2, . . . , 207-Q are illustrated extending in a third direction (D3) 211.

The first direction (D1) 209 and the second direction (D2) 205 may be considered in a horizontal ("X-Y") plane. The third direction (D3) 211 may be considered in a vertical ("Z") direction, e.g., transverse to the X-Y plane. Hence, according to embodiments described herein, the access lines 207-1, 207-2, . . . , 207-Q are extending in a vertical direction, e.g., third direction (D3) 211.

A memory cell, e.g., 210, may include an access device, e.g., access transistor, and a storage node located at an intersection of each access line 207-1, 207-2, . . . , 207-Q and each digit line 203-1, 203-2, . . . , 203-Q. Memory cells may be written to, or read from, using the access lines 207-1, 207-2, . . . , 207-Q and digit lines 203-1, 203-2, . . . , 203-Q. The digit lines 203-1, 203-2, . . . , 203-Q may conductively interconnect memory cells along horizontal columns of each sub cell array 201-, 201-2, . . . , 201-N, and the access lines 207-1, 207-2, . . . , 207-Q may conductively interconnect memory cells along vertical rows of each sub cell array 201-1, 201-2, . . . , 201-N. One memory cell, e.g., 210, may be located between one access line, e.g., 207-2, and one digit line, e.g., 203-2. Each memory cell may be uniquely addressed through a combination of an access line 207-1, 207-2, . . . , 207-Q and a digit line 203-1, 203-2, . . . , 203-Q.

The digit lines 203-1, 203-2, . . . , 203-Q may be or include conducting patterns, e.g., metal lines, disposed on and spaced apart from a substrate. The digit lines 203-1, 203-2, . . . , 203-Q may extend in a first direction (D1) 209. The digit lines 203-1, 203-2, . . . , 203-Q in one sub cell array, e.g., 201-2, may be spaced apart from each other in a vertical direction, e.g., in a third direction (D3) 211.

The access lines 207-1, 207-2, . . . , 207-Q may be or include conductive patterns, e.g., metal lines, extending in a vertical direction with respect to the substrate, e.g., in a third direction (D3) 211. The access lines in one sub cell array, e.g., 201-2, may be spaced apart from each other in the first direction (D1) 209.

A gate of a memory cell, e.g., memory cell 210, may be connected to an access line, e.g., 207-2, and a first conductive node, e.g., first source/drain region, of an access device, e.g., transistor, of the memory cell 210 may be connected to a digit line, e.g., 203-2. Each of the memory cells, e.g., memory cell 210, may be connected to a storage node, e.g., capacitor. A second conductive node, e.g., second source/drain region, of the access device, e.g., transistor, of the memory cell 210 may be connected to the storage node, e.g., capacitor. Storage nodes, such as capacitors, can be formed from ferroelectric and/or dielectric materials such as zirconium oxide (ZrO2), hafnium oxide (HfO2) oxide, lanthanum oxide (La2O3), lead zirconate titanate (PZT, Pb[Zr(x)Ti(1−x)]O3), barium titanate (BaTiO3), aluminum oxide, e.g., Al2O3, a combination of these with or without dopants, or other suitable materials.

While first and second source/drain region reference is used herein to denote two separate and distinct source/drain regions, it is not intended that the source/drain region referred to as the "first" and/or "second" source/drain regions have some unique meaning. It is intended only that one of the source/drain regions is connected to a digit line, e.g., 203-2, and the other may be connected to a storage node.

Figure 2B:
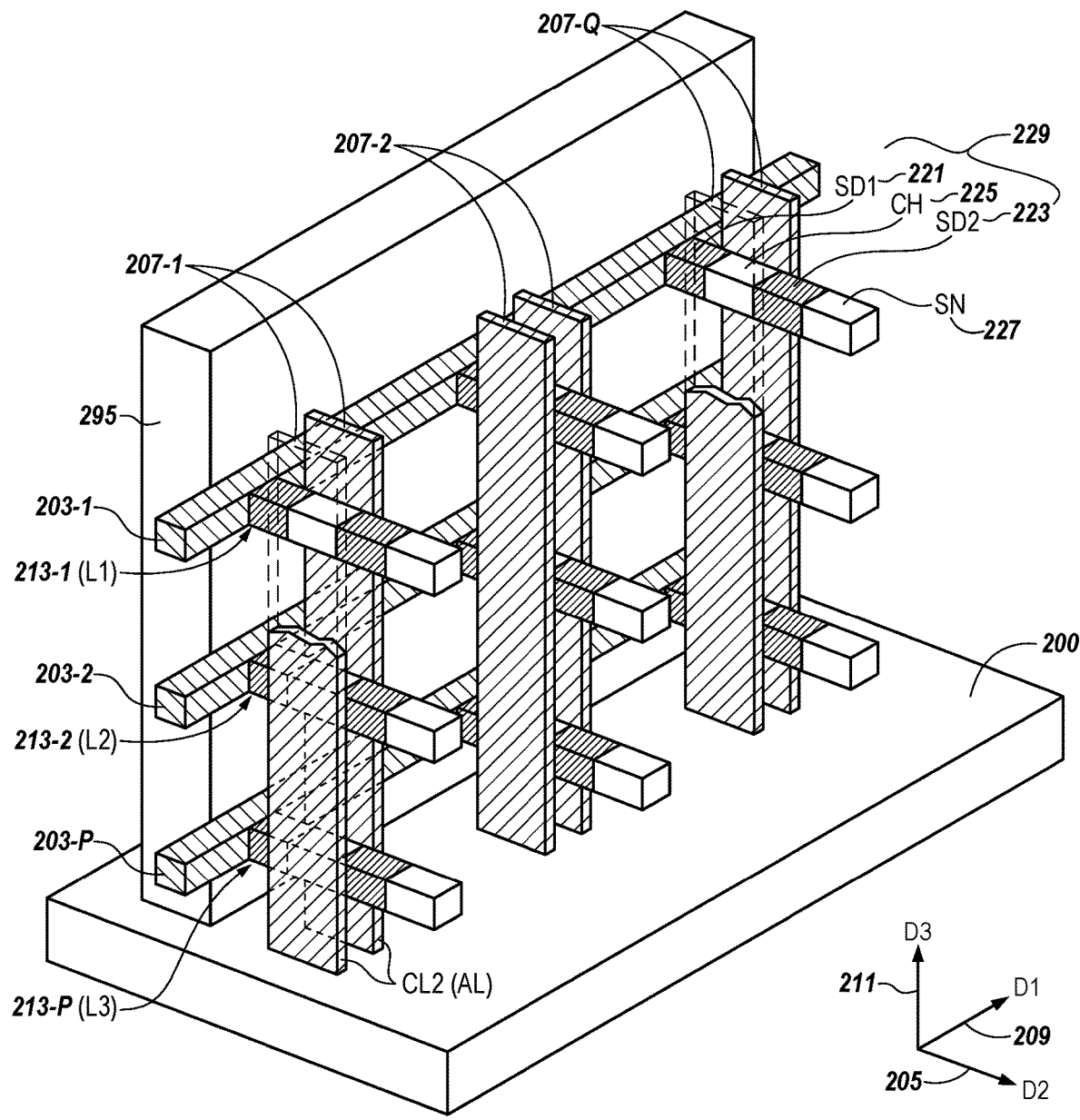
FIG. 2B is a perspective view illustrating a portion of a horizontal access device in a vertical three dimensional (3D) memory array in accordance with a number of embodiments of the present disclosure.

FIG. 2B illustrates a perspective view showing a three dimensional (3D) semiconductor memory device, e.g., a portion of a sub cell array 201-2 shown in FIG. 2A as a vertically oriented stack of memory cells in an array, according to some embodiments of the present disclosure. FIG. 3 illustrates a perspective view showing unit cell, e.g., memory cell 210 shown in FIG. 2A, of the 3D semiconductor memory device shown in FIG. 2B.

As shown in FIG. 2B, a substrate 200 may have formed thereon one of the plurality of sub cell arrays, e.g., 201-2, described in connection with FIG. 2A. For example, the substrate 200 may be or include a silicon substrate, a germanium substrate, or a silicon-germanium substrate, etc. Embodiments, however, are not limited to these examples.

As shown in the example embodiment of FIG. 2B, the substrate 200 may have fabricated thereon a vertically oriented stack of memory cells, e.g., memory cell 210 in FIG. 2A, extending in a vertical direction, e.g., third direction (D3) 211. According to some embodiments the vertically oriented stack of memory cells may be fabricated such that each memory cell, e.g., memory cell 210 in FIG. 2A, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 211 shown in FIG. 2A. Each of the repeating, vertical levels, L1, L2, and L3 may include a plurality of discrete components, e.g., regions, to the horizontally oriented access devices 229, e.g., transistors, and storage nodes, e.g., capacitors, including access line 207-1, 207-2, . . . , 207-Q connections and digit line 203-1, 203-2, . . . , 203-Q connections. The plurality of discrete components to the horizontally oriented access devices 229, e.g., transistors, may be formed in a plurality of iterations of vertically, repeating layers within each level and may extend horizontally in the second direction (D2) 205, analogous to second direction (D2) 205 shown in FIG. 2A.

The plurality of discrete components to the horizontally oriented access devices 229, e.g., transistors, may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227, e.g., capacitor, may be connected to one respective end of the access device 229. As shown in FIG. 2B, the storage node 227, e.g., capacitor, may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 210 in FIG. 2A, may similarly extend in the second direction (D2) 205, analogous to second direction (D2) 205 shown in FIG. 2A.

As shown in FIG. 2B a plurality of horizontally oriented digit lines 203-1, 203-2, . . . , 203-Q extend in the first direction (D1) 209, analogous to the first direction (D1) 209 in FIG. 2A. The plurality of horizontally oriented digit lines 203-1, 203-2, . . . , 203-Q may be analogous to the digit lines 203-1, 203-2, . . . , 203-Q shown in FIG. 2A. The plurality of horizontally oriented digit lines 203-1, 203-2, . . . , 203-Q may be arranged, e.g., "stacked", along the third direction (D3) 211. The plurality of horizontally oriented digit lines 203-1, 203-2, . . . , 203-Q may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), ruthenium (Ru), cobalt (Co), molybdenum (Mo), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-P, the horizontally oriented memory cells, e.g., memory cell 210 in FIG. 2A, may be spaced apart from one another horizontally in the first direction (D1) 209. However, the plurality of discrete components to the horizontally oriented access devices 229, e.g., first source/drain region 221 and second source/drain region 223 separated by a channel region 225, extending laterally in the second direction (D2) 205, and the plurality of horizontally oriented digit lines 203-1, 203-2, . . . , 203-Q, extending laterally in the first direction (D1) 209, may be formed within different vertical layers within each level. For example, the plurality of horizontally oriented digit lines 203-1, 203-2, . . . , 203-Q, extending in the first direction (D1) 209, may be disposed on, and in electrical contact with, top surfaces of first source/drain regions 221 and orthogonal to horizontally oriented access devices 229, e.g., transistors, extending laterally in the second direction (D2) 205. In some embodiments, the plurality of horizontally oriented digit lines 203-1, 203-2, . . . , 203-Q, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the horizontally oriented access device are formed. In some embodiments, the plurality of horizontally oriented digit lines 203-1, 203-2, . . . , 203-Q, extending in the first direction (D1) 209, may be connected to the top surfaces of the first source/drain regions 221 directly and/or through additional contacts including metal silicides.

As shown in the example embodiment of FIG. 2B, the access lines, 207-1, 207-2, . . . , 207-Q, extend in a vertical direction with respect to the substrate 200, e.g., in a third direction (D3) 211. Further, as shown in FIG. 2B, the access lines, 207-1, 207-2, . . . , 207-Q, in one sub cell array, e.g., sub cell array 201-2 in FIG. 2A, may be spaced apart from each other in the first direction (D1) 209. The access lines, 207-1, 207-2, . . . , 207-Q, may be provided, extending vertically relative to the substrate 200 in the third direction (D3) 211 between a pair of the horizontally oriented access devices 229, e.g., transistors, extending laterally in the second direction (D2) 205, but adjacent to each other on a level, e.g., first level (L1), in the first direction (D1) 209. Each of the access lines, 207-1, 207-2, . . . , 207-Q, may vertically extend, in the third direction (D3), on sidewalls of respective ones of the plurality of horizontally oriented access devices 229, e.g., transistors, that are vertically stacked.

For example a first one of the vertically extending access lines, e.g., 207-1, may be adjacent a sidewall of a channel region 225 to a first one of the horizontally oriented access devices 229, e.g., transistors, in the first level (L1) 213-1, a sidewall of a channel region 225 of a first one of the horizontally oriented access devices 229, e.g., transistors, in the second level (L2) 213-2, and a sidewall of a channel region 225 a first one of the horizontally oriented access devices 229, e.g., transistors, in the third level (L3) 213-P, etc. Similarly, a second one of the vertically extending access lines, e.g., 207-2, may be adjacent a sidewall to a channel region 225 of a second one of the horizontally oriented access devices 229, e.g., transistors, in the first level (L1) 213-1, spaced apart from the first one of horizontally oriented access devices 229, e.g., transistors, in the first level (L1) 213-1 in the first direction (D1) 209. And the second one of the vertically extending access lines, e.g., 207-2, may be adjacent a sidewall of a channel region 225 of a second one of the horizontally oriented access devices 229, e.g., transistors, in the second level (L2) 213-2, and a sidewall of a channel region 225 of a second one of the horizontally oriented access devices 229, e.g., transistors, in the third level (L3) 213-P, etc. Embodiments are not limited to a particular number of levels.

The vertically extending access lines, 207-1, 207-2, . . . , 207-Q, may include a conductive material, such as, for example, one of a doped semiconductor material, a conductive metal nitride, metal, and/or a metal-semiconductor compound. The access lines, 207-1, 207-2, . . . , 207-Q, may correspond to access lines (AL) described in connection with FIG. 2A.

As shown in the example embodiment of FIG. 2B, a conductive body contact 295 may be formed extending in the first direction (D1) 209 along an end surface of the horizontally oriented access devices 229, e.g., transistors, in each level (L1) 213-1, (L2) 213-2, and (L3) 213-P above the substrate 200. The body contact 295 may be connected to a body of the horizontally oriented access devices 229, e.g., transistors, in each memory cell, e.g., memory cell 210 in FIG. 2A. The body contact 295 may include a conductive material such as, for example, one of a doped semiconductor material, a conductive metal nitride, metal, and/or a metal-semiconductor compound.

Figure 3A:
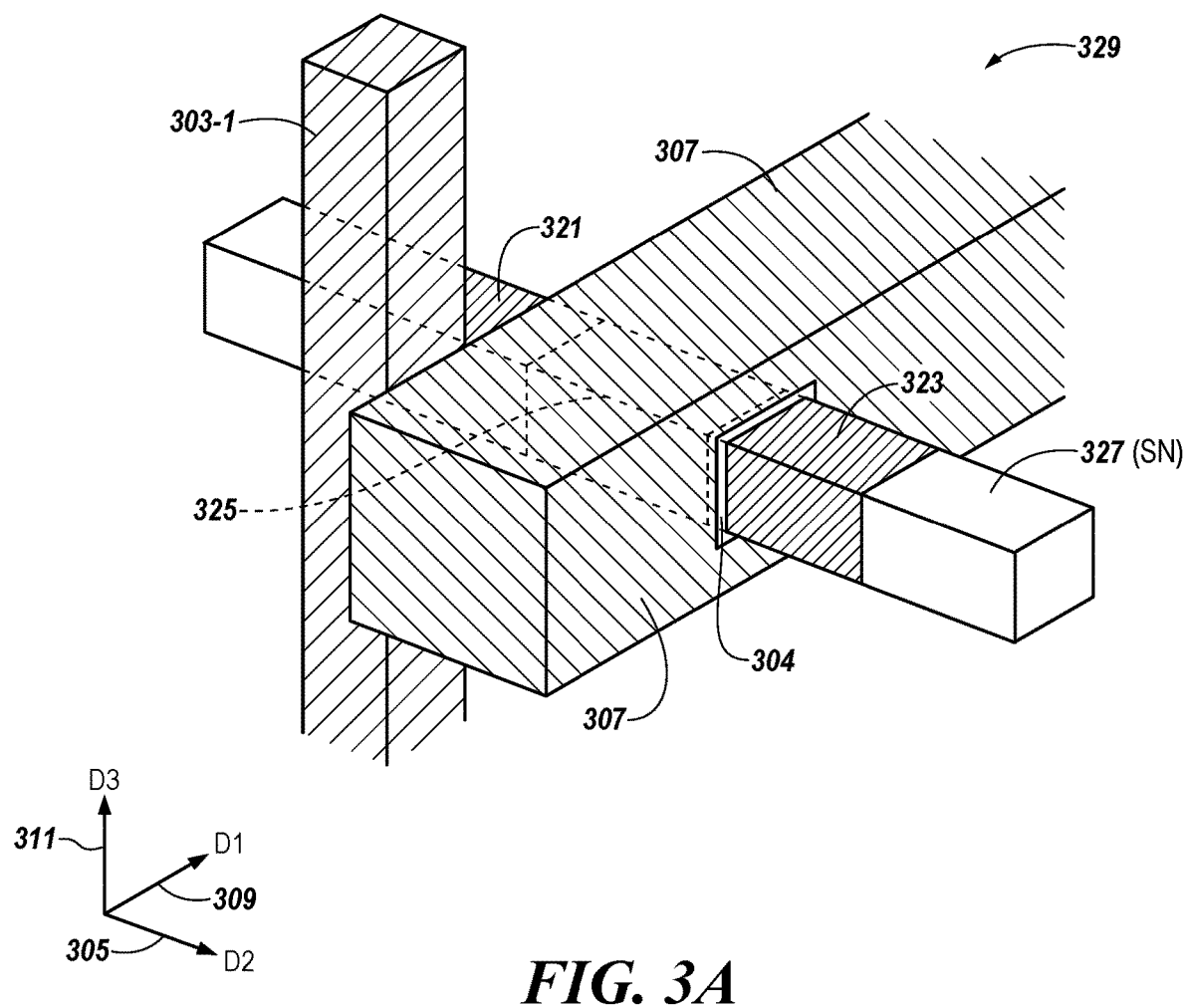
FIGS. 3A-3B is a perspective view illustrating a portion of a horizontal access device in a vertical three dimensional (3D) memory cell in accordance with a number of embodiments of the present disclosure.

Although not shown in FIG. 2B, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples FIG. 3A illustrates in more detail a unit cell, e.g., memory cell 110 in FIGS. 1A and 1B, of the vertically stacked array of memory cells, e.g., within a sub cell array 101-2 in FIGS. 1A and 1B, according to some embodiments of the present disclosure. As shown in FIG. 3A, the first and the second source/drain regions, 321 and 323, may be impurity doped regions to the horizontally oriented access devices 329, e.g., transistors. The first and the second source/drain regions, 321 and 323, may be analogous to the first and the second source/drain regions 221 and 223 shown in FIG. 2. The first and the second source/drain regions may be separated by a channel 325 formed in a body of semiconductor material, e.g., body region of the horizontally oriented access devices 329, e.g., transistors. The first and the second source/drain regions, 321 and 323, may be formed from an n-type or p-type dopant doped in the body region. Embodiments are not so limited.

For example, for an n-type conductivity transistor construction the body region of the horizontally oriented access devices 329, e.g., transistors, may be formed of a low doped p-type (p-) semiconductor material. In one embodiment, the body region and the channel 325 separating the first and the second source/drain regions, 321 and 323, may include a low doped, p-type, e.g., low dopant concentration (p-), polysilicon (Si) material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In2O3), or indium tin oxide (In2-xSnxO3), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorus (P), boron (B), etc. Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity, e.g., high dopant (n+), doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 329, e.g., transistors, may be of a p-type conductivity construction in which case the impurity, e.g., dopant, conductivity types would be reversed.

As shown in the example embodiment of FIG. 3A, the first source/drain region 321 may occupy an upper portion in the body of the horizontally oriented access devices 329, e.g., transistors. For example, the first source/drain region 321 may have a bottom surface within the body of the horizontally oriented access device 329 which is located higher, vertically in the third direction (D3) 311, than a bottom surface of the body of the horizontally, horizontally oriented access device 329. As such, the horizontally oriented transistor 329 may have a body portion which is below the first source/drain region 321 and is in electrical contact with the body contact. Further, as shown in the example embodiment of FIG. 3A, an access line, e.g., 307, analogous to the access lines 203-1, 203-2, . . . , 203-Q in FIGS. 2 and 107-1, 107-2, . . . , 107-Q shown in FIG. 1, may disposed on a top surface opposing and coupled to a channel region 325, separated therefrom by a gate dielectric 304. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a digit line, e.g., 303-1, analogous to the digit lines 207-1, 207-2, . . . , 207-Q in FIGS. 2A and 2B and 103-1, 103-2, . . . , 103-Q in FIGS. 1A and 1B, may be vertically extending in the third direction (D3) 311 adjacent a sidewall of the first source/drain region 321 in the body to the horizontally oriented access devices 329, e.g., transistors horizontally conducting between the first and the second source/drain regions 321 and 323 along the second direction (D2) 305. In this embodiment, the vertically oriented digit line 303-1 is formed asymmetrically adjacent in electrical contact with the first source/drain regions 321. The digit line 303-1 may be formed as asymmetrically to reserve room for a body contact in the channel region 325.

Figure 3B:
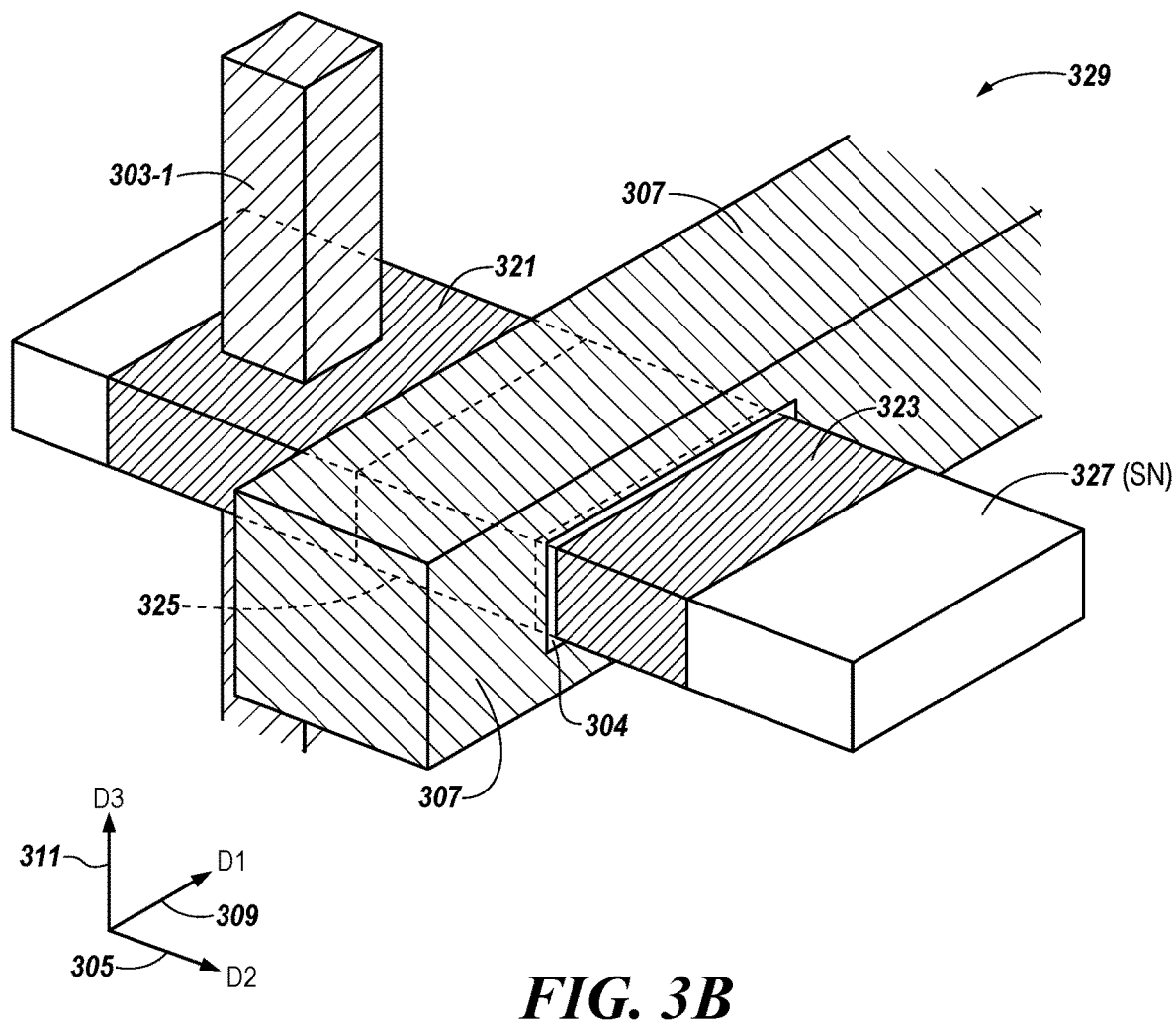

FIG. 3B illustrates in more detail a unit cell, e.g., memory cell 110 in FIG. 1A, of the vertically stacked array of memory cells, e.g., within a sub cell array 101-2 in FIG. 1A, according to some embodiments of the present disclosure. As shown in FIG. 3B, the first and the second source/drain regions, 321 and 323, may be impurity doped regions to the horizontally oriented access devices 329, e.g., transistors. The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions may be separated by a channel 325 formed in a body of semiconductor material, e.g., body region, of the horizontally oriented access devices 329, e.g., transistors. The first and the second source/drain regions, 321 and 323, may be formed from an n-type or p-type dopant doped in the body region. Embodiments are not so limited.

As shown in the example embodiment of FIG. 3B, a digit line, e.g., 303-1, analogous to the digit lines 207-1, 207-2, . . . , 207-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 329, e.g., transistors horizontally conducting between the first and the second source/drain regions 321 and 323 along the second direction (D2) 305. In this embodiment, the vertically oriented digit line 303-1 is formed symmetrically, in vertical alignment, in electrical contact with the first source/drain region 321. The digit line 303-1 may be formed in contact with an insulator material such that there is no body contact within channel 325.

As shown in the example embodiment of FIG. 3B, the digit line 303-1 may be formed symmetrically within the first source/drain region 321 such that the first source/drain region 321 surrounds the digit line 303-1 all around. The first source/drain region 321 may occupy an upper portion in the body of the horizontally oriented access devices 329, e.g., transistors. For example, the first source/drain region 321 may have a bottom surface within the body of the horizontally oriented access device 329 which is located higher, vertically in the third direction (D3) 311, than a bottom surface of the body of the horizontally, horizontally oriented access device 329. As such, the horizontally, horizontally oriented transistor 329 may have a body portion which is below the first source/drain region 321 and is in contact with the body contact. An insulator material may fill the body contact such that the first source/drain region 321 may not be in electrical contact with channel 325. Further, as shown in the example embodiment of FIG. 3B, an access line, e.g., 307-1, analogous to the access lines 203-1, 203-2, . . . , 203-Q in FIGS. 2 and 107-1, 107-2, . . . , 107-Q shown in FIG. 1, may disposed all around and coupled to a channel region 325, separated therefrom by a gate dielectric 304

Figure 4:
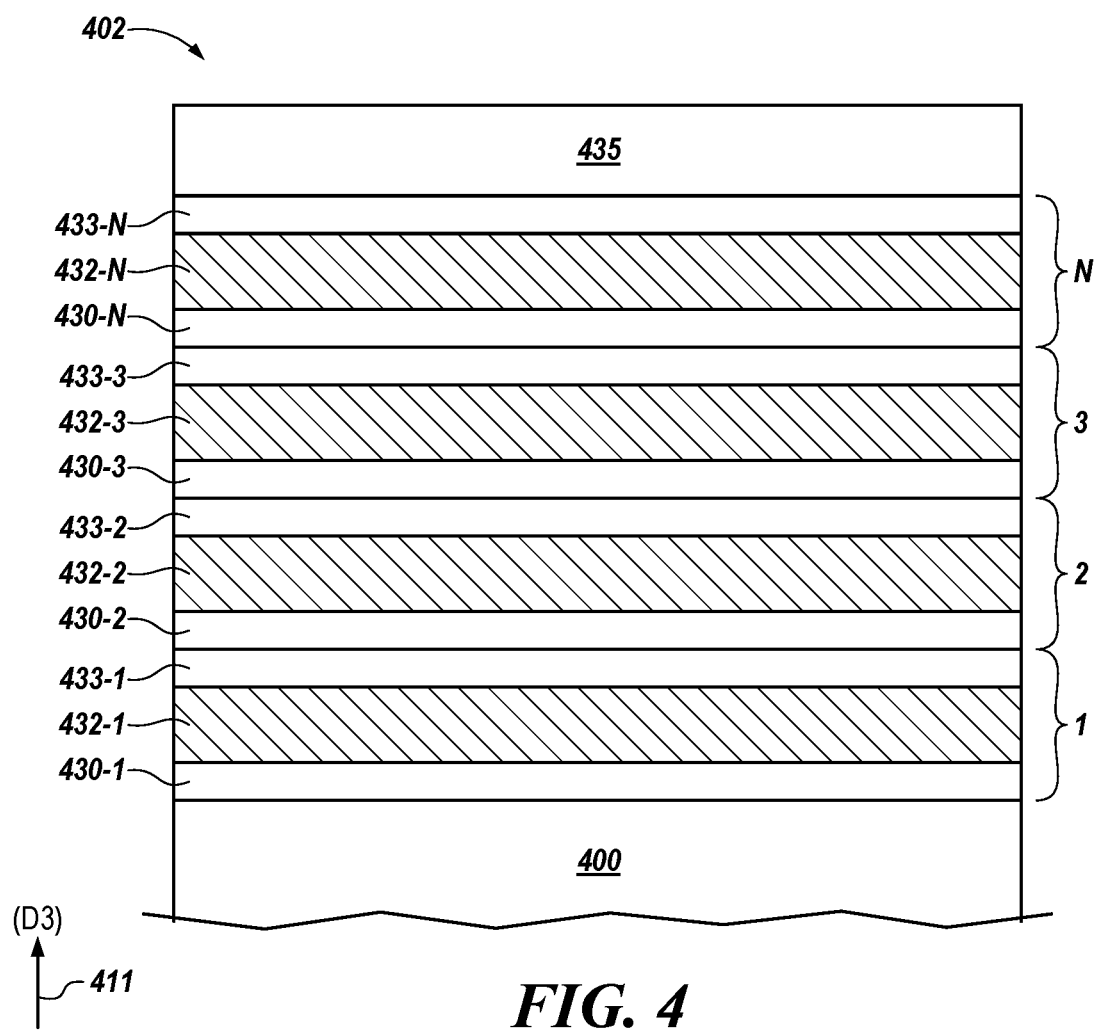
FIG. 4 illustrates an example method for forming arrays of vertically stacked memory cells, at one stage of a semiconductor fabrication process, for forming arrays of vertically stacked memory cells, having horizontal access devices in accordance with a number of embodiments of the present disclosure.

FIG. 4 illustrates an example method, at one stage of a semiconductor fabrication process, for forming arrays of vertically stacked memory cells, having horizontally oriented access devices and vertically oriented access lines, in accordance with a number of embodiments of the present disclosure. In the example embodiment shown in the example of FIG. 4, the method comprises depositing alternating layers of a first dielectric material, 430-1, 430-2, . . . , 430-N (individually or collectively referred to as first dielectric material 430), a sacrificial material, e.g., semiconductor material, 432-1, 432-2, . . . , 432-N (individually or collectively as sacrificial material 432), and a second dielectric material, 433-1, 433-2, . . . , 433-N (individually or collectively referred to as second dielectric material 433) in repeating iterations to form a vertical stack 402 on a working surface of a semiconductor substrate 400. In one embodiment, the dielectric material 430 can be deposited to have a thickness, e.g., vertical height in the third direction (D3), in a range of twenty (20) nanometers (nm) to sixty (60) nm. In one embodiment, the sacrificial material 432 can be deposited to have a thickness, e.g., vertical height, in a range of twenty (20) nm to one hundred (100) nm. In some embodiments, the height of the array of vertically stack memory cells can be at least four (4) tiers. Embodiments, however, are not limited to these examples.

In one example, the sacrificial material, 432-1, 432-2, . . . , 432-N, can comprise a sacrificial semiconductor material such as polycrystalline silicon (Si), silicon nitride (SiN), or even an oxide-based semiconductor composition. While the discussion herein will refer to a sacrificial semiconductor material example, embodiments are not limited to this example. It is intended that the sacrificial material may be selectively etched relative to the layers of the first dielectric material, 430-1, 430-2, . . . , 430-N, and the second dielectric material 433-1, 433-2, . . . , 433-N.

As shown in FIG. 4, a vertical direction 411 is illustrated as a third direction (D3), e.g., z-direction in an x-y-z coordinate system, analogous to the third direction (D3), among first, second and third directions, shown in FIGS. 1-3. In the example of FIG. 4, four tiers, numbered 1, 2, 3, and N, of the repeating iterations of the vertical stack 402 are shown. Embodiments, however, are not limited to this example and more or fewer repeating iterations may be included. A photolithographic hard mask (HM) layer 435 may be deposited as a top layer on the repeating iterations of the vertical stack 402.

In some embodiments, the first dielectric material, 430-1, 430-2, . . . , 430-N, and the second dielectric material 433-1, 433-2, . . . , 432-N may be interlayer dielectrics (ILD). By way of example, and not by way of limitation, the first dielectric material, 430-1, 430-2, . . . , 430-N, and second dielectric material 433-1, 433-2, . . . , 433-N may comprise a silicon dioxide ($SiO_2$) material. In another example the first dielectric material, 430-1, 430-2, . . . , 430-N, and the second dielectric material 433-1, 433-2, . . . , 432-N, may comprise a silicon nitride ($Si_3N_4$) material (also referred to herein a "SiN"). In another example the first dielectric material, 430-1, 430-2, . . . , 430-N, and the second dielectric material 433-1, 433-2, . . . , 432-N may comprise a silicon oxy-carbide ($SiO_xC_y$) material (also referred to herein as "SiOC"). In another example the first dielectric material, 430-1, 430-2, . . . , 430-N, and the second dielectric material 433-1, 433-2, . . . , 432-N may include silicon oxy-nitride ($SiO_xN_y$) material (also referred to herein as "SiON"), and/or combinations thereof. Embodiments are not limited to these examples. In some embodiments the sacrificial semiconductor material, 432-1, 432-2, . . . , 432-N, may comprise a silicon (Si) material in a polycrystalline and/or amorphous state. In another example the sacrificial semiconductor material, 432-1, 432-2, . . . , 432-N, may comprise a silicon nitride (SiN) material. Embodiments, however, are not limited to these examples.

The repeating iterations of first dielectric material, 430-1, 430-2, . . . , 430-N, sacrificial semiconductor material, 432-1, 432-2, . . . , 432-N, and second dielectric material 433-1, 433-2, . . . , 432-N layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the layers of a first dielectric material, 430-1, 430-2, . . . , 430-N, a sacrificial semiconductor material, 432-1, 432-2, . . . , 432-N, and a second dielectric material 433-1, 433-2, . . . , 432-N in repeating iterations to form a vertical stack 402, as shown in FIG. 4.

Figure 5A:
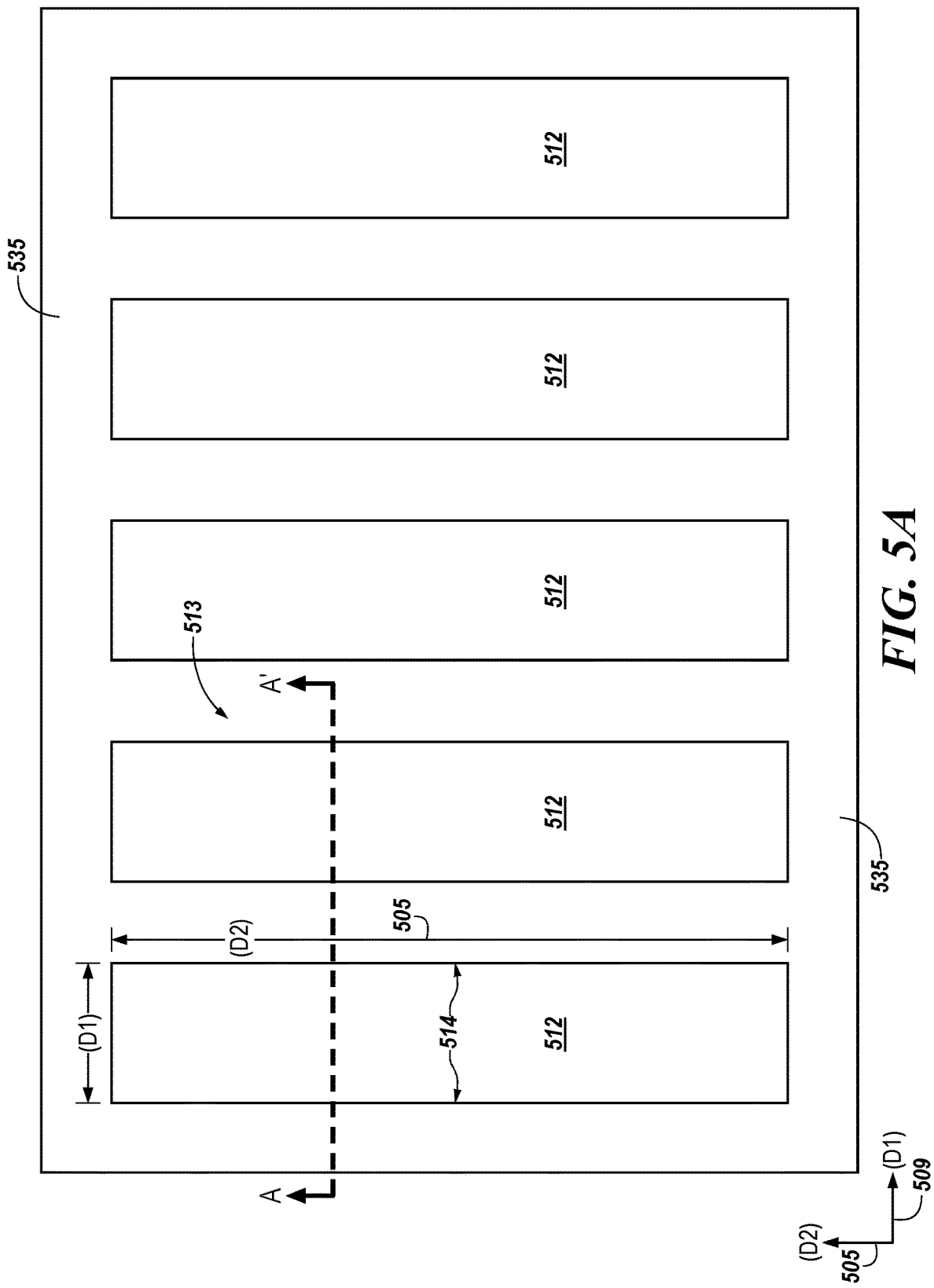

FIG. 5A illustrates an example method, at another stage of a semiconductor fabrication process, for forming arrays of vertically stacked memory cells, having horizontally oriented access devices and vertically oriented access lines, in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of first vertical openings 512, having a first horizontal direction (D1) 509 and a second horizontal direction (D2) 505, through the vertical stack to the substrate. In one example, as shown in FIG. 5A, the plurality of first vertical openings 512 are extending predominantly in the second horizontal direction (D2) 505 and may form elongated vertical, pillar columns 513 with first vertical sidewalls 514 in the vertical stack. The plurality of first vertical openings 512 may be formed using photolithographic techniques to pattern a photolithographic mask 535, e.g., to form a hard mask (HM), on the vertical stack prior to etching the plurality of first vertical openings 512.

FIG. 5B is a cross sectional view, taken along cut-line A-A' in FIG. 5A, showing another view of the semiconductor structure at a particular time in the semiconductor fabrication process. FIG. 5B illustrates that a conductive material, 540-1, 540-2, . . . , 540-4, may be formed on a gate dielectric material 538 in the plurality of first vertical openings 512. By way of example and not by way of limitation, a gate dielectric material 538 may be conformally deposited in the plurality of first vertical openings 512 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide (SiO$_2$) material, aluminum oxide (Al2O3) material, high dielectric constant (k), e.g., high-k, dielectric material, and/or combinations thereof as also described in FIG. 3.

Further, as shown in FIG. 5B, the method of forming arrays of vertically stacked memory cells can include conformally depositing a conductive material, 540-1, 540-2, . . . , 540-4, on the gate dielectric material 538 in the plurality of first vertical openings 512. By way of example, and not by way of limitation, the conductive material, 540-1, 540-2, . . . , 540-4, may be conformally deposited in the plurality of first vertical openings 512 on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 538. The conductive material, 540-1, 540-2, . . . , 540-4, may be conformally deposited to a particular thickness (t2) to form vertically oriented access lines, such as shown as access lines 107-1, 107-2, . . . , 107-Q (which also may be referred to a word lines) shown in FIGS. 1A and 1B, and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may be comprise a metal such as tungsten (W), metal composition, titanium nitride (TiN), doped polysilicon, and/or some other combination thereof as also described in FIG. 3.

The method of forming arrays of vertically stacked memory cells can include removing portions of the conductive material, 540-1, 540-2, . . . , 540-N, in the plurality of first vertical openings 512 to form a plurality of separate, vertical conductive lines 540-1, 540-2, . . . , 540-4, along the first vertical sidewalls, e.g., first vertical sidewalls 514 in FIG. 5A. As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The conductive material, 540-1, 540-2, . . . , 540-4, may be recessed back by using a suitable selective, anisotropic etch process to remove the conductive material, 540-1, 540-2, . . . , 540-4, from a bottom surface of the first vertical openings, e.g., 512 in FIG. 5A, exposing the gate dielectric 538 on the bottom surface to form separate conductive material, 540-1, 540-2, . . . , 540-4.

As shown in FIG. 5B, the method of forming arrays of vertically stacked memory cells can include depositing a third dielectric material 541 in the plurality of first vertical openings 512. By way of example, and not by way of limitation, the third dielectric material 541 may be a material such as an oxide or other suitable spin on dielectric (SOD) and may be deposited in the first vertical openings 512, using a process such as CVD, to fill the first vertical openings 512. The dielectric may be planarized to a top surface of the hard mask 535 of the vertical semiconductor stack, e.g., 402 as shown in FIG. 4, using chemical mechanical planarization (CMP) or other suitable semiconductor fabrication technique. A subsequent photolithographic material 536, e.g., hard mask, may be deposited using CVD and planarized using CMP to cover and close the first vertical openings 512 over the conductive material, 540-1, 540-2, . . . , 540-4. Similar semiconductor process techniques may be used at other points of the semiconductor fabrication process described herein.

Figure 6A:
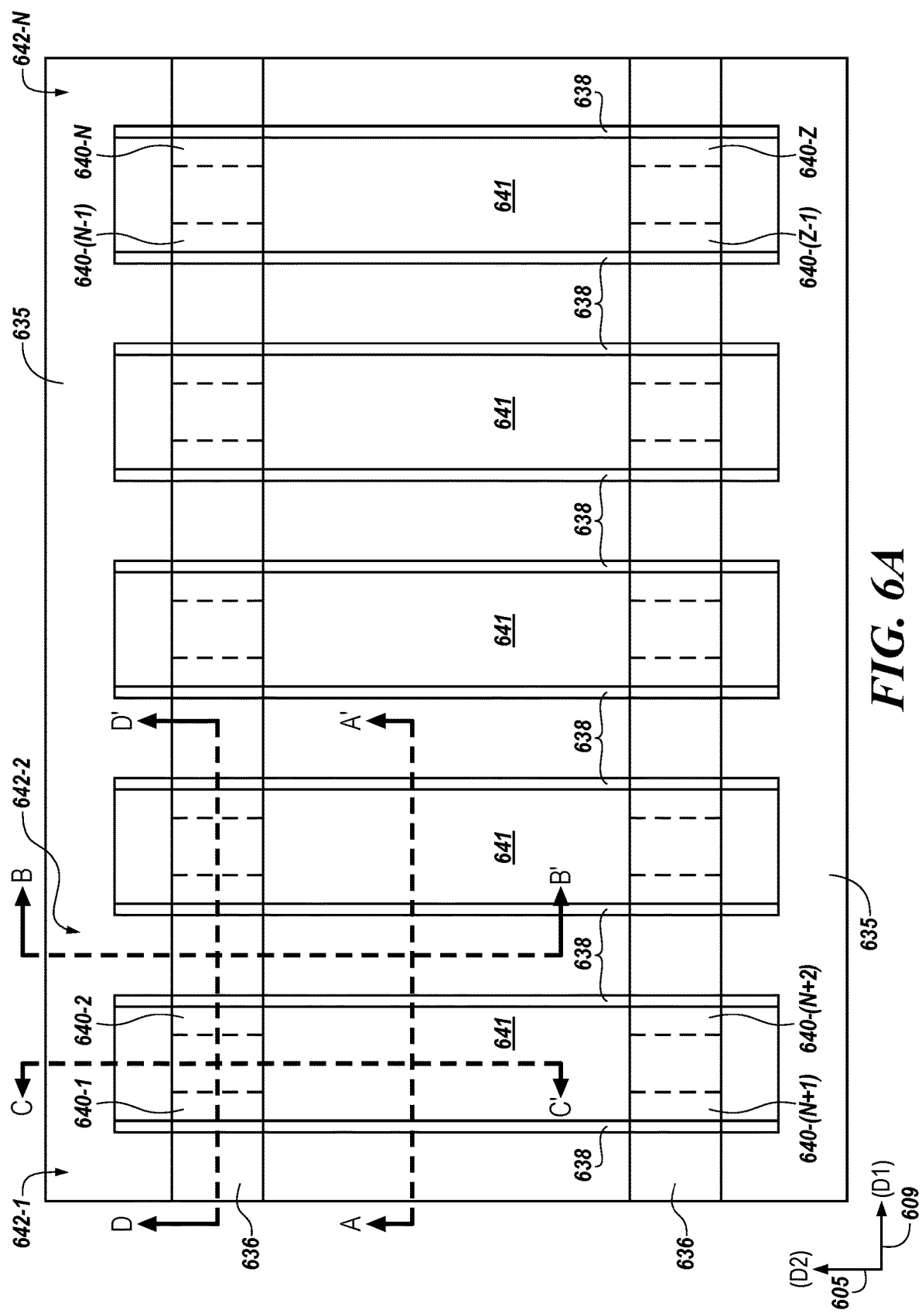

FIG. 6A illustrates an example method, at another stage of a semiconductor fabrication process, for forming arrays of vertically stacked memory cells, having horizontally oriented access devices and vertically oriented access lines, in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636. The method in FIG. 6A, further illustrates using a selective, isotropic etchant process to remove portions of the exposed conductive material, 640-1, 640-2, . . . , 640-(N−1), 640-N, 640-(N+1), 640-(Z−1), and 640-Z (540 in FIG. 5B), to separate and individually form the plurality of separate, vertical access lines, 640-1, 640-2, . . . , 640-(N−1), 640-N,

640-(N+1), . . . , 640-(Z−1), and 640-Z, e.g., access lines 107-1, 107-2, . . . , 107-Q in FIGS. 1A and 1B, et. seq. Hence the plurality of separate, vertical access lines, 640-1, 640-2, . . . , 640-(N−1), 640-N, 640-(N+1), . . . , 640-(Z−1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 640-1, 640-2, . . . , 640−(N−1), 640-N, 640-(N+1), . . . , 640-(Z−1), and 640-Z, may be removed back to the gate dielectric material 638 in the first vertical openings, e.g., 512 in FIG. 5A, using a suitable selective, isotropic etch process. As shown in FIG. 6A, a subsequent dielectric material, e.g., third dielectric material, 641, such as an oxide or other suitable spin on dielectric (SOD), may then be deposited to fill the remaining openings from where the exposed conductive material, 640-1, 640-2, . . . , 640-(N−1), 640-N, 640-(N+1), . . . , 640-(Z−1), and 640-Z, was removed using a process such as CVD, or other suitable technique. The dielectric material 641 may be planarized to a top surface of the previous hard mask 635 of the vertical semiconductor stack, e.g., 402 as shown in FIG. 4, using a process such as CMP, or other suitable technique. In some embodiments, a subsequent photolithographic material 635, e.g., hard mask, may be deposited using CVD and planarized using CMP to cover and close the plurality of separate, vertical access lines, 640-1, 640-2, . . . , 640-(N−1), 640-N, 640-(N+1), . . . , 640-(Z−1), and 640-Z, over a working surface of the vertical semiconductor stack, e.g., 402 in FIG. 4, leaving the plurality of separate, vertical access lines, 640-1, 640-2, . . . , 640-(N−1), 640-N, 640-(N+1), . . . , 640-(Z−1), and 640-Z, protected along the sidewalls of the elongated vertical, pillar columns. Embodiments, however, are not limited to these process examples.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-(N−1), 640-N, 640-(N+1), . . . , 640-(Z−1), and shows the repeating iterations of alternating layers of a first dielectric material, 630-1, 630-2, . . . , 630-N, a sacrificial semiconductor material, 632-1, 632-2, . . . , 632-N, and a second dielectric material 633-1, 633-2, . . . , 633-N, on a semiconductor substrate 600 to form the vertical stack, e.g. 402 in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition on the sidewalls of the elongated vertical, pillar columns 643-1, 642-2, and 642-3. The hard mask 636, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a first dielectric material, 630-1, 630-2, . . . , 630-N, a sacrificial semiconductor material, 632-1, 632-2, . . . , 632-N, and a second dielectric material 633-1, 633-2, . . . , 633-N, along and in which the horizontally oriented access devices and horizontally oriented storage nodes, e.g., capacitor cells, can be formed within the layers of sacrificial semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a first dielectric material, 630-1, 630-2, . . . , 630-N, a sacrificial semiconductor material, 632-1, 632-2, . . . , 632-N, and a second dielectric material 633-1, 633-2, . . . , 633-N, outside of a region in which the horizontally oriented access devices and horizontally oriented storage nodes, e.g., capacitor cells, will be formed within the layers of sacrificial semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1), extending into and out from the plane of the drawings sheet, for a three dimensional array of vertically oriented memory cells. At the left end of the drawing sheet is shown the repeating iterations of alternating layers of a first dielectric material, 630-1, 630-2, . . . , 630-N, a sacrificial semiconductor material, 632-1, 632-2, . . . , 632-N, and a second dielectric material 633-1, 633-2, . . . , 633-N at which location a horizontally oriented digit line, e.g., digit lines 107-1, 107-2, . . . , 107-P shown in FIG. 1, et. seq., can be integrated to form electrical contact with the second source/drain, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a first dielectric material, 630-1, 630-2, . . . , 630-N, a sacrificial semiconductor material, 632-1, 632-2, . . . , 632-N, and a second dielectric material 633-1, 633-2, . . . , 633-N, intersecting across the plurality of separate, vertical access lines, 640-1, 640-2, . . . , 640-(N−1), 640-N, 640-(N+1), . . . , 640-(Z−1), and intersecting regions of the sacrificial semiconductor material, 632-1, 632-2, . . . , 632-N, in which a channel region may be formed, separated from the plurality of separate, vertical access lines, 640-1, 640-2, . . . , 640-(N−1), 640-N, 640-(N+1), 640-(Z−1), by the gate dielectric 638. In FIG. 6E, the third dielectric material 641 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three dimensional (3D) memory.

FIG. 7A illustrates an example method, at another stage of a semiconductor fabrication process, for forming arrays of vertically stacked memory cells having horizontal access devices, in accordance with a number of embodiments of the present disclosure. FIG. 7A illustrates a cross-sectional view of a semiconductor structure, at a particular point in time, in a semiconductor fabrication process, according to one or more embodiments. FIG. 7A illustrates a cross sectional view, taken along cut-line A-A' in FIG. 7B. As similarly stated in reference to FIG. 5A, the method for forming an array of vertically stacked memory cells, having horizontally oriented access devices and horizontally oriented storage nodes comprises depositing layers of a first dielectric material, 730-1, 730-2, 730-3, . . . , 730-N (individually or collectively referred to as first dielectric material 730), a semiconductor material, 732-1, 732-2, 732-3, . . . , 732-N (individually or collectively referred to as sacrificial semiconductor material 732), and a second dielectric material, 733-1, 733-2, 733-3, . . . , 733-N (individually or collectively referred to as second dielectric material 733), in repeating iterations to form a vertical stack, e.g., vertical stack 402 in FIG. 4. Forming the layers of the first dielectric material 730, the semiconductor material 732, and the second dielectric material 733 in repeating iterations vertically to form the vertical stack can comprise depositing an oxide material as the first dielectric material 730, depositing a polysilicon material as the semiconductor material 732, and depositing a nitride material as the second dielectric material 733. Embodiments, however, are not limited to this example. Other suitable materials may be used which can be selectively etched respectively to one another.

As shown in FIG. 7A, a photolithographic mask, e.g., mask, material 735 can be deposited over the vertical stack. An etchant process may be used to remove portions of the mask material 735 to form openings 758 in the mask material 735. Neighboring, opposing vertical access lines 740 are illustrated by dashed lines indicating locations set in from the plane and orientation of the drawing sheet.

FIG. 7B illustrates a top down view of the semiconductor structure shown in FIG. 7A. As shown in FIG. 7B, portions of the mask material 735 have been patterned and etched to expose portions of the elongated vertical, pillar columns in the plurality of vertical stacks, e.g., vertical stack 402 in FIG. 4, and the third dielectric material 741, e.g., third dielectric material 641 in FIG. 6E. The top of the elongated vertical pillar columns in the vertical stacks are shown in FIG. 7B as the top, second dielectric layer 733-N and dashed lines of each vertical stack. The third dielectric material 741 is shown in the exposed portion deposited between iterations of the vertical stack. As shown in FIG. 7B, multiple portions of the mask material 735 can be removed from the top portion of the vertical stack to form patterned openings 758 in the mask material 735. The patterned openings 758 in the mask material can have a first horizontal direction (D1) 709 and a second horizontal direction (D2) 705 and extend predominantly in the first horizontal direction (D1) 709. The multiple openings 758 in the mask material 735 can extend parallel to each other predominantly in the first horizontal direction (D1) 709. At this stage of the semiconductor fabrication process, the portions of the hard mask material 735 that are above the vertical conductive lines 740 have not been removed.

FIG. 7C illustrates an example method, at another stage of a semiconductor fabrication process, for forming arrays of vertically stacked memory cells having horizontal access devices, in accordance with a number of embodiments of the present disclosure. FIG. 7C illustrates a cross sectional view, taken along cut-line C-C' in FIG. 7D, showing another view of the semiconductor structure at this particular point in one example semiconductor fabrication process of an embodiment of the present disclosure. At this stage in the semiconductor fabrication process, the method for forming arrays of vertically stacked memory cells comprises forming a plurality of second vertical openings, e.g., second vertical openings 749 shown in FIG. 7D, in the third dielectric material to expose second vertical sidewalls 745 in the vertical stack. In some embodiments, the second vertical openings can extend down to the bottom, first dielectric layer 730-1. In other embodiments, the second vertical openings can extend down to the substrate 700. The second vertical openings can be formed between the elongated vertical, pillar columns.

FIG. 7D illustrates a top down view of the semiconductor structure shown in FIG. 7A. As shown in FIG. 7D, the second vertical openings 749 can be formed in portions of the arrays of vertically stacked memory cells that are not covered by the mask material 735. In some embodiments, the second vertical openings 749 can be formed by selectively etching the third dielectric material, e.g., third dielectric material 741 in FIG. 7B, via a selective etch. The selective etch can be selective to, e.g., does not etch, the first dielectric material 730, the semiconductor material 732, and the second dielectric material 733. The second vertical openings 749 form a non-solid space between each stack of the repeating iterations of the first dielectric material 730, the semiconductor material 732, and the second dielectric material 733.

FIG. 8A illustrates an example method, at another stage of a semiconductor fabrication process, for forming arrays of vertically stacked memory cells having horizontal access devices, in accordance with a number of embodiments of the present disclosure. FIG. 8A illustrates a cross sectional view, taken along cut-line A-A' in FIG. 8B, showing another view of the semiconductor structure at this particular point in one example semiconductor fabrication process of an embodiment of the present disclosure. At this stage in the semiconductor fabrication process, the method for forming arrays of vertically stacked memory cells comprises forming a plurality of first horizontal openings 831-1, 831-2 (individually or collectively referred to as first horizontal openings 831) in the layers of the semiconductor material 832. Other numerated components may be analogous to those shown and discussed in connection with FIG. 7.

The plurality of first horizontal openings 831 can include a first plurality of first horizontal openings 831-1 and a second plurality of first horizontal openings 831-2. As shown in FIG. 8A, the first plurality of first horizontal openings 831-1 are in vertical alignment with each other and the second plurality of first horizontal openings 831-2 are in vertical alignment with each other. The first plurality of first horizontal openings 831-1 can extend parallel to the second plurality of first horizontal openings 831-2 into and out from the plane of the drawing sheet. Further, as shown in FIG. 8A, the first plurality of first horizontal openings 831-1 include the same quantity of horizontal openings as the second plurality of first horizontal openings 831-2.

In some embodiments, the method of forming vertically stacked memory cells can include using a lateral etch on opposing sides of the semiconductor material 832 from the plurality of second vertical openings formed through the exposed third dielectric material to form the plurality of first horizontal openings 831. As shown in FIG. 8A, the first plurality of first horizontal openings 831-1 are formed below an opening in the mask material 835 and the second plurality of first horizontal openings 831-2 are formed below a different opening in the mask material 835. In some embodiments, at least one layer of dielectric material, e.g., first dielectric material 830 and second dielectric material 833, can separate each horizontal opening in the first plurality of first horizontal openings 831-1 and each horizontal opening in the second plurality of first horizontal openings 831-2.

Further, a portion of the semiconductor material 832 can separate the first plurality of first horizontal openings 831-1 and the second plurality of first horizontal openings 831-2. The portion of the semiconductor material 832 that separates the first plurality of first horizontal openings 831-1 and the second plurality of first horizontal openings 831-2 can be below and in vertical alignment with a portion of the mask material 835. In some embodiments, the first horizontal openings 831 can be formed in portions of the semiconductor material 832 corresponding to the second vertical openings 849. In other words, the first horizontal openings 831 can be formed in the portions of the semiconductor material 832 that are adjacent the second vertical openings 849.

FIG. 8B illustrates a top down view of the semiconductor structure shown in FIG. 8A. Each layer of the second dielectric material 833-N shown in FIG. 8B is a top layer of repeated iterations of the first dielectric material 830 the semiconductor material 832, and the second dielectric material 833, e.g., vertical stack 402 in FIG. 4. The lateral etch used to form the first horizontal openings 831 can be selective to, e.g., not intended to remove, the first dielectric material 830 and the second dielectric material 833. As stated in reference to FIG. 8A, the lateral etch can be performed on the semiconductor material from opposing sides of the exposed vertical sidewalls through the second vertical openings 849 of the semiconductor material 832. The opposing sides of the semiconductor material can be the sidewalls of the portions of the semiconductor material 832 adjacent each second vertical opening 849. In some embodiments, the lateral etch can be performed on the opposing sides of the semiconductor material 832 simultaneously. FIG. 8B illustrates the lateral etch forming the plurality of first horizontal openings 831 in each layer of the semiconductor material 832 and passing entirely through the semiconductor material 832 in the elongated vertical, pillar columns of the vertical stack.

FIG. 9A illustrates an example method, at another stage of a semiconductor fabrication process, for forming arrays of vertically stacked memory cells having horizontal access devices, in accordance with a number of embodiments of the present disclosure. FIG. 9A illustrates a cross sectional view, taken along cut-line A-A' in FIG. 9B, showing another view of the semiconductor structure at this particular point in one example semiconductor fabrication process of an embodiment of the present disclosure. At this stage in the semiconductor fabrication process, the method for forming arrays of vertically stacked memory cells includes depositing a fill material 934-1, 943-2 (individually or collectively referred to as fill material 934) to occupy the plurality of first horizontal openings, e.g., first horizontal openings 831 shown in FIG. 8A, in the elongated vertical, pillar columns, e.g., elongated vertical, pillar columns 542 in FIG. 5.

The fill material 934 can be comprised of at least one of a variety of materials. For example, in some embodiments, the fill material 934 can be a silicon (Si) material. In some embodiments, the fill material 934 can be a germanium (Ge) material. Further, in some embodiments, the fill material 934 can be selective to, the semiconductor material 932.

In some embodiments, the method of forming the arrays of vertically stacked memory cells comprises doping the fill material 934. Doping the fill material 934 can cause doping of a portion of the semiconductor material 932. For instance, a dopant that is deposited into the fill material 934 can migrate from the fill material 934 to the semiconductor material 932. For example, a doped fill material may be annealed to migrate a dopant, e.g., p-type dopant (Boron atoms), to a source/drain region 978 of the semiconductor material 932. This dopant migration can allow the semiconductor material 932 to be doped after the fill material 934 is deposited. Other numerated components may be analogous to those shown and discussed in connection with FIG. 8.

FIG. 9B illustrates a top down view of the semiconductor structure shown in FIG. 9A. As shown in FIG. 9B, the second vertical openings 949 separate portions of the repeating iterations of the first dielectric material 930, semiconductor material 932, and the second dielectric material 933. The openings 958 in the mask material can have a first horizontal direction (D1) 909 and a second horizontal direction (D2) 905 and extend predominantly in the first horizontal direction (D1) 909. The second horizontal openings can have a first horizontal direction (D1) 909 and a second horizontal direction (D2) 905 extend predominantly in the second horizontal direction (D2) 905. The fill material 934 can be selectively etched to remove fill material 934 from the second vertical openings 949 as illustrated further in FIG. 9C.

FIG. 9C illustrates a cross sectional view, taken along cut-line B-B' in FIG. 9B, showing another view of the semiconductor structure at this particular point in one example semiconductor fabrication process of an embodiment of the present disclosure. As shown in FIG. 9C, multiple stacks of repeated iterations of the first dielectric material 930, the fill material 934, and the second dielectric material 933 can be separated by the second vertical openings 949. The second vertical openings 949 can be formed on opposing sides of the elongated vertical, pillar columns extending into and out of the plane of the drawing sheet of each stack of repeated iterations of the first dielectric material 930, the fill material 934, and the second dielectric material 933, e.g., vertical stack.

FIG. 9D illustrates a cross sectional view, taken along cut-line C-C' in FIG. 9B, showing another view of the semiconductor structure at this particular point in one example semiconductor fabrication process of an embodiment of the present disclosure. FIG. 9D illustrates multiple stacks of repeated iterations of the first dielectric material 930, the semiconductor material 932, and the second dielectric material 933 separated by the third dielectric material 941. A portion of the mask material 935 that was deposited over the repeated iterations of the first dielectric material 930, the semiconductor material 932, and the second dielectric material 933, as well as the third dielectric material 941, is shown. In the embodiment shown in FIG. 9D, the third dielectric material is deposited down to the bottom, first dielectric material 930-1 because the second vertical opening extends down to the bottom, first dielectric layer 930-1.

FIG. 9E illustrates an example method, at another stage of a semiconductor fabrication process, for forming arrays of vertically stacked memory cells having horizontal access devices, in accordance with a number of embodiments of the present disclosure. FIG. 9E illustrates a cross sectional view, taken along cut-line D-D' in FIG. 9F, showing another view of the semiconductor structure at this particular point in one example semiconductor fabrication process of an embodiment of the present disclosure. At this stage in the semiconductor fabrication process, the mask material 935 can be removed from the repeating iterations of the first dielectric material 930, semiconductor material 932, and second dielectric material 933 for further processing.

FIG. 9F illustrates a top down view of the semiconductor structure shown in FIG. 9E. In FIG. 9F, the vertical conductive lines 940 and portions of the repeating iterations of the first dielectric material 930, the semiconductor material 932, and the second dielectric material 933 are no longer covered by the mask material 935. As shown in FIG. 9F, a fourth dielectric material 947 was deposited in the second vertical openings 949 to fill the second vertical openings 949. In some embodiments, as shown in FIG. 9F, the fourth dielectric material 947 may be a same dielectric material as the third dielectric material and thus is shown for ease of illustration entirely as fourth dielectric material 947. As further shown in FIG. 9F, any portion of the third dielectric material 941 that remained after the second vertical openings 949 were formed can be removed and replaced with the fourth dielectric material 947. In some embodiments, the fourth dielectric material 947 can be the same material as at least one of the first dielectric material 930, the second dielectric material 933, or the third dielectric material 941. In some embodiments, the fourth dielectric material 947 is a different material than the first dielectric material 930, the second dielectric material 933, and the third dielectric material 941. The fourth dielectric material 947 can be deposited to electrically isolate each stack of repeated iterations of the first dielectric material 930, the semiconductor material 932, and the second dielectric material 933.

Figure 10A:
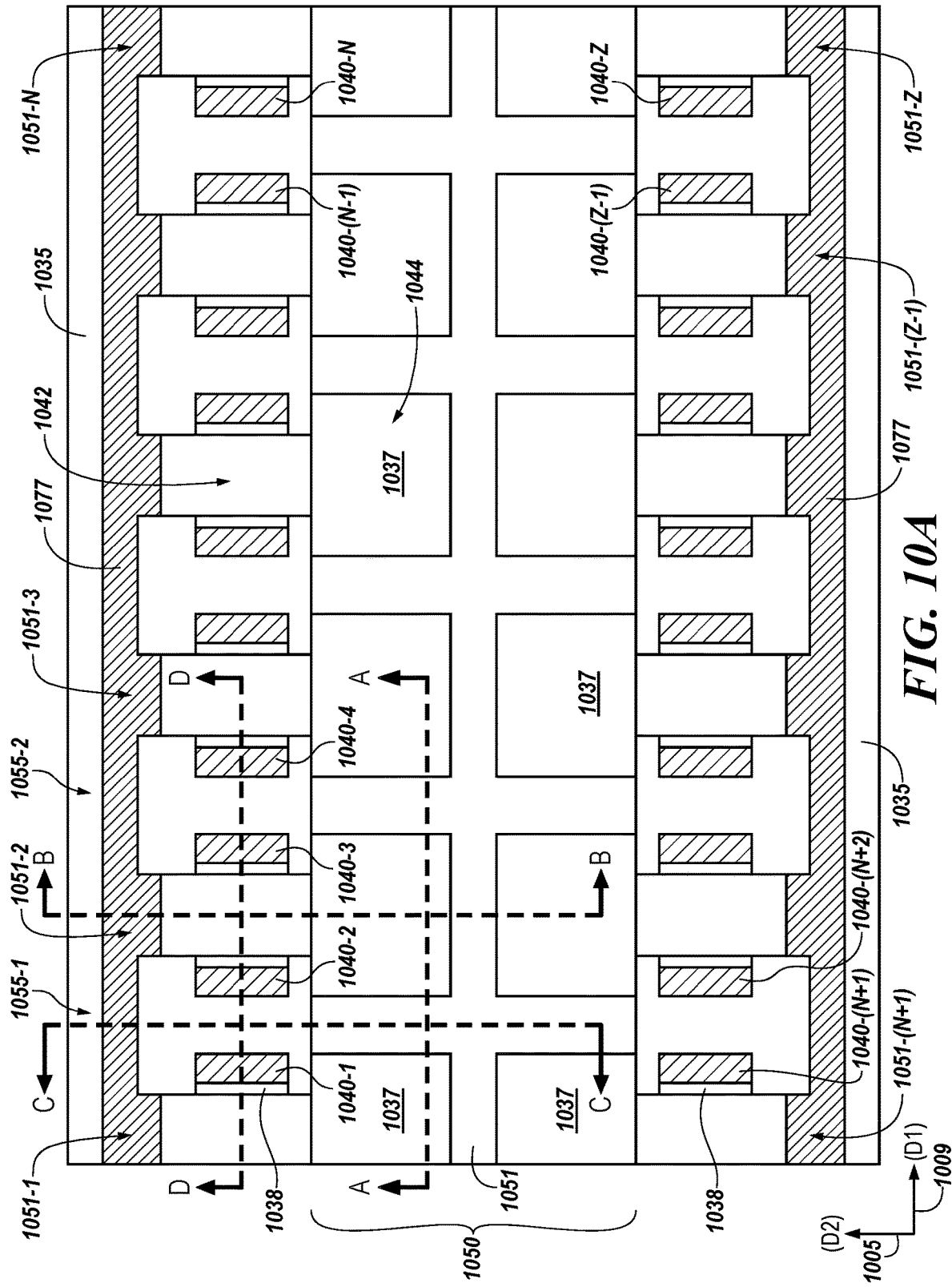

FIG. 10A illustrates an example method, at another stage of a semiconductor fabrication process, for forming arrays of vertically stacked memory cells, having horizontally oriented access devices and horizontally oriented storage nodes in accordance with a number of embodiments of the present disclosure. FIG. 10A illustrates a top down view of a semiconductor structure, at a particular point in time, in a semiconductor fabrication process, according to one or more embodiments. In the example embodiment of FIG. 10A, the method comprises using a photolithographic process to pattern the photolithographic masks 1035, 1036 and/or 1037. The method in FIG. 10A, further illustrates using one or more etchant processes to form a vertical openings 1051, 1051-1, 1051-N, 1051-(N+1), 1051-(Z−1), 1051-Z in a storage node region 1050 (and 1044 in FIGS. 10A and 10C) through the vertical stack, e.g., vertical stack 402 in FIG. 4, and extending predominantly in the first horizontal direction (D1) 1009. The one or more etchant processes forms a vertical opening 1051 to expose third sidewalls in the repeating iterations of alternating layers of a first dielectric material, 1030-1, 1030-2, . . . , 1030-N, a semiconductor material, 1032-1, 1032-2, . . . , 1032-N, and a second dielectric material, 1033-1, 1033-2, . . . , 1033-N, in the vertical stack, shown in FIGS. 10B-10E, adjacent a second region of the semiconductor material. Other numerated components may be analogous to those shown and discussed in connection with FIG. 6.

In some embodiments, this process is performed after the semiconductor fabrication process described in connection with FIGS. 7A-9F. The embodiment shown in FIGS. 10B-10E illustrate a sequence in which the storage node fabrication process is performed "after" the digit line 1077 and first source/drain region formation have already been performed, e.g., digit line formation first. Here, the digit line 1077 may be illustrated along the plurality of separate, vertical access lines 1040.

According to an example embodiment, shown in FIGS. 10B-10E, the method comprises forming a third vertical opening 1051 in the vertical stack, e.g., 402 in FIG. 4, and selectively etching the second region, e.g., second region 1044 in FIG. 10C, of the semiconductor material, 1032-1, 1032-2, . . . , 1032-N, to form a second horizontal opening 1079 a first horizontal distance (D1 opening) back from the vertical opening 1051 in the vertical stack (e.g., 402 in FIG. 4). In some embodiments, the first horizontal distance (D1 opening) is in a range of two hundred (200) to three hundred (300) nanometers (nm). According to embodiments, selectively etching the second region 1044 of the semiconductor material, 1032-1, 1032-2, . . . , 1032-N can comprise using an atomic layer etching (ALE) process. As will be explained more in connection with FIG. 10C, a second source/drain region 1078 can be formed in the semiconductor material, 1032-1, 1032-2, . . . , 1032-N at a distal end of the second horizontal openings 1079 from the vertical opening.

FIG. 10B illustrates a cross sectional view, taken along cut-line A-A' in FIG. 10A, showing another view of the semiconductor structure at this particular point in one example semiconductor fabrication process of an embodiment of the present disclosure. The cross sectional view shown in FIG. 10B is away from the plurality of separate, vertical access lines, 1040-1, 1040-2, . . . , 1040-N, 1040-(N+1), . . . , 1040-(Z−1), and shows repeating iterations of alternating layers of a dielectric material, 1030-1, 1030-2, . . . , 1030-N, a semiconductor material, 1032-1, 1032-2, . . . , 1032-N, and a second dielectric material, 1033-1, 1033-2, . . . , 1033-N separated by the third dielectric 1041, on a semiconductor substrate 1000 to form the vertical stack. As shown in FIG. 10B, a vertical direction 1011 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1009. In the example embodiment of FIG. 10B, the materials within the vertical stack—a dielectric material, 1030-1, 1030-2, . . . , 1030-N, a semiconductor material, 1032-1, 1032-2, . . . , 1032-N, and a second dielectric material, 1033-1, 1033-2, . . . , 1033-N are extending into and out of the plane of the drawing sheet in second direction (D2) and along an axis of orientation of the horizontal access devices and horizontal storage nodes of the arrays of vertically stacked memory cells of the three dimensional (3D) memory.

FIG. 10C illustrates a cross sectional view, taken along cut-line B-B' in FIG. 10A, showing another view of the semiconductor structure at this particular point in one example semiconductor fabrication process of an embodiment of the present disclosure. At this stage of the semiconductor fabrication process, the method of forming vertically stacked memory arrays can include forming third vertical openings 1051 to expose third vertical sidewalls in the vertical stack adjacent the storage node region, e.g., second region, 1044. Further, at this stage of the semiconductor fabrication process, the method of forming vertically stacked memory arrays can include selectively removing the fill material, e.g., fill material 934 in FIG. 9, along the second horizontal direction (D2) 1005 to form a plurality of second horizontal openings 1079 in which to form the horizontally oriented storage nodes. In some embodiments, the method for forming the arrays of vertically stacked memory cells can include forming the plurality of second horizontal openings 1079 by selectively removing the fill material, e.g., fill material 934 shown in FIG. 9A, via a selective etch.

Further, the method of forming the arrays of vertically stacked memory cells can include removing the fill material without using a timed exhume process to form the second horizontal openings 1079. Forming second horizontal openings 1079 using a selective etch to remove the fill material instead of using a timed exhume, etch process, e.g., timed etch, to remove the semiconductor material 1032 can be beneficial to the arrays vertically stacked memory cells. Using a timed etch to form second horizontal openings 1079 can cause the second horizontal openings 1079 to unintentionally have different horizontal distances (D1 opening) in different layers of the semiconductor material 1032. For example, using a timed etch to form the second horizontal openings 1079 can cause the horizontal distance (D1 opening) of the second horizontal openings 1079 in higher, e.g., later formed, layers of semiconductor material 1032 to be greater than the horizontal distance (D1 opening) of second horizontal openings 1079 in lower, e.g., earlier formed, layers of the semiconductor material 1079. This difference in the horizontal distances (D1 opening) of the second horizontal openings 1079 can decrease the performance of the arrays of vertically stacked memory cells. For example, capacitors, formed as storage nodes, having non-uniformity in size and surface area can cause variations in a magnitude of charge storage capability. Unintended variations in charge storage magnitude can lead to inaccurate memory cell reads and/or device performance failures Forming the second horizontal openings 1079 via selectively etching the fill material can alleviate the decreased performance caused by forming the second horizontal openings 1079 using a timed etch by forming the second horizontal openings 1097 with same or substantially the same horizontal distances (D1 openings) in different layers of the semiconductor material 1032. The second horizontal openings 1079 can be formed with substantially the same horizontal distance (D1 opening) because the second horizontal openings 1079 are formed by removing the fill material via selective etch. This allows the semiconductor material 1032 to function as an etch stop. As used herein, the term "etch stop" refers to a material that is not removed by an etch. The selective etch can remove the fill material but stop removing material once all of the fill material has been removed and the semiconductor material 1032 remains. This allows for more control when using a selective etch than a timed etch because the selective etch will only remove the fill material and will stop removing material once all of the fill material is removed. The cross sectional view shown in FIG. 10C is illustrated extending in the second direction (D2) 1005, left and right along the plane of the drawing sheet, along an axis of the repeating iterations of alternating layers of a first dielectric material, 1030-1, 1030-2, . . . , 1030-N, a semiconductor material, 1032-1, 1032-2, . . . , 1032-N, and a second dielectric material, 1033-1, 1033-2, . . . , 1033-N, along and in which the horizontally oriented access devices and horizontally oriented storage nodes, e.g., capacitor cells, can be formed within the layers of semiconductor material, 1032-1, 1032-2, . . . , 1032-N.

In the example embodiment of FIG. 10C, a third vertical opening 1051 and second horizontal openings 1079 are shown formed from the mask, patterning and etching process described in connection with FIG. 10A. As shown in FIG. 10C, the semiconductor material, 1032-1, 1032-2, . . . , 1032-N, in the second region 1044 has been selectively removed to form the horizontal openings 1079. In one example, an atomic layer etching (ALE) process is used to selectively etch the semiconductor material, 1032-1, 1032-2, . . . , 1032-N, and remove a second distance (D2 opening) back from the third vertical opening 1051. Horizontally oriented storage nodes, e.g., capacitor cells, may be formed later or first relative to the fabrication process shown in FIGS. 7A-9F, in the second horizontal openings 1079.

Also shown in FIG. 10C, the first source/drain region 1075 may be formed by gas phase doping a dopant into a top surface portion of the semiconductor material 1032. In some embodiments, the first source/drain region 1075 may be adjacent to vertical access line 1040-3. According to one example embodiment, as shown in FIG. 10C a second source/drain region 1078 may be formed by flowing a high energy gas phase dopant, such as Phosphorous (P) for an n-type transistor, into the second horizontal openings 1079 to dope the dopant in the semiconductor material, 1032-1, 1032-2, . . . , 1032-N, at a distal end of the second horizontal openings 1079 from the vertical opening 1051. In one example, gas phase doping may be used to achieve a highly isotropic e.g., non-directional doping, to form the second source/drain region 1078 to a horizontally oriented access device in region 1042. In another example, thermal annealing with doping gas, such as phosphorous may be used with a high energy plasma assist to break the bonding. Embodiments, however, are not so limited and other suitable semiconductor fabrication techniques may be utilized.

Conductive material 1077 may be deposited adjacent second dielectric material 1033. The conductive material 1077 may remain in direct electrical contact with and on a top surface of the first source/drain region 1075. As such, the conductive material 1077 remains in electrical contact with the source/drain region 1075. In some embodiments, the fifth dielectric material 1074 may be below the first dielectric material 1030 while remaining in direct contact with the conductive material 1077, the first source/drain region 1075, and the first portion of the low doped semiconductor material 1032. The fifth dielectric material 1074 may form a direct, electrical contact with a high doped, p-type (p+) silicon material 1095, e.g., the body region contact of the horizontally oriented access device.

As shown later in FIG. 11C, a first electrode, e.g., 1161, for horizontally oriented storage nodes are to be coupled to the second source/drain regions 1078 of the horizontal access devices. As shown later in FIG. 11C, such horizontally oriented storage nodes are shown formed in a second horizontal opening 1079 extending in second direction (D2), left and right in the plane of the drawing sheet, a second distance (D2 opening) from the vertical opening 1051 formed in the vertical stack, e.g., vertical stack 402 in FIG. 4, and along an axis of orientation of the horizontal access devices and horizontal storage nodes of the arrays of vertically stacked memory cells of the three dimensional (3D) memory. In FIG. 10C, a neighboring, opposing vertical access line 1040-3 is illustrated by a dashed line indicating a location set inward from the plane and orientation of the drawing sheet.

FIG. 10D illustrates a cross sectional view, taken along cut-line C-C' in FIG. 10A, showing another view of the semiconductor structure at this particular point in one example semiconductor fabrication process of an embodiment of the present disclosure. The cross sectional view shown in FIG. 10D is illustrated extending in the second direction (D2) 1005, left and right in the plane of the drawing sheet, along an axis of the repeating iterations of alternating layers of a first dielectric material, 1030-1, 1030-2, . . . , 1030-N, a semiconductor material, 1032-1, 1032-2, . . . , 1032-N, and a fifth dielectric material 1074 outside of a region in which the horizontally oriented access devices and horizontally oriented storage nodes, e.g., capacitor cells, will be formed within the layers of semiconductor material, 1032-1, 1032-2, . . . , 1032-N. At the left end of the drawing sheet is shown the repeating iterations of alternating layers of a first dielectric material, 1030-1, 1030-2, . . . , 1030-N, a semiconductor material, 1032-1, 1032-2, . . . , 1032-N, and a fifth dielectric material 1074 at which location a horizontally oriented digit line, e.g., digit lines 107-1, 107-2, . . . , 107-P shown in FIG. 1, et. seq., can be integrated to form electrical contact with first source/drain regions or digit line conductive contact material.

Again, while first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

In some embodiments, a conductive material 1077 may be illustrated adjacent fifth dielectric material 1074. The conductive material 1077 may be adjacent third dielectric material 1041. A body contact region 1095 may be illustrated along the repeating iterations of alternating layers of a first dielectric material, 1030-1, 1030-2, . . . , 1030-N, a semiconductor material, 1032-1, 1032-2, . . . , 1032-N, and a fifth dielectric material 1074.

FIG. 10E illustrates a cross sectional view, taken along cut-line D-D' in FIG. 10A, showing another view of the semiconductor structure at this particular point in one example semiconductor fabrication process of an embodiment of the present disclosure. The cross sectional view shown in FIG. 10E is illustrated, right to left in the plane of the drawing sheet, extending in the first direction (D1) 1009 along an axis of the repeating iterations of alternating layers of a first dielectric material, 1030-1, 1030-2, . . . , 1030-N, a semiconductor material, 1032-1, 1032-2, . . . , 1032-N, and a second dielectric material, 1033-1, 1033-2, . . . , 1033-N, intersecting across the plurality of separate, vertical access lines, 1040-1, 1040-2, . . . , 1040-4, and intersecting regions of the semiconductor material, 1032-1, 1032-2, . . . , 1032-N, in which a channel region may be formed, separated from the plurality of separate, vertical access lines, 1040-1, 1040-2, . . . , 1040-4, by the gate dielectric 1038. In FIG. 10E, the third dielectric material 1041 is shown separating the space between neighboring horizontally oriented access devices which may be formed extending into and out from the plane of the drawing sheet and can be spaced along a first direction (D1) 1009 and stacked vertically in arrays extending in the third direction (D3) 1011 in the three dimensional (3D) memory.

Figure 11A:
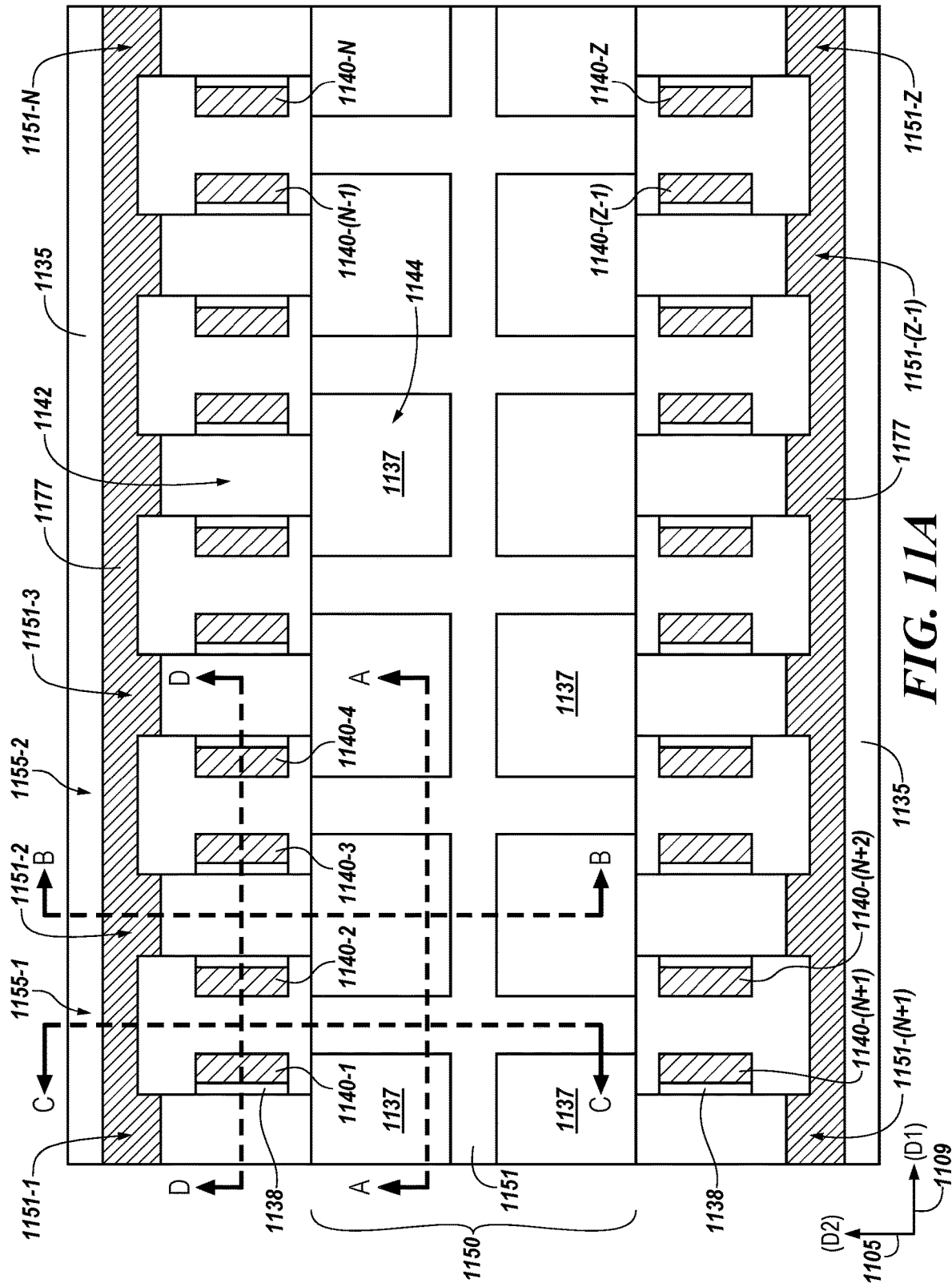

FIG. 11A illustrates an example method, at another stage of a semiconductor fabrication process, for forming arrays of vertically stacked memory cells, having horizontally oriented access devices in accordance with a number of embodiments of the present disclosure. FIG. 11A illustrates a top down view of a semiconductor structure, at a particular point in time, in a semiconductor fabrication process, according to one or more embodiments. In the example embodiment of FIG. 11A, the method comprises using a photolithographic process to pattern the photolithographic masks 1135 and 1137, e.g., 635 and 637 in FIGS. 6A-6E. The method in FIG. 11A, further illustrates using one or more etchant processes to form a vertical opening 1151, 1151-1, 1151-2, 1151-3, 1151-N, 1151-(N+1), 1151-(Z−1), 1151-Z in a storage node region 1150 (and 1144 in FIGS. 11A and 11C) through the vertical stack and extending predominantly in the first horizontal direction (D1) 1109. The one or more etchant processes forms a vertical opening 1151 to expose third sidewalls in the repeating iterations of alternating layers of a first dielectric material, 1130-1, 1130-2, . . . , 1130-N, a sacrificial semiconductor material, 1132-1, 1132-2, . . . , 1132-N, and second dielectric material, 1133-1, 1133-2, . . . , 1133-N, in the vertical stack, shown in FIGS. 11B-11E, adjacent a second region of the sacrificial semiconductor material. Other numerated components may be analogous to those shown and discussed in connection with FIG. 6.

According to embodiments, a second region of the sacrificial semiconductor material, 1132-1, 1132-2, . . . , 1132-N, may be removed from the repeating iterations of alternating layers of a first dielectric material, 1130-1, 1130-2, . . . , 1130-N, a sacrificial semiconductor material, 1132-1, 1132-2, . . . , 1132-N, and a second dielectric 1133-1, 1133-2, . . . , 1133-N, and self-aligned storage nodes may formed in the elongated vertical, pillar columns of the array of vertically stacked memory cells. In some embodiments, the self-aligned storage nodes may be capacitors and have a horizontally oriented bottom electrode of equal length. In some embodiments, this process is performed before selectively removing an access device region, e.g., transistor region, of the sacrificial semiconductor material in which to form a first source/drain region, channel region, and second source/drain region of the horizontally oriented access devices. In other embodiments, this process is performed after selectively removing an access device region of the sacrificial semiconductor material in which to form a first source/drain region, channel region, and second source/drain region of the horizontally oriented access devices. According to an example embodiment, shown in FIGS. 11B-11E, the method comprises selectively etching the second region of the sacrificial semiconductor material, 1132-1, 1132-2, . . . , 1132-N, to form a second horizontal opening, e.g., second horizontal opening 1079 in FIG. 10A-10E, a first horizontal distance back from a vertical opening 1151 in the vertical stack. In some embodiments, as shown in FIGS. 11B-11E, the method comprises forming capacitor cell as the storage node in the second horizontal opening. The method can comprise forming the horizontally oriented storage nodes to comprise capacitor cells having a first horizontally oriented electrode 1161 electrically coupled to first source/drain regions 1178 of the horizontally oriented access devices and a second horizontally oriented electrode 1156 separated from the first horizontally oriented electrode 1178 by a cell dielectric 1163. By way of example, and not by way of limitation, forming the capacitor comprises using an atomic layer deposition (ALD) process to sequentially deposit, in the second horizontal opening, a first electrode 1161 and a second electrode 1156 separated by a cell dielectric 1163. Other suitable semiconductor fabrication techniques and/or storage nodes structures may be used.

FIG. 11B illustrates a cross sectional view, taken along cut-line A-A' in FIG. 11A, showing another view of the semiconductor structure at this particular point in one example semiconductor fabrication process of an embodiment of the present disclosure. The cross sectional view shown in FIG. 11B is away from the plurality of separate, vertical access lines, 1140-1, 1140-2, . . . , 1140-N, 1140-(N+1), . . . , 1140-(Z−1), and shows repeating iterations of alternating layers of a first dielectric material, 1130-1, 1130-2, . . . , 1130-N, and second dielectric material 1133-1, 1133-2, . . . , 1133-N, separated by horizontally oriented capacitor cells having first electrodes 1161, e.g., bottom cell contact electrodes, cell dielectrics 1163, and second electrodes 1156, e.g., top, common node electrodes, on a semiconductor substrate 1100 to form the vertical stack. As shown in FIG. 11B, a vertical direction 1111 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1109. In the example embodiment of FIG. 11B, the first electrodes 1161, e.g., bottom electrodes to be coupled to source/drain regions of horizontal access devices, and second electrodes 1156 are illustrated separated by a cell dielectric material 1163 extending into and out of the plane of the drawing sheet in second direction (D2) and along an axis of orientation of the horizontal access devices and horizontal storage nodes of the arrays of vertically stacked memory cells of the three dimensional (3D) memory. In some embodiments, the self-aligned storage nodes can be formed in a plurality of first horizontal openings formed by a selective etch process.

FIG. 11C illustrates a cross sectional view, taken along cut-line B-B' in FIG. 11A, showing another view of the semiconductor structure at this particular point in one example semiconductor fabrication process of an embodiment of the present disclosure. The cross sectional view shown in FIG. 11C is illustrated extending in the second direction (D2) 1105, left and right along the plane of the drawing sheet, along an axis of the repeating iterations of alternating layers of a first dielectric material, 1130-1, 1130-2, ..., 1130-N, a sacrificial semiconductor material, 1132-1, 1132-2, ..., 1132-N, and a second dielectric material 1133-1, 1133-2, ..., 1133-N, along and in which the horizontally oriented access devices and horizontally oriented storage nodes, e.g., capacitor cells, can be formed within the layers of sacrificial semiconductor material, 1132-1, 1132-2, ..., 1132-N. In the example embodiment of FIG. 11C, the horizontally oriented storage nodes, e.g., capacitor cells, are illustrated as having been formed in this semiconductor fabrication process and first electrodes 1161, e.g., bottom electrodes to be coupled to source/drain regions of horizontal access devices, and second electrodes 1156, e.g., top electrodes to be coupled to a common electrode plane such as a ground plane, separated by cell dielectrics 1163, are shown. However, embodiments are not limited to this example. In other embodiments the first electrodes 1161, e.g., bottom electrodes to be coupled to source/drain regions of horizontal access devices, and second electrodes 1156, e.g., top electrodes to be coupled to a common electrode plane such as a ground plane, separated by cell dielectrics 1163, may be formed subsequent to forming a first source/drain region, a channel region, and a second source/drain region in a region of the sacrificial semiconductor material, 1132-1, 1132-2, ..., 1132-N, intended for location, e.g., placement formation, of the horizontally oriented access devices, described next.

In the example embodiment of FIG. 11C, the horizontally oriented storage nodes having the first electrodes 1161, e.g., bottom electrodes to be coupled to source/drain regions of horizontal access devices, and second electrodes 1156, e.g., top electrodes to be coupled to a common electrode plane such as a ground plane, are shown formed in a second horizontal opening extending in second direction (D2), left and right in the plane of the drawing sheet, a second distance for the vertical opening formed in the vertical stack and along an axis of orientation of the horizontal access devices and horizontal storage nodes of the arrays of vertically stacked memory cells of the three dimensional (3D) memory. In FIG. 11C, a neighboring, opposing vertical access line 1140-3 is illustrated by a dashed line indicating a location set inward from the plane and orientation of the drawing sheet.

FIG. 11D illustrates a cross sectional view, taken along cut-line C-C' in FIG. 11A, showing another view of the semiconductor structure at this particular point in one example semiconductor fabrication process of an embodiment of the present disclosure. The cross sectional view shown in FIG. 11D is illustrated extending in the second direction (D2) 1105, left and right in the plane of the drawing sheet, along an axis of the repeating iterations of alternating layers of a dielectric material, 1130-1, 1130-2, ..., 1130-N, 1130-N a sacrificial semiconductor material, 1132-1, 1132-2, ..., 1132-N, and a fifth dielectric material 1174 outside of a region in which the horizontally oriented access devices and horizontally oriented storage nodes, e.g., capacitor cells, will be formed within the layers of sacrificial semiconductor material, 1132-1, 1132-2, ..., 1132-N. In FIG. 11C, the third dielectric material 1141 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 11D, the second electrode 1156, e.g., top, common electrode to the capacitor cell structure, is additionally shown present in the space between horizontally neighboring devices. At the left end of the drawing sheet is shown the repeating iterations of alternating layers of a dielectric material, 1130-1, 1130-2, ..., 1130-N, a sacrificial semiconductor material, 1132-1, 1132-2, ..., 1132-N, and a fifth dielectric material 1174 at which location a horizontally oriented digit line, e.g., digit lines 107-1, 107-2, ..., 107-P shown in FIG. 1, et. seq., can be integrated to form electrical contact with the second source/drain regions, described in more detail below.

FIG. 11E illustrates a cross sectional view, taken along cut-line D-D' in FIG. 11A, showing another view of the semiconductor structure at this particular point in one example semiconductor fabrication process of an embodiment of the present disclosure. The cross sectional view shown in FIG. 11E is illustrated, right to left in the plane of the drawing sheet, extending in the first direction (D1) 1109 along an axis of the repeating iterations of alternating layers of a dielectric material, 1130-1, 1130-2, ..., 1130-N, a sacrificial semiconductor material, 1132-1, 1132-2, ..., 1132-N, and a third dielectric material 1133-1, 1133-2, ..., 1133-N, intersecting across the plurality of separate, vertical access lines, 1140-1, 1140-2, ..., 1140-4, and intersecting regions of the sacrificial semiconductor material, 1132-1, 1132-2, ..., 1132-N, in which a channel region may be formed, separated from the plurality of separate, vertical access lines, 1140-1, 1140-2, ..., 1140-4, by the gate dielectric 1138. In FIG. 11E, the third dielectric fill material 1141 is shown separating the space between neighboring horizontally oriented access devices and horizontally oriented storage nodes, which may be formed extending into and out from the plane of the drawing sheet as described in more detail below, and can be spaced along a first direction (D1) 1109 and stacked vertically in arrays extending in the third direction (D3) 1111 in the three dimensional (3D) memory.

Figure 12A:
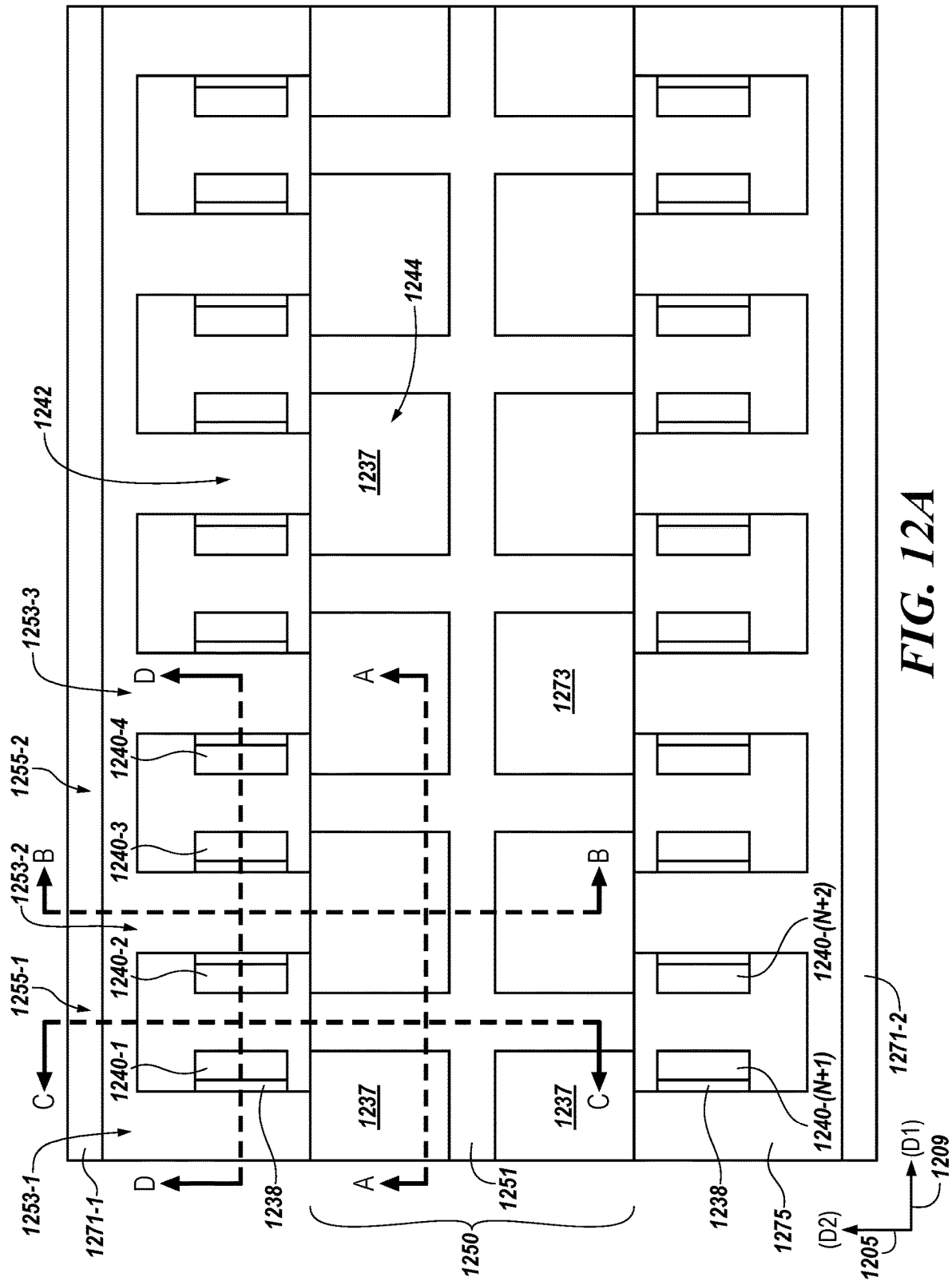

FIG. 12A illustrates an example method, at another stage of a semiconductor fabrication process, for forming arrays of vertically stacked memory cells, having horizontally oriented access devices in accordance with a number of embodiments of the present disclosure. FIG. 12A illustrates a top down view of a semiconductor structure, at a particular point in time, in a semiconductor fabrication process, according to one or more embodiments. In the example embodiment of FIG. 12A, the method comprises using a photolithographic process to pattern the photolithographic masks 1235, 1236 and/or 1237, etc. as described in FIGS. 6 and 7. The method in FIG. 12A, further illustrates using one or more etchant processes to form a vertical opening, 1271-1 and 1271-2, in access device, e.g., transistor, regions, e.g., access device regions 742 in FIG. 7C and 1242 in FIG. 12C, for replacement channel and source/drain transistor regions, through the vertical stack. The vertical openings 1271-1 and 1271-2 are illustrated extending predominantly in the first horizontal direction (D1) 709. The one or more etchant processes forms a vertical openings, 1271-1 and 1271-2, to expose third sidewalls in the repeating iterations of alternating layers of a first dielectric material, 1230-1, 1230-2, ..., 1230-N, a sacrificial semiconductor material, 1232-1, 1232-2, ..., 1232-N, and a gate dielectric 1238 in the vertical stack, shown in FIGS. 12B-12E, adjacent a first region of the sacrificial semiconductor material. Other numerated components may be analogous to those shown and discussed in connection with FIGS. 6 and 7.

According to embodiments, an access device, e.g., transistor, region, e.g., access device region 1242 in FIGS. 12A and 12C, of the sacrificial semiconductor material, 1232-1, 1232-2, ..., 1232-N, may be removed from the repeating iterations of alternating layers of a dielectric material, 1230-1, 1230-2, ..., 1230-N, a sacrificial semiconductor material, 1232-1, 1232-2, ..., 1232-N, and a gate dielectric 1238 in the vertical stack to form an access device, e.g., transistor. In some embodiments, this process is performed before selectively removing a storage node region of the sacrificial semiconductor material in which to form a capacitor cell. In other embodiments, this process is performed after selectively removing a storage node region of the sacrificial semiconductor material in which to form a capacitor cell. According to an example embodiment, shown in FIGS. 12B-12E, the method comprises selectively etching the access device region of the sacrificial semiconductor material, 1232-1, 1232-2, ..., 1232-N, to form a horizontal opening 1216 a second horizontal distance (D2 opening) back from a vertical openings, 1271-1 and 1271-2 in the vertical stack. In some embodiments, as shown in FIGS. 12B-12E, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. Other suitable semiconductor fabrication techniques and/or storage nodes structures may be used.

FIG. 12B illustrates a cross sectional view, taken along cut-line A-A' in FIG. 12A, showing another view of the semiconductor structure at this particular point in one example semiconductor fabrication process of an embodiment of the present disclosure. The cross sectional view shown in FIG. 12B is away from the plurality of separate, vertical access lines, 1240-1, 1240-2, ..., 1240-N, 1240-(N+1), ..., 1240-(Z−1), and shows repeating iterations of alternating layers of a first dielectric material, 1230-1, 1230-2, ..., 1230-N, and a second dielectric material 1233-1, 1233-2, ..., 1233-N, separated by capacitor cells having first electrodes 1261, e.g., bottom cell contact electrodes, cell dielectrics 1263, and second electrodes 1256, e.g., top, common node electrode, on a semiconductor substrate 1200 to form the vertical stack. As shown in FIG. 12B, a vertical direction 1211 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1209. In the example embodiment of FIG. 12B, the first electrodes 1261, e.g., bottom electrodes to be coupled to source/drain regions of horizontal access devices, and second electrodes 1256 are illustrated separated by a cell dielectric material 1263 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 12C illustrates a cross sectional view, taken along cut-line B-B' in FIG. 12A, showing another view of the semiconductor structure at this particular point in one example semiconductor fabrication process of an embodiment of the present disclosure. The cross sectional view shown in FIG. 12C is illustrated extending in the second direction (D2) 1205, left and right along the plane of the drawing sheet, along an axis of the repeating iterations of alternating layers of a first dielectric material, 1230-1, 1230-2, ..., 1230-N and second dielectric material 1233-1, 1233-2, ..., 1233-N. However, now is shown that the sacrificial semiconductor material has been removed in the access device region 1242 of the alternating layers of the vertical stack to form horizontal openings, 1216-1, 1216-2, ..., 1216-N, in which the horizontally oriented access devices having a first source/drain region, channel region, and second source/drain region can be formed between the vertical alternating layers of the first dielectric material, 1230-1, 1230-2, ..., 1230-N, and the second dielectric material 1233-1, 1233-2, ..., 1233-N. In the example embodiment of FIG. 12C, the horizontally oriented storage nodes, e.g., capacitor cells, are illustrated as having been formed been formed in this semiconductor fabrication process in the storage node region 1244 and first electrodes 1261, e.g., bottom electrodes to be coupled to source/drain regions of horizontal access devices, and second electrodes 1256, e.g., top electrodes to be coupled to a common electrode plane such as a ground plane, separated by a cell dielectric 1263, are shown. However, embodiments are not limited to this example. In other embodiments the first electrodes 1261, e.g., bottom electrodes to be coupled to source/drain regions of horizontal access devices, and second electrodes 1256, e.g., top electrodes to be coupled to a common electrode plane such as a ground plane, separated by cell dielectrics 1263, may be formed subsequent to forming a first source/drain region, a channel region, and a second source/drain region in a region of the sacrificial semiconductor material, 1232-1, 1232-2, ..., 1232-N.

In the example embodiment of FIG. 12C, the horizontal openings 1216-1, 1216-2, ..., 1216-N, in which to form the access devices having a first source/drain region, channel region, and second source/drain region, are shown extending in second direction 1205 (D2), left and right in the plane of the drawing sheet, a distance from the vertical openings 1271-1 and 1271-2 formed in the vertical stack and along an axis of orientation of the horizontal access devices and horizontal storage nodes of the arrays of vertically stacked memory cells of the three dimensional (3D) memory. In FIG. 12C, a neighboring, opposing vertical access line 1240-3 is illustrated by a dashed line indicating a location set inward from the plane and orientation of the drawing sheet.

FIG. 12D illustrates a cross sectional view, taken along cut-line C-C' in FIG. 12A, showing another view of the semiconductor structure at this particular point in one example semiconductor fabrication process of an embodiment of the present disclosure. The cross sectional view shown in FIG. 12D is illustrated extending in the second direction (D2) 1205, left and right in the plane of the drawing sheet, along an axis of the repeating iterations of alternating layers of a first dielectric material, 1230-1, 1230-2, . . . , 1230-N, horizontal openings 1216-1, 1216-2, . . . , 1216-N, and a second dielectric material 1233-1, 1233-2, . . . , 1233-N outside of a region in which the horizontally oriented access devices and horizontally oriented storage nodes, e.g., capacitor cells, will be formed. In FIG. 12D, the third dielectric material 1241 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 12D, the second electrode 1256, e.g., top, common electrode to a capacitor cell structure, is additionally shown present in the space between horizontally neighboring devices. At the left end of the drawing sheet is shown the repeating iterations of alternating layers of a first dielectric material, 1230-1, 1230-2, . . . , 1230-N, horizontal openings 1216-1, 1216-2, . . . , 1216-N, and a second dielectric material 1233-1, 1233-2, . . . , 1233-N, at which location a horizontally oriented digit line, e.g., digit lines 107-1, 107-2, . . . , 107-P shown in FIG. 1, et. seq., can be integrated to form electrical contact with the second source/drain regions, of the formed horizontal access devices.

Figure 13A:
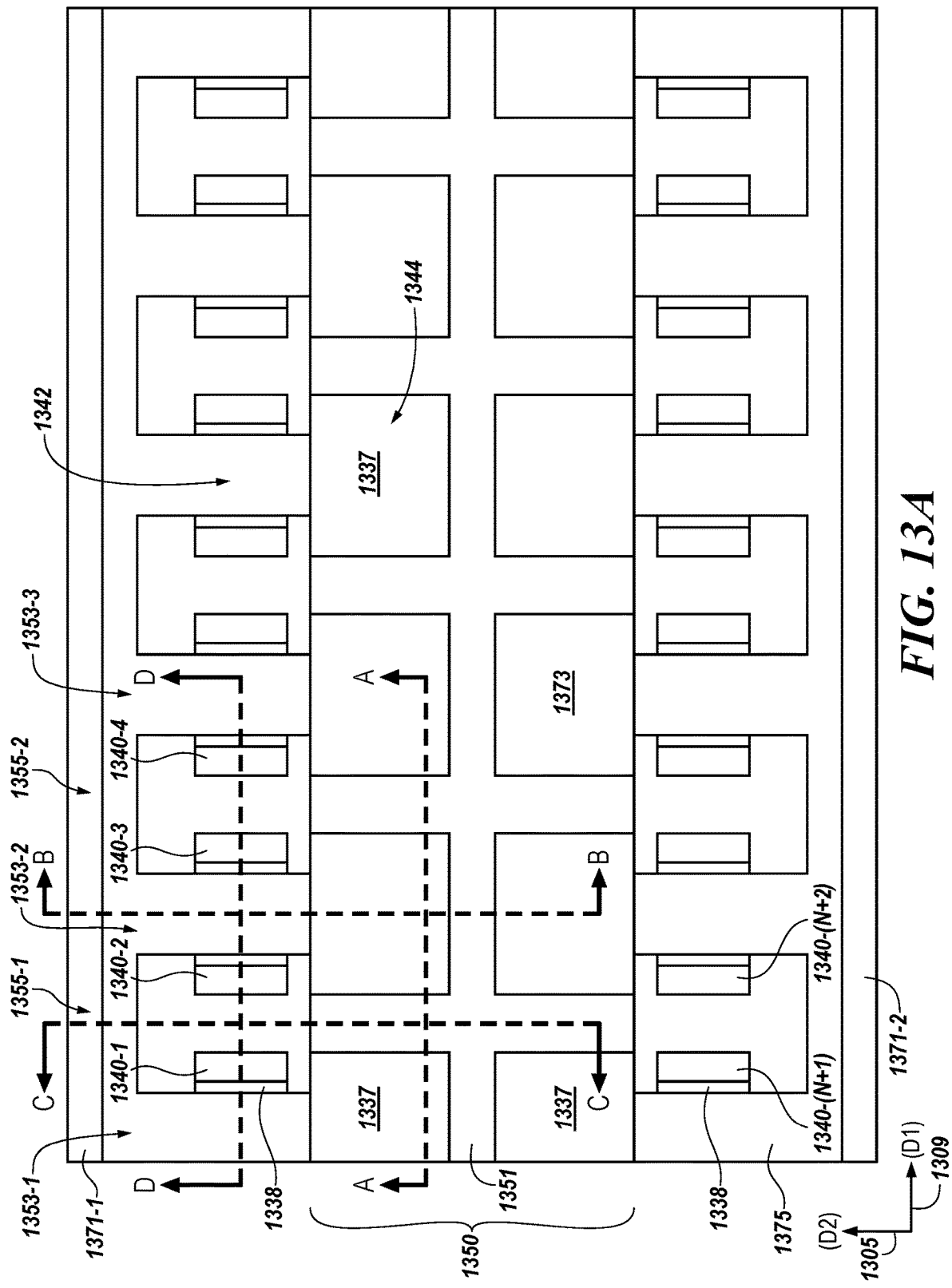

FIG. 12E illustrates a cross sectional view, taken along cut-line D-D' in FIG. 12A, showing another view of the semiconductor structure at this particular point in one example semiconductor fabrication process of an embodiment of the present disclosure. The cross sectional view shown in FIG. 12E is illustrated, right to left in the plane of the drawing sheet, extending in the first direction (D1) 1209 along an axis of the repeating iterations of alternating layers of a first dielectric material, 1230-1, 1230-2, . . . , 1230-N, horizontal openings, 1216-1, 1216-2, . . . , 1216-N, and a second dielectric material 1233-1, 1233-2, . . . , 1233-N, in which channel regions will be formed separated from the plurality of separate, vertical access lines, 1240-1, 1240-2, . . . , 1240-4, by the gate dielectric 1238. In FIG. 12E, the third dielectric material 1241 is shown separating the space between neighboring horizontally oriented access devices and horizontally oriented storage nodes, which may be formed extending into and out from the plane of the drawing sheet as described in more detail below, and can be spaced along a first direction (D1) 1209 and stacked vertically in arrays extending in the third direction (D3) 1211 in the three dimensional (3D) memory FIG. 13A illustrates an example method, at another stage of a semiconductor fabrication process, for forming arrays of vertically stacked memory cells, having horizontally oriented access devices, in accordance with a number of embodiments of the present disclosure. FIG. 13A illustrates a top down view of a semiconductor structure, at a particular point in time, in a semiconductor fabrication process, according to one or more embodiments. In the example embodiment of FIG. 13A, the vertical openings 1371-1 and 1371-2 remain present from FIG. 12A-12E. However, in FIGS. 13A-13E, horizontal access devices, 1398-1, 1398-2, . . . , 1398-N, having first source/drain regions, channel regions, and second source/drain regions, shown respectively as 1398-1A, 1398-1B, and 1398-1C, in FIG. 13C, have been formed in the horizontal openings, 1216-1, 1216-2, . . . , 1216-N shown in FIGS. 12C and 12D. The horizontal access devices, 1398-1, 1398-2, 1398-N, are formed extending in the second direction 1305 (D2) in the horizontal access device regions 1342 of the vertical stack. Additionally, horizontal digit lines, 1399-1, 1399-2, 1399-N, have been formed and integrated in contact with the second source/drain regions, e.g., 1398-1C, as shown in FIGS. 13C and 13D. Other numerated components may be analogous to those shown and discussed in connection with FIGS. 10, 11, and 12.

According to embodiments, in the access device region 1342, e.g., transistor region, the sacrificial semiconductor material, 1232-1, 1232-2, . . . , 1232-N, in FIGS. 12A-12E, has been removed to leave the repeating iterations of alternating layers of a first dielectric material, 1230-1, 1230-2, . . . , 1230-N, horizontal openings, 1216-1, 1216-2, . . . , 1216-N, and a second dielectric material 1233-1, 1233-2, . . . , 1233-N in the vertical stack of FIG. 12, to form an access device, e.g. transistor. In some embodiments, this process is performed before selectively removing a storage node region 1344 of the sacrificial semiconductor material in which to form a capacitor cell. In other embodiments, this process is performed after selectively removing a storage node region 1344 of the sacrificial semiconductor material in which to form a capacitor cell. According to an example embodiment, shown in FIGS. 13B-13E, the method comprises selectively depositing, using an atomic layer deposition (ALD) process, or other suitable deposition technique, a first source/drain region 1398-1A, channel region 1398-1B, and second source/drain region 1398-1C in each of the horizontal openings, 1216-1, 1216-2, . . . , 1216-N, in FIGS. 12A-12E. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region according to a process and techniques described in co-filed, co-pending, U.S. patent application Ser. No. 16/943,494, having at least one common inventor and titled "Digit Line and Body Contact for Semiconductor Devices". Other suitable semiconductor fabrication techniques and/or storage nodes structures may be used.

FIG. 13B illustrates a cross sectional view, taken along cut-line A-A' in FIG. 13A, showing another view of the semiconductor structure at this particular point in one example semiconductor fabrication process of an embodiment of the present disclosure. The cross sectional view shown in FIG. 13B is away from the plurality of separate, vertical access lines, 1340-1, 1340-2, . . . , 1340-N, 1340-(N+1), . . . , 1340-(Z−1), and shows repeating iterations of alternating layers of a first dielectric material, 1330-1, 1330-2, . . . , 1330-N and a second dielectric material, 1333-1, 1333-2, . . . , 1333-N, separated by capacitor cells having first electrodes 1361, e.g., bottom cell contact electrodes, cell dielectrics 1363, and second electrodes 1356, e.g., top, common node electrode, on a semiconductor substrate 1300 to form the vertical stack, e.g., vertical stack 402 in FIG. 4. As shown in FIG. 13B, a vertical direction 1311 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 1309. In the example embodiment of FIG. 13B, the first electrodes 1361, e.g., bottom electrodes to be coupled to source/drain regions of horizontal access devices, and second electrodes 1356 are illustrated separated by a cell dielectric material 1363 extending into and out of the plane of the drawing sheet in second direction (D2) and along an axis of orientation of the horizontal access devices and horizontal storage nodes of the arrays of vertically stacked memory cells of the three dimensional (3D) memory.

FIG. 13C illustrates a cross sectional view, taken along cut-line B-B' in FIG. 13A, showing another view of the semiconductor structure at this particular point in one example semiconductor fabrication process of an embodiment of the present disclosure. The cross sectional view shown in FIG. 13C is illustrated extending in the second direction (D2) 1305, left and right along the plane of the drawing sheet, along an axis of the repeating iterations of alternating layers of a first dielectric material, 1330-1, 1330-2, . . . , 1330-N and a second dielectric material 1333-1, 1333-2, . . . , 1333-N. However, now is shown that the first source/drain region material, channel region material, and second source/drain region material, 1398-1, 1398-2, . . . , 1398-N have been deposited in the horizontal openings, 1216-1, 1216-2, . . . , 1216-N, in FIGS. 12A-12E, extending in the second direction 1305 (D2). As one example, a first source/drain region 1398-1, a channel region 1398-1B, and 1398-1C are illustrated distinctly. Further, horizontal digit line, 1399-1, 1399-2, . . . , 1399-N, integration is achieved in contact with the second source/drain regions, e.g., 1398-1C, extending in a first direction (D1), e.g., extending into and out from the plane of the drawing sheet in alternating layers vertically with the dielectric material, 1330-1, 1330-2, . . . , 1330-N in direction (D3) 1311.

Hence, three-node horizontal access devices, 1338-1, 1338-2, . . . , 1338-N, have been formed and integrated to vertical access lines, 1340-1, 1340-2, . . . , 1340-(Z+1) and integrated to digit lines, 1399-1, 1399-2, . . . , 1399-N, without body contacts. Advantages to the structure and process described herein can include a lower off-current (Ioff) for the access devices, as compared to silicon based (Si-based) access devices. The channel region, e.g., 1338-1B, may be free from minority carriers for the access devices and thus removing the need to control a body potential to a body region of the access device, and/or reduced gate/drain induced leakage (GIDL) for the access devices. In some embodiments channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process formation overhead.

Again, the first source/drain region, the channel region, and the second source/drain region of the horizontal access devices, 1398-1, 1398-2, . . . , 1398-N, and the horizontal digit line, 1399-1, 1399-2, . . . , 1399-N, integration may be performed according to processes and techniques described in co-filed, co-pending, U.S. patent application Ser. No. 16/986,466 and 16/986,510, having at least one common inventor and titled "Channel Integration in a Three-Node Access Device for Vertical Three Dimensional (3D) Memory" and "Source/Drain Integration in a Three-Node Access Device for Vertical Three Dimensional (3D) Memory", respectively. According to various embodiments, a further benefit is the avoidance, e.g., no use of, gas phase doping (GPD) in the formation of the source/drain regions. Other suitable semiconductor fabrication techniques and/or storage nodes structures may be used.

In the example embodiment of FIG. 13C, the horizontal access devices having a first source/drain region, channel region, and second source/drain region, 1398-1, 1398-2, . . . , 1389-N, are shown extending in second direction 1305 (D2), left and right in the plane of the drawing sheet, a distance from the vertical openings 1371-1 and 1371-2 formed in the vertical stack and along an axis of orientation of the horizontal access devices and horizontal storage nodes of the arrays of vertically stacked memory cells of the three dimensional (3D) memory. In some embodiments, a dielectric material may be deposited to fill the vertical openings 1371-1 and 1371-3. In FIG. 13C, a neighboring, opposing vertical access line 1340-3 is illustrated by a dashed line indicating a location set inward from the plane and orientation of the drawing sheet.

In some embodiments, instead of performing the steps described in FIGS. 7A-9F in a storage node area, the steps can be performed in an access device area. When the steps described in FIGS. 7A-9F are performed in the access device area, the method of forming vertically stacked memory arrays can include performing an etch to form a plurality of third vertical openings to expose third vertical sidewalls in the vertical stack adjacent the access device region 1342. The method can further include performing an etch to selectively remove the fill material along the second horizontal direction to form a plurality of second horizontal openings in which to form access devices. In this embodiment, once the second horizontal openings are formed, the method can include forming horizontally oriented access devices in the second horizontal openings.

FIG. 13D illustrates a cross sectional view, taken along cut-line C-C' in FIG. 13A, showing another view of the semiconductor structure at this particular point in one example semiconductor fabrication process of an embodiment of the present disclosure. The cross sectional view shown in FIG. 13D is illustrated extending in the second direction (D2) 1305, left and right in the plane of the drawing sheet, along an axis of the repeating iterations of alternating layers of a first dielectric material, 1330-1, 1330-2, . . . , 1330-N, horizontal digit lines, 1399-1, 1399-2, . . . , 1399-N, and second dielectric material 1333-1, 1333-2, . . . , 1333-N, extending into and out from the plane of the drawing sheet in a first direction (D1), outside of a region in which the horizontally oriented access devices, 1338-1, 1338-2, . . . , 1338-N, and horizontally oriented storage nodes, e.g., capacitor cells, in access device region 1342 and storage node region 1344 are formed. In FIG. 13D, the third dielectric material 1341 is shown filling the space between the horizontally oriented access devices, which can be spaced along a first direction (D1), extending into and out from the plane of the drawings sheet, for a three dimensional array of vertically oriented memory cells. However, in the cross sectional view of FIG. 13D, the second electrode 1356, e.g., top, common electrode to a capacitor cell structure, is additionally shown present in the space between horizontally neighboring devices. At the left end of the drawing sheet is shown the repeating iterations of alternating layers of a first dielectric material, 1330-1, 1330-2, . . . , 1330-N, horizontal digit lines, 1399-1, 1399-2, . . . , 1399-N, e.g., digit lines 107-1, 107-2, . . . , 107-P shown in FIG. 1, et. seq., integrated to form electrical contact with the second source/drain regions, e.g., 1338-1C, of the formed horizontal access devices, and a second dielectric material 1333-1, 1333-2, . . . , 1333-N.

FIG. 13E illustrates a cross sectional view, taken along cut-line D-D' in FIG. 13A, showing another view of the semiconductor structure at this particular point in one example semiconductor fabrication process of an embodiment of the present disclosure. The cross sectional view shown in FIG. 13E is illustrated, right to left in the plane of the drawing sheet, extending in the first direction (D1) 1309 along an axis of the repeating iterations of alternating layers of a first dielectric material, 1330-1, 1330-2, . . . , 1330-N, channel regions of the horizontal access devices, 1398-1, 1398-2, . . . , 1398-N, and a second dielectric material 1333-1, 1333-2, . . . , 1333-N, separated from the plurality of separate, vertical access lines, 1340-1, 1340-2, . . . , 1340-4, by the gate dielectric 1338. In FIG. 13E, the third dielectric fill material 1341 is shown separating the space between neighboring horizontally oriented access devices and horizontally oriented storage nodes, which may be formed extending into and out from the plane of the drawing sheet as described in more detail below, and can be spaced along a first direction (D1) 1309 and stacked vertically in arrays extending in the third direction (D3) 1311 in the three dimensional (3D) memory FIG. 14 illustrates a three-node horizontally oriented access device 1442 coupled to a horizontally oriented storage node 1444 for vertical three dimensional (3D) memory, according to embodiments of the present disclosures. In FIG. 14, the three-node horizontally oriented access device 1442 is illustrated extending in a second direction (D2) 1405, left and right in the plane of the drawing sheet. The horizontally oriented access device 1442 is illustrated having a first source/drain region 1498-1A in electrical contact with a first electrode 1461, e.g., bottom electrode, of the horizontally oriented storage node 1444, e.g., capacitor cell. The storage node 1444 is further illustrated with a dielectric material 1463 separating the first electrode 1461 from a second electrode 1456, e.g., top, common node electrode of the capacitor cell.

A channel region 1498-1B is illustrated in electrical contact with the first source/drain region 1498-1A. A vertically oriented access line 1440-3 opposes the channel region 1498-1B and is separated therefrom by a gate dielectric. The vertically oriented access line 1440-3 is illustrated by dashed lines indicating that the vertically oriented access line is set into and/or out from the plane of the drawing sheet. The vertically oriented access line 1440 may extend longer and/or shorter than the channel region in the second direction (D2) 1405, e.g., having source/drain overlap and/or underlap, according to particular design rules.

A second source/drain region 1498-1C is illustrated in electrical contact with the channel region 1498-1B and in electrical contact with and integrated to a horizontally oriented digit line 1499 extending into and out from a plane of the drawing sheet. As shown in FIG. 14, the horizontally oriented access device 1442 and horizontally oriented storage node 1444 may be spaced horizontally from neighboring memory cells by an interlayer dielectric material 1480 along the second direction (D2) 1405 and may be spaced vertically from stacked, neighboring cells in a three dimensional (3D) memory by dielectric layers 1430-1 and 1430-2.

Figure 15:
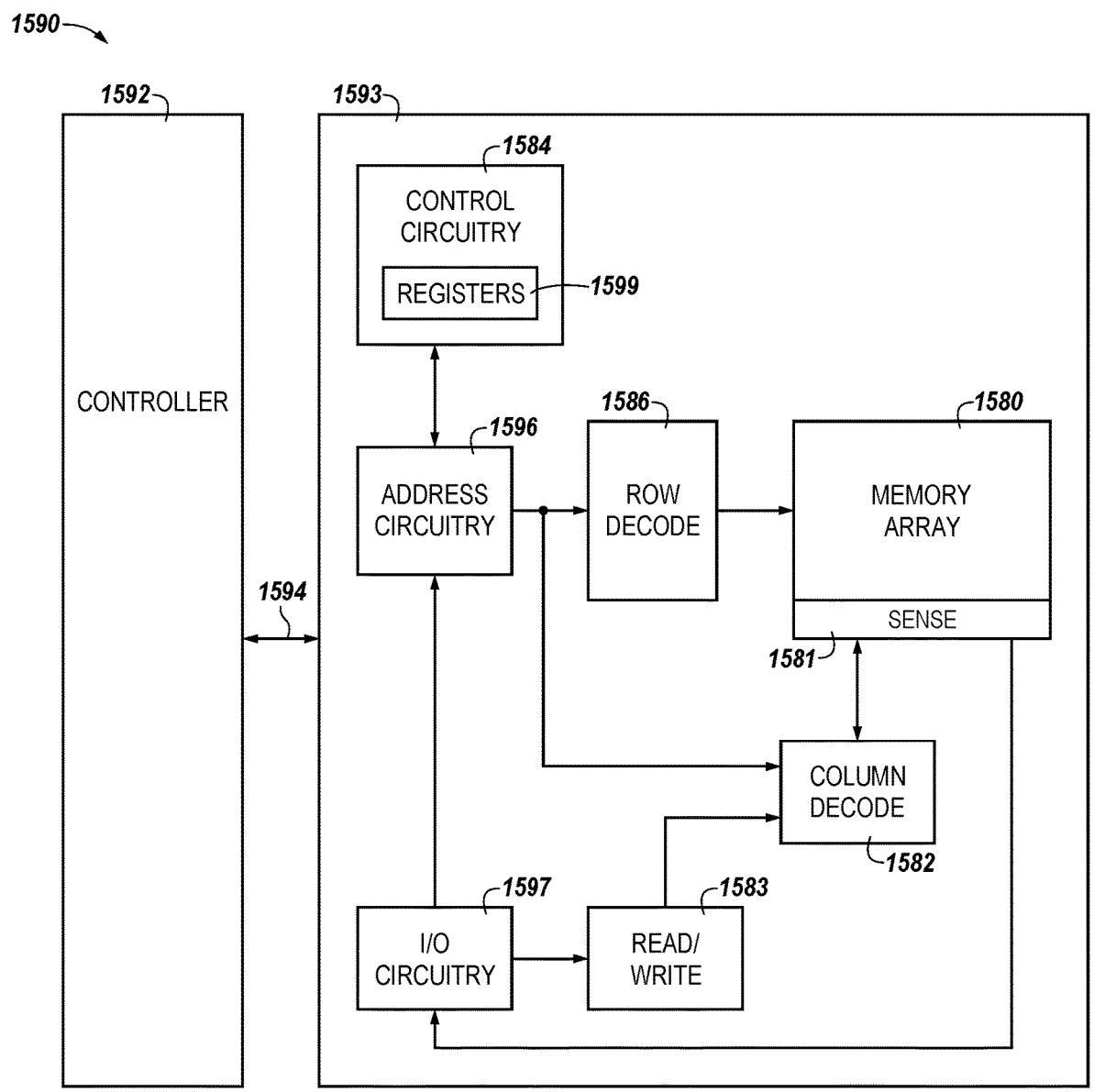
FIG. 15 is a block diagram of an apparatus in the form of a computing system including a memory device in accordance with a number of embodiments of the present disclosure.

FIG. 15 is a block diagram of an apparatus in the form of a computing system 1590 including a memory device 1593 in accordance with a number of embodiments of the present disclosure. As used herein, a memory device 1593, a memory array 1580, and/or a host 1592, for example, might also be separately considered an "apparatus."

In this example, system 1590 includes a host 1592 coupled to memory device 1593 via an interface 1594. The computing system 1590 can be a personal laptop computer, a desktop computer, a digital camera, a mobile telephone, a memory card reader, or an Internet-of-Things (IoT) enabled device, among various other types of systems. Host 1592 can include a number of processing resources e.g., one or more processors, microprocessors, or some other type of controlling circuitry, capable of accessing the memory device 1593. The system 1590 can include separate integrated circuits, or both the host 1592 and the memory device 1593 can be on the same integrated circuit. For example, the host 1592 may be a system controller of a memory system comprising multiple memory devices 1593, with the system controller 1591 providing access to the respective memory devices 1593 by another processing resource such as a central processing unit (CPU).

In the example shown in FIG. 15, the host 1592 is responsible for executing an operating system (OS) and/or various applications, e.g., processes, that can be loaded thereto, e.g., from memory device 1593 via controller 1595. The OS and/or various applications can be loaded from the memory device 1593 by providing access commands from the host 1592 to the memory device 1593 to access the data comprising the OS and/or the various applications. The host 1592 can also access data utilized by the OS and/or various applications by providing access commands to the memory device 1593 to retrieve said data utilized in the execution of the OS and/or the various applications.

For clarity, the system 1590 has been simplified to focus on features with particular relevance to the present disclosure. The memory array 1580 can be a DRAM array comprising at least one memory cell having a sense line and body contact formed according to the techniques described herein. For example, the memory array 1580 can be an unshielded DL 4F2 array such as a 3D-DRAM memory array. The memory array 1580 can comprise memory cells arranged in rows coupled by access lines (which may be referred to herein as word lines or select lines) and columns coupled by sense lines (which may be referred to herein as digit lines or data lines). Although a single array 1580 is shown in FIG. 15, embodiments are not so limited. For instance, memory device 1593 may include a number of arrays 1580, e.g., a number of banks of DRAM cells.

The memory device 1593 includes address circuitry 1596 to latch address signals provided over an interface 1594. The interface can include, for example, a physical interface employing a suitable protocol, e.g., a data bus, an address bus, and a command bus, or a combined data/address/command bus. Such protocol may be custom or proprietary, or the interface 1594 may employ a standardized protocol, such as Peripheral Component Interconnect Express (PCIe), Gen-Z, CCIX, or the like. Address signals are received and decoded by a row decoder 1598 and a column decoder 1582 to access the memory array 1580. Data can be read from memory array 1580 by sensing voltage and/or current changes on the sense lines using sensing circuitry 1581. The sensing circuitry 1581 can comprise, for example, sense amplifiers that can read and latch a page, e.g., row, of data from the memory array 1580. The I/O circuitry 1597 can be used for bi-directional data communication with the host 1592 over the interface 1594. The read/write circuitry 1583 is used to write data to the memory array 1580 or read data from the memory array 1580. As an example, the circuitry 1583 can comprise various drivers, latch circuitry, etc.

Control circuitry 1584 includes registers 1599 and decodes signals provided by the host 1592. The signals can be commands provided by the host 1592. These signals can include chip enable signals, write enable signals, and address latch signals that are used to control operations performed on the memory array 1580, including data read operations, data write operations, and data erase operations. In various embodiments, the control circuitry 1584 is responsible for executing instructions from the host 1592. The control circuitry 1584 can comprise a state machine, a sequencer, and/or some other type of control circuitry, which may be implemented in the form of hardware, firmware, or software, or any combination of the three. In some examples, the host 1592 can be a controller external to the memory device 1593. For example, the host 1592 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar, e.g., the same, elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements, e.g., by direct physical contact, indirectly coupled and/or connected with intervening elements, or wirelessly coupled. The term coupled may further include two or more elements that co-operate or interact with each other, e.g., as in a cause and effect relationship. An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction, e.g., the y-direction or the x-direction, that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming an array of vertically stacked memory cells, having horizontally oriented access devices and horizontally oriented storage nodes, comprising:
    depositing layers of a first dielectric material, a semiconductor material, and a second dielectric material, in repeating iterations vertically to form a vertical stack;
    forming a plurality of first vertical openings having a first horizontal direction and a second horizontal direction through the vertical stack and extending predominantly in the second horizontal direction to form elongated vertical, pillar columns with first vertical sidewalls in the vertical stack;
    conformally depositing a conductive material on a gate dielectric material in the plurality of first vertical openings;
    removing portions of the conductive material in the plurality of first vertical openings to form a plurality of separate, vertical conductive lines along the first vertical sidewalls;
    depositing a third dielectric material in the plurality of first vertical openings;
    forming a plurality of second vertical openings in the third dielectric material to expose second vertical sidewalls in the vertical stack;
    forming a plurality of first horizontal openings in the layers of the semiconductor material;
    depositing a fill material to fill the plurality of first horizontal openings in the elongated vertical, pillar columns;
    forming third vertical openings to expose third vertical sidewalls in the vertical stack adjacent storage node regions; and
    selectively removing the fill material along the second horizontal direction to form a plurality of second horizontal openings in which to form the horizontally oriented storage nodes.

2. The method of claim 1, further comprising forming a plurality of second horizontal openings by selectively removing the fill material via a selective etch.

3. The method of claim 2, further comprising removing the fill material without using a timed exhume, etch process.

4. The method of claim 2, further comprising forming horizontally oriented access devices in the second horizontal openings.

5. The method of claim 1, wherein forming the layers of the first dielectric material, the semiconductor material, and the second dielectric material, in repeating iterations vertically to form the vertical stack, comprises:
depositing an oxide material as the first dielectric material;
depositing a polysilicon material as the semiconductor material; and
depositing a nitride material as the second dielectric material.

6. The method of claim 1, further comprising using a lateral etch on opposing sides of the semiconductor material to form the plurality of first horizontal openings.

7. The method of claim 1, wherein the fill material is a silicon (Si) material.

8. The method of claim 1, wherein the fill material is a germanium (Ge) material.

9. The method of claim 1, wherein the fill material is selective to the semiconductor material.

10. The method of claim 1, further comprising forming the horizontally oriented storage nodes to comprise capacitor cells having a first horizontally oriented electrode electrically coupled to first source/drain regions of the horizontally oriented access devices and a second horizontally oriented electrode separated from the first horizontally oriented electrode by a cell dielectric.

11. A method for forming an array of vertically stacked memory cells, having horizontally oriented access devices and horizontally oriented storage nodes, comprising:
depositing layers of a first dielectric material, a semiconductor material, and a second dielectric material, in repeating iterations vertically to form a vertical stack;
performing an etch to form a plurality of first vertical openings having a first horizontal direction and a second horizontal direction, through the vertical stack and extending predominantly in the second horizontal direction to form elongated vertical, pillar columns with first vertical sidewalls in the vertical stack;
conformally depositing a conductive material on a gate dielectric material in the plurality of first vertical openings;
performing an etch to remove portions of the conductive material in the plurality of first vertical openings to form a plurality of separate, vertical conductive lines along the first vertical sidewalls;
depositing a third dielectric material in the plurality of first vertical openings;
performing an etch to form a plurality of second vertical openings in the third dielectric material to expose second vertical sidewalls in the vertical stack;
performing a lateral etch to form a plurality of first horizontal openings in the layers of the semiconductor material;
depositing a selective fill material selective to the semiconductor material to fill the plurality of first horizontal openings in the elongated vertical, pillar columns;
performing an etch to form a plurality of third vertical openings to expose third vertical sidewalls in the vertical stack adjacent access device regions; and
performing an etch to selectively remove the fill material along the second horizontal direction to form a plurality of second horizontal openings in which to form access devices.

12. The method of claim 11, further comprising doping the fill material to dope portions of the semiconductor material.

13. The method of claim 11, further comprising forming the first horizontal openings in portions of the semiconductor material corresponding to the second vertical openings.

14. The method of claim 11, wherein the lateral etch is selective to the first dielectric material and the second dielectric material.

15. A method for forming an array of vertically stacked memory cells, having horizontally oriented access devices and horizontally oriented storage nodes, comprising:
depositing layers of an oxide material, a polysilicon material, and a nitride material, in repeating iterations vertically to form a vertical stack;
performing an etch to form a plurality of first vertical openings having a first horizontal direction and a second horizontal direction, through the vertical stack and extending predominantly in the second horizontal direction to form elongated vertical, pillar columns with first vertical sidewalls in the vertical stack;
conformally depositing a doped semiconductor material on a gate dielectric material in the plurality of first vertical openings;
performing an etch to remove portions of the doped semiconductor material in the plurality of first vertical openings to form a plurality of separate, vertical conductive lines along the first vertical sidewalls;
depositing a dielectric material in the plurality of first vertical openings;
performing an etch to form a plurality of second vertical openings in the dielectric material to expose second vertical sidewalls in the vertical stack;
performing a lateral etch that is selective to the oxide material and the nitride material to form a plurality of first horizontal openings in the layers of the semiconductor material;
depositing a selective fill material selective to the semiconductor material to fill the plurality of first horizontal openings in the elongated vertical, pillar columns;
performing an etch to form a plurality of third vertical openings to expose third vertical sidewalls in the vertical stack adjacent access device regions;
performing an etch that is selective to the polysilicon material to selectively remove the fill material along the second horizontal direction to form a plurality of second horizontal openings; and
forming self-aligned storage nodes in the plurality of second horizontal openings.

16. The method of claim 15, forming the array of vertically stacked memory cells to a height of at least four tiers.

17. The method of claim 15, wherein the self-aligned storage nodes are capacitors.

18. The method of claim 15, further comprising using atomic layer deposition to sequentially deposit a first source/drain region, a channel region, and a second source/drain region in the plurality of first horizontal openings.

19. The method of claim 15, further comprising forming the first plurality of first horizontal openings to include a same quantity of horizontal openings as a second plurality of first horizontal openings.

20. The method of claim 15, further comprising forming the plurality of first horizontal openings to a horizontal distance in a range of two hundred (200) to three hundred (300) nanometers (nm).

* * * * *